US012775365B2

(12) United States Patent
Park et al.

(10) Patent No.: US 12,775,365 B2
(45) Date of Patent: Oct. 27, 2026

(54) DISPLAY DEVICE AND ELECTRONIC DEVICE HAVING THE SAME

(71) Applicant: SAMSUNG DISPLAY CO., LTD., Yongin-si (KR)

(72) Inventors: Soyeon Park, Yongin-si (KR); Yong-Hwan Park, Yongin-si (KR); Gyung-Min Ko, Yongin-si (KR); Seongjun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/045,777

(22) Filed: Feb. 5, 2025

(65) Prior Publication Data

US 2025/0251836 A1 Aug. 7, 2025

(30) Foreign Application Priority Data

Feb. 6, 2024 (KR) ........................ 10-2024-0017927

(51) Int. Cl.

| | |
|---|---|
| ***G06F 3/044*** | (2006.01) |
| ***G06F 3/041*** | (2006.01) |
| ***H10K 59/40*** | (2023.01) |
| ***H10K 59/80*** | (2023.01) |

(52) U.S. Cl.

CPC .......... *G06F 3/0446* (2019.05); *G06F 3/0412* (2013.01); *G06F 3/0445* (2019.05); *H10K 59/40* (2023.02); *H10K 59/8791* (2023.02); *G06F 2203/04107* (2013.01); *G06F 2203/04112* (2013.01)

(58) Field of Classification Search

CPC ................ H10K 59/8791; H10K 59/40; G06F 3/0446; G06F 3/0412; G06F 3/0443; G06F 3/0445; G06F 2203/04107; G06F 2203/04112; G06F 2203/04111

See application file for complete search history.

(56) References Cited

U.S. PATENT DOCUMENTS

| | | | |
|---|---|---|---|
| 10,019,121 | B2 | 7/2018 | Choi et al. |
| 10,824,287 | B2 | 11/2020 | Hwang et al. |
| 11,402,958 | B2 | 8/2022 | Kim et al. |
| 11,943,990 | B2 | 3/2024 | Park et al. |
| 2016/0328051 | A1 | 11/2016 | Shishido et al. |

(Continued)

FOREIGN PATENT DOCUMENTS

| | | | |
|---|---|---|---|
| CN | 114388571 | A | 4/2022 |
| KR | 10-2014-0037528 | A | 3/2014 |

(Continued)

*Primary Examiner* — Deeprose Subedi

(74) *Attorney, Agent, or Firm* — F. CHAU & ASSOCIATES, LLC

(57) ABSTRACT

A display device includes a display panel and an input sensing layer. The display panel includes a plurality of light-emitting regions, a non-light-emitting region, a display element layer, and an encapsulation layer disposed on the display element layer. The input sensing layer includes a first insulating layer directly disposed on the encapsulation layer and a plurality of sensing electrodes disposed on the first insulating layer. Each of the plurality of sensing electrodes includes a mesh pattern in which a plurality of openings are defined. A portion of the mesh pattern overlaps a portion of each of the plurality of light-emitting regions on a plane.

28 Claims, 32 Drawing Sheets

(56) References Cited

U.S. PATENT DOCUMENTS

| | | | | |
|---|---|---|---|---|
| 2022/0109028 | A1* | 4/2022 | Park | G06F 3/0412 |
| 2023/0276679 | A1 | 8/2023 | Moon et al. | |

FOREIGN PATENT DOCUMENTS

| | | | |
|---|---|---|---|
| KR | 10-2021-0147149 | A | 12/2021 |
| KR | 10-2374644 | B1 | 3/2022 |
| KR | 10-2022-0044469 | A | 4/2022 |

* cited by examiner

DISPLAY DEVICE AND ELECTRONIC DEVICE HAVING THE SAME

CROSS-REFERENCE TO RELATED APPLICATIONS

This application claims priority under 35 U.S.C. § 119 to Korean Patent Application No. 10-2024-0017927, filed on Feb. 6, 2024, the disclosure of which is hereby incorporated by reference in its entirety.

TECHNICAL FIELD

Embodiments of the present disclosure relate to a display device and electronic device having the same, and more particularly, to a display device including an input sensing layer and an electronic device including the display device.

DISCUSSION OF RELATED ART

Multimedia devices such as, for example, televisions, mobile phones, tablets, navigation systems, and game consoles typically include a display device that displays an image to a user through a display screen. The display device may include a display panel configured to generate an image and an input sensing layer configured to sense a user's touch.

The input sensing layer may include a conductor configured to sense an external input, and the conductor of the input sensing layer disposed on the display panel may affect the light output efficiency of the display device or the external light reflectance of the display device.

SUMMARY

Embodiments of the inventive concept provide a display device in which front luminance reduction may be prevented or suppressed.

Embodiments of the inventive concept provide a display device including an input sensing layer and having increased visibility.

According to an embodiment of the inventive concept, a display device includes a display panel including a plurality of light-emitting regions, a non-light-emitting region, a display element layer, and an encapsulation layer disposed on the display element layer, and an input sensing layer including a first insulating layer directly disposed on the encapsulation layer and a plurality of sensing electrodes disposed on the first insulating layer. Each of the plurality of sensing electrodes includes a mesh pattern having a plurality of openings defined therein. A portion of the mesh pattern overlaps a portion of each of the plurality of light-emitting regions on a plane.

In an embodiment, a portion of the mesh pattern overlaps an outer side portion of each of the plurality of light-emitting regions.

In an embodiment, each of the plurality of light-emitting regions includes a plurality of outer sides, and at least one of the plurality of outer sides is covered by the mesh pattern on a plane.

In an embodiment, the mesh pattern includes a plurality of first mesh lines extending along one direction and arranged along a crossing direction crossing the one direction, and a plurality of second mesh lines extending along the crossing direction and arranged along the one direction. The plurality of openings are surrounded by the plurality of first mesh lines and the plurality of second mesh lines.

In an embodiment, a plurality of outer sides of each of the plurality of light-emitting regions includes first and second sides facing each other in the crossing direction and each extending in the one direction, and third and fourth sides facing each other in the one direction and extending in the crossing direction. At least some of the first and second sides are covered by the plurality of first mesh lines on the plane and at least some of the third and fourth sides are covered by the plurality of second mesh lines on the plane.

In an embodiment, the plurality of openings defined in the mesh pattern includes a plurality of central openings that at least partially overlap the light-emitting regions and a plurality of peripheral openings that do not overlap the light-emitting regions.

In an embodiment, the mesh pattern covers all of the plurality of outer sides of each of the plurality of light-emitting regions, and each of the plurality of central openings is disposed within a corresponding light-emitting region on the plane.

In an embodiment, the plurality of peripheral openings includes a plurality of first peripheral openings disposed between adjacent central openings in the one direction or between adjacent central openings in the crossing direction, and a plurality of second peripheral openings spaced apart from an adjacent first peripheral opening in a diagonal direction of the one direction and the crossing direction.

In an embodiment, a plurality of outer sides of each of the plurality of light-emitting regions includes first and second sides facing each other in the crossing direction and extending in the one direction, and third and fourth sides facing each other in the one direction and extending in the crossing direction. The first, fourth, second, and third sides are sequentially connected to each other in a clockwise direction and the mesh pattern covers two interconnected sides among the plurality of outer sides of each of the plurality of light-emitting regions. At least some of the plurality of light-emitting regions cover two different sides among the first to fourth sides.

In an embodiment, at least some of the plurality of central openings overlap a portion of each of two or more light-emitting regions.

In an embodiment, at least some of the plurality of central openings have different numbers of overlapping light-emitting regions.

In an embodiment, the plurality of light-emitting regions includes a first group of light-emitting regions having the first and fourth sides covered by the mesh pattern on the plane, a second group of light-emitting regions having the first and third sides covered by the mesh pattern on the plane, a third group of light-emitting regions having the second and fourth sides covered by the mesh pattern on the plane, and a fourth group of light-emitting regions having the second and third sides covered by the mesh pattern on the plane. Within a predetermined unit area, a same number of the first group of light-emitting regions, the second group of light-emitting regions, the third group of light-emitting regions, and the fourth group of light-emitting regions are disposed.

In an embodiment, on the plane, a separation distance in a direction from an outer side of the light-emitting region covered by the mesh pattern to an adjacent central opening is less than or equal to the width of the mesh pattern in the direction.

In an embodiment, a cut portion configured to connect two adjacent peripheral openings to each other among the plurality of peripheral openings is defined in the mesh pattern.

In an embodiment, the cut portion is spaced apart from the plurality of central openings.

In an embodiment, the plurality of sensing electrodes includes a plurality of first sensing electrodes extending in the one direction and arranged in the crossing direction crossing the one direction, and a plurality of second sensing electrodes extending in the crossing direction and arranged in the one direction. Each of the first sensing electrodes includes a plurality of first sensing portions arranged in the one direction, and each of the second sensing electrodes includes a plurality of second sensing portions arranged in the crossing direction. The cut portion is defined within the plurality of first sensing portions or the plurality of second sensing portions.

In an embodiment, the plurality of sensing electrodes includes a plurality of first sensing electrodes extending in the one direction and arranged in the crossing direction crossing the one direction, and a plurality of second sensing electrodes extending in the crossing direction and arranged in the one direction. Each of the first sensing electrodes includes a plurality of first sensing portions arranged in the one direction, and each of the second sensing electrodes includes a plurality of second sensing portions arranged in the crossing direction. A boundary cut portion is defined between a first sensing portion and a second sensing portion adjacent to each other. The boundary cut portion is spaced apart from the plurality of central openings.

In an embodiment, the plurality of light-emitting regions includes a plurality of unit light-emitting regions arranged along each of the one direction and the crossing direction. Each of the plurality of unit light-emitting regions includes one first light-emitting region and one third light-emitting region spaced apart from each other in a first direction which is a diagonal direction of the one direction and the crossing direction, and two second light-emitting regions spaced apart from each other in a second direction crossing the first direction. The first, second, and third light-emitting regions respectively emit first, second, and third color lights which are different from each other.

In an embodiment, the plurality of light-emitting regions include a first light-emitting region and a second light-emitting region alternately arranged along the one direction, and a third light-emitting region spaced apart from the first light-emitting region and the second light-emitting region along the crossing direction. The first, second, and third light-emitting regions respectively emit first, second, and third color lights which are different from each other.

In an embodiment, the third light-emitting region is disposed to be closer to the first light-emitting region than the second light-emitting region in the one direction, and the mesh pattern further includes a third mesh line spaced apart from the plurality of second mesh lines. The third mesh line extends along the crossing direction and covers an outer side of the third light-emitting region adjacent to the second light-emitting region.

In an embodiment, the input sensing layer further includes a second insulating layer disposed on the first insulating layer, a first conductive layer disposed between the first insulating layer and the second insulating layer, and a second conductive layer disposed on the second insulating layer. The plurality of sensing electrodes includes a plurality of first sensing electrodes extending in one direction and arranged in a crossing direction crossing the one direction, and a plurality of second sensing electrodes extending in the crossing direction and arranged in the one direction. Each of the first sensing electrodes includes a plurality of first sensing portions arranged in the one direction and connection patterns connecting the first sensing portions to each other, and each of the second sensing electrodes includes a plurality of second sensing portions arranged in the crossing direction and extension patterns connecting the second sensing portions to each other. The first sensing portions, the second sensing portions, and the extension patterns are included in the second conductive layer, and the connection patterns are included in the first conductive layer.

In an embodiment, a display device includes a display panel including a plurality of light-emitting regions, a non-light-emitting region, a display element layer, and an encapsulation layer disposed on the display element layer. The display device further includes an input sensing layer including a first insulating layer directly disposed on the encapsulation layer and a plurality of sensing electrodes disposed on the first insulating layer. Each of the plurality of sensing electrodes includes a mesh pattern having a plurality of openings defined therein. The openings defined in the mesh pattern include a plurality of central openings that at least partially overlap the light-emitting regions, and a plurality of peripheral openings that do not overlap the light-emitting regions. A cut portion connecting two adjacent peripheral openings to each other among the peripheral openings is defined in the mesh pattern.

In an embodiment, the cut portion is spaced apart from the plurality of central openings.

In an embodiment, each of the plurality of light-emitting regions includes a plurality of outer sides, and at least one of the plurality of outer sides is covered by the mesh pattern on a plane.

In an embodiment, each of the plurality of central openings is disposed within a corresponding light-emitting region on a plane, and the plurality of outer sides of each of the plurality of light-emitting regions is covered by the mesh pattern.

In an embodiment, each of the plurality of light-emitting regions is disposed within a corresponding central opening on a plane, and the mesh pattern does not overlap the plurality of light-emitting regions.

In an embodiment, an electronic device includes a display panel including a plurality of light-emitting regions, a non-light-emitting region, a display element layer, and an encapsulation layer disposed on the display element layer, and an input sensing layer including a first insulating layer directly disposed on the encapsulation layer and a plurality of sensing electrodes disposed on the first insulating layer. The electronic device further includes an anti-reflection layer disposed on the input sensing layer. Each of the plurality of sensing electrodes includes a mesh pattern having a plurality of openings defined therein. A portion of the mesh pattern overlaps a portion of each of the plurality of light-emitting regions on a plane.

In an embodiment, an electronic device includes a display panel including a plurality of light-emitting regions, a non-light-emitting region, a display element layer, and an encapsulation layer disposed on the display element layer. The electronic device further includes an input sensing layer including a first insulating layer directly disposed on the encapsulation layer and a plurality of sensing electrodes disposed on the first insulating layer. The electronic device further includes an anti-reflection layer disposed on the input sensing layer. Each of the plurality of sensing electrodes includes a mesh pattern having a plurality of openings defined therein. The openings defined in the mesh pattern include a plurality of central openings that at least partially overlap the light-emitting regions, and a plurality of peripheral openings that do not overlap the light-emitting regions.

A cut portion connecting two adjacent peripheral openings to each other among the peripheral openings is defined in the mesh pattern.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
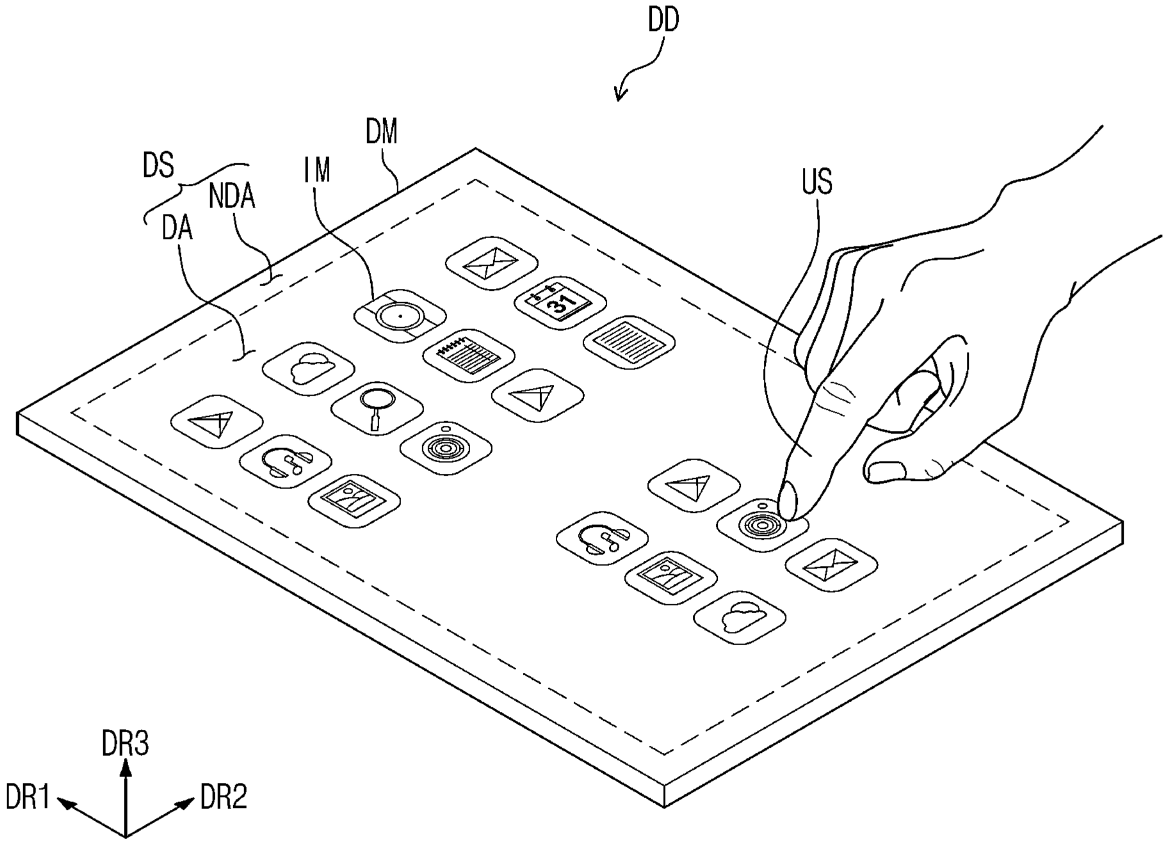
FIG. 1 is a perspective view of a display device according to an embodiment of the inventive concept.

Embodiments of the inventive concept will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

As used herein, the term "and/or" includes any and all combinations that the associated configurations can define.

It will be understood that the terms "first," "second," "third," etc. are used herein to distinguish one element from another, and the elements are not limited by these terms. Thus, a "first" element in an embodiment may be described as a "second" element in another embodiment.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "include" and/or "have", when used in this specification, specify the presence of stated features, integers, steps, operations, elements, components and/or groups thereof, but do not preclude the presence or addition of one or more other features, integers, steps, operations, elements, components, and/or groups thereof.

FIG. 1 is a perspective view of a display device DD according to an embodiment of the inventive concept.

The display device DD may be activated according to an electrical signal and display an image IM. For example, the display device DD can be used in large-sized devices like televisions and external billboards, as well as in small to medium-sized devices such as monitors, mobile phones, tablets, navigation systems, and game consoles. However, the above-described embodiments of the display device DD are examples, and the examples of the display device are not limited to any one of the embodiments as long as they do not depart from the concept of the present inventive concept.

Referring to FIG. 1, the display device DD may include a display module DM configured to display an image IM and sense an external input. On a plane, the display module DM may have a rectangular shape with long sides extending in a first direction DR1 and short sides extending in a second direction DR2 crossing the first direction DR1. Without being limited thereto, however, the display module DM may have various shapes such as, for example, a circle or a polygon.

In an embodiment, a third direction DR3 may be defined as a direction substantially perpendicular to a plane defined by the first direction DR1 and the second direction DR2. The front (or upper) and rear (or lower) surfaces of each member constituting the display device DD may be opposed to each other in the third direction DR3, and the normal direction of each of the front and rear surfaces may be substantially parallel to the third direction DR3. The separation distance between the front and rear surfaces defined along the third direction DR3 may correspond to the thickness of a member.

In this specification, the expression "on a plane" may be defined as viewed in the third direction DR3. In this specification, the expression "on a cross section" may be defined as viewed in the first direction DR1 or the second direction DR2. Directions indicated by the first to third directions DR1, DR2, and DR3 are relative concepts and may be converted into other directions.

The display device DD may be rigid or flexible. The expression "being flexible" means a property of being bendable, and a flexible structure may include everything from a completely foldable structure to a structure that can be bent to the level of several nanometers. For example, a flexible display device DD may include a curved device, a rollable device, a slidable device, or a foldable device.

The upper surface of the display module DM may be defined as a display surface DS, and the display surface DS may have a plane defined by the first direction DR1 and the second direction DR2. The display module DM may display an image IM generated through the display surface DS to a user. The display surface DS may include a display region DA and a non-display region NDA.

An image IM may be displayed in the display region DA, and the image IM is not displayed in the non-display region NDA. The non-display region NDA may be adjacent to the display region DA. For example, the non-display region NDA may surround the display region DA. The non-display region NDA may correspond to a region printed in a predetermined color and define a boundary of the display module DM. For example, the non-display region may correspond to a bezel area.

The display module DM can sense an input applied from the outside of the display module DM. An external input may include various types of inputs such as, for example, force, pressure, temperature, or light. In an embodiment, the external input is illustrated as a user's hand US applied to the front surface of the display device DD. However, this is illustrated as an example, and the external input may include a touch by, for example, a pen or an input, such as hovering, applied in proximity to the display device DD.

Figure 2:
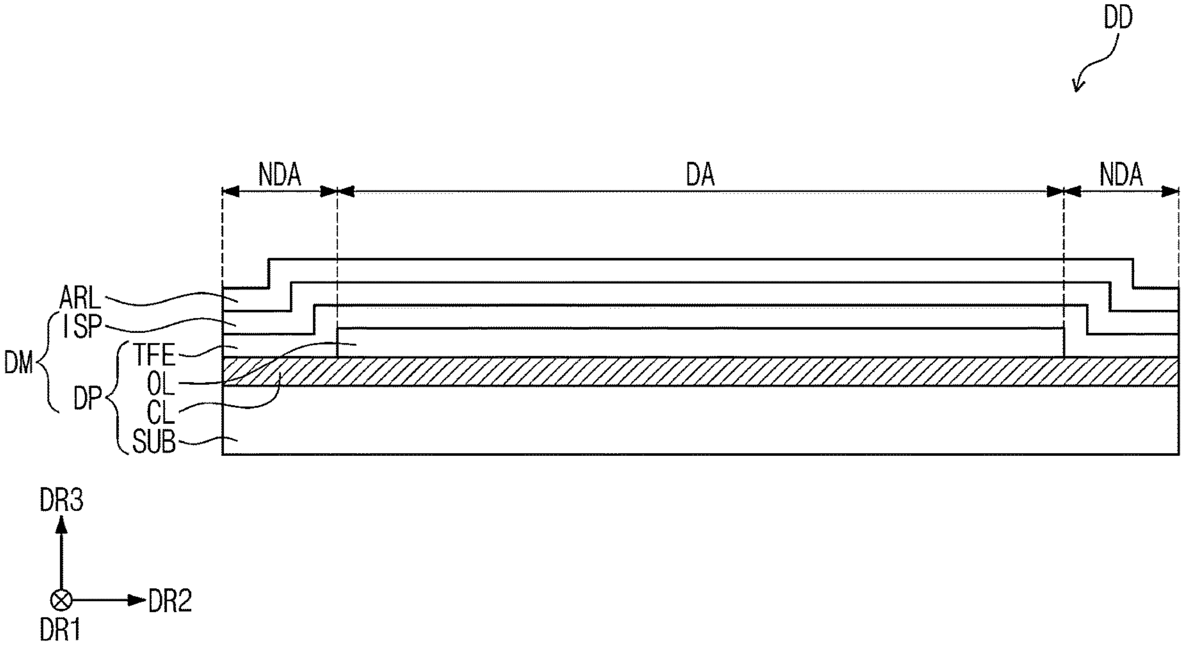
FIG. 2 is a cross-sectional view of a display module according to an embodiment of the inventive concept.

FIG. 2 is a schematic cross-sectional view of the display device DD according to an embodiment of the inventive concept.

Referring to FIG. 2, the display device DD may include a display module DM and an anti-reflection layer ARL, and the display module DM may include a display panel DP and an input sensing layer ISP. The display panel DP may include a base substrate SUB, a circuit element layer CL, a display element layer OL, and a thin film encapsulation layer TFE.

The display panel DP according to an embodiment of the inventive concept may be a light-emitting display panel. However, embodiments are not particularly limited thereto. For example, the display panel DP may be an organic light-emitting display panel or an inorganic light-emitting display panel. A light-emitting layer of the organic light-emitting display panel may include an organic light-emitting material. A light-emitting layer of the inorganic light-emitting display panel may include, for example, quantum dots, quantum rods, and the like. Hereinafter, the display panel DP will be described as an organic light-emitting display panel.

The base substrate SUB may provide a base surface on which the circuit element layer CL is disposed. The base substrate SUB may be a rigid substrate or a flexible substrate capable of being bent, folded, or rolled. The base substrate SUB may be, for example, a glass substrate, a metal substrate, or a polymer substrate. However, embodiments of the inventive concept are not limited thereto, and the base substrate SUB may be, for example, an inorganic layer, an organic layer, or a composite material layer.

The base substrate SUB may have a multi-layered structure. For example, the base substrate SUB may include synthetic resin layers and a multi-layered or single-layered inorganic layer disposed between the synthetic resin layers. The synthetic resin layer may include, for example, an acrylic-based resin, a methacrylic-based resin, polyisoprene, a vinyl-based resin, an epoxy-based resin, a urethane-based resin, a cellulose-based resin, a siloxane-based resin, a polyamide-based resin, a perylene-based resin, and the like. However, embodiments of the inventive concept are not particularly limited thereto.

The circuit element layer CL may be disposed on the base substrate SUB. The circuit element layer CL may include, for example, an insulating layer, a semiconductor pattern, and a conductive pattern. The insulating layer, the semiconductor pattern, and the conductive pattern included in the circuit element layer CL may form driving elements, signal lines, and pads within the circuit element layer CL.

The display element layer OL may be disposed on the circuit element layer CL. The display element layer OL may include light-emitting elements disposed in the display region DA. The light-emitting elements may include, for example, an organic light-emitting element, an inorganic light-emitting element, a micro LED, a nano LED, or the like. However, embodiments of the inventive concept are not particularly limited thereto. The light-emitting elements of the display element layer OL may be electrically connected to the driving elements of the circuit element layer CL and generate light within the display region DA according to signals provided by the driving elements.

The thin film encapsulation layer TFE may be disposed on the display element layer OL and may seal the light-emitting elements. The thin film encapsulation layer TFE may include at least one thin film that increases the optical efficiency of the display element layer OL or protects the display element layer OL. The thin film encapsulation layer TFE may include at least one of an inorganic layer or an organic layer.

The input sensing layer ISP may be disposed on the display panel DP. The input sensing layer ISP may be formed through a continuous process on the base surface provided by the display panel DP. The input sensing layer ISP may be directly disposed on the display panel DP without a separate adhesive layer. However, embodiments of the inventive concept are not particularly limited thereto. For example, according to embodiments, the input sensing layer ISP may be coupled to the display panel DP by an adhesive layer.

The input sensing layer ISP can sense an external input and provide an input signal including information about the external input so that the display panel DP may display an image corresponding to the external input. The input sensing layer ISP may be driven in various methods such as, for example, a capacitive method, a resistive film method, an infrared method, a sound wave method, or a pressure method. For example, as long as a driving method of the input sensing layer ISP can sense an external input, embodiments of the inventive concept are not limited to any one method. In an embodiment, the input sensing layer ISP is described as an input sensing panel which is driven in a capacitive method.

The anti-reflection layer ARL may be disposed on the input sensing layer ISP. The anti-reflection layer ARL may be disposed directly on the input sensing layer ISP (e.g., without use of a separate adhesive layer). Without being limited thereto, however, the anti-reflection layer ARL may be coupled to the input sensing layer ISP by a separate adhesive layer. The anti-reflection layer ARL may reduce the reflectance of external light incident from the outside of the display device DD (see FIG. 2).

In an embodiment, the anti-reflection layer ARL may include a retarder and/or a polarizer. Each of the retarder and the polarizer may be provided as a film type or a liquid crystal coating type. The retarder and the polarizer may be provided in the form of a single polarizing film.

In an embodiment, the anti-reflection layer ARL may include color filters. The color filters may be disposed to correspond to the arrangement and light-emitting colors of pixels included in the display panel DP. The color filters may filter external light incident from the outside of the display device DD into the same colors as those of light emitted by corresponding pixels. The anti-reflection layer ARL may further include a light blocking pattern adjacent to the color filters.

FIG. 2 illustrates an embodiment in which the input sensing layer ISP and the anti-reflection layer ARL are sequentially disposed on the display panel DP. However, embodiments of the inventive concept are not limited thereto. For example, the stacking order of the anti-reflection layer ARL and the input sensing layer ISP may be changed.

Figure 3:
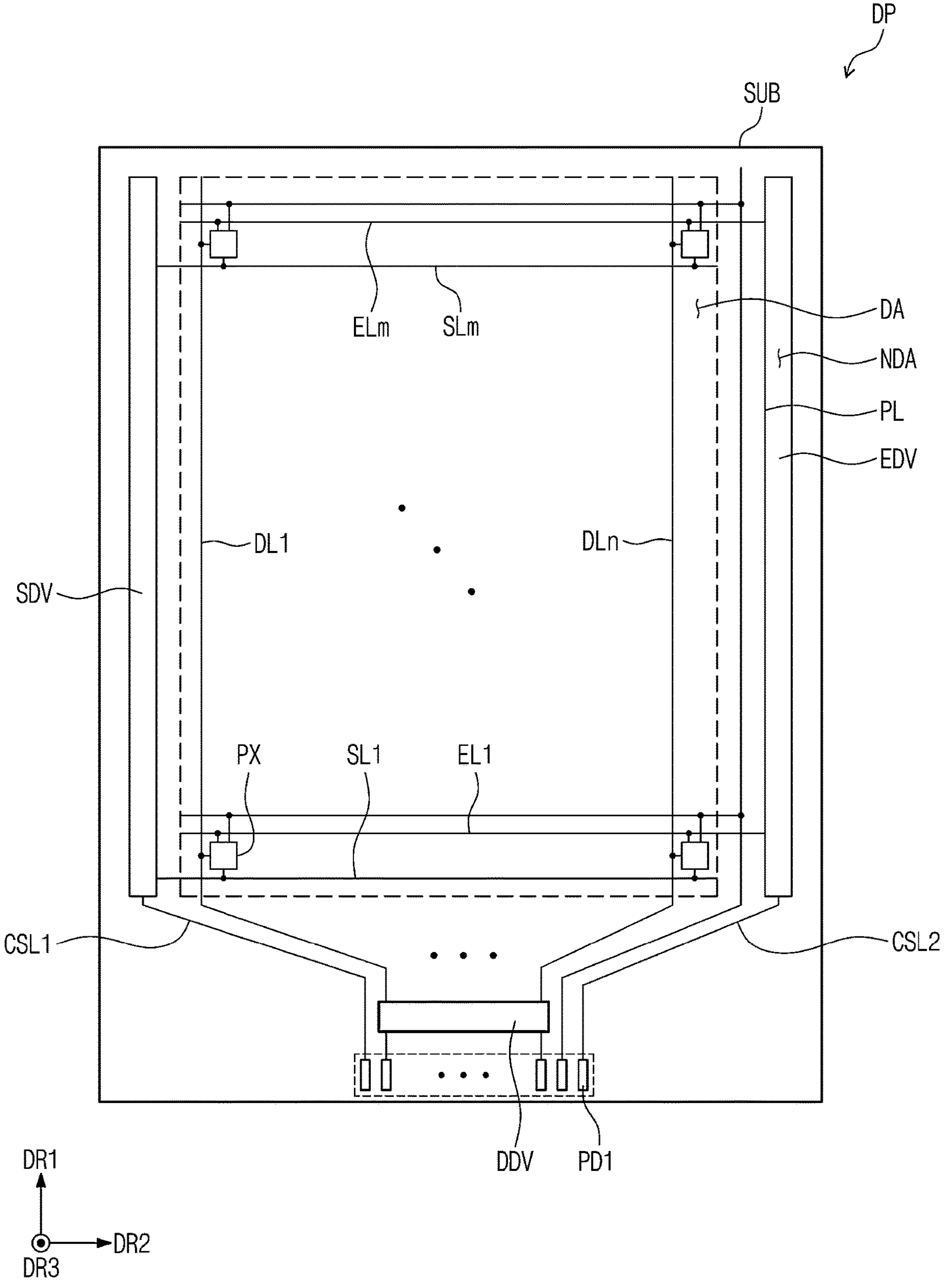
FIG. 3 is a plan view of a display panel according to an embodiment of the inventive concept.

FIG. 3 is a plan view of the display panel DP according to an embodiment of the inventive concept.

Referring to FIG. 3, the display panel DP may include a base substrate SUB, pixels PX, signal lines SL1 to SLm, DL1 to DLn, EL1 to ELm, CSL1, CSL2, and PL electrically connected to the pixels PX, a scan driver SDV (also referred to as a scan driver circuit), a data driver DDV (also referred to as a data driver circuit), and a light-emitting driver EDV (also referred to as a light-emitting driver circuit). Each of m and n is a positive integer.

The base substrate SUB may provide a base surface on which the elements and lines of the display panel DP are disposed on a plane parallel to each of the first direction DR1 and the second direction DR2. The base substrate SUB may include the display region DA and the non-display region NDA of the display panel DP.

The display region DA may be a region in which the pixels PX are disposed and an image is displayed. The non-display region NDA may be adjacent to the display region DA and may be a region in which an image is not displayed. The scan driver SDV, the data driver DDV, and the light-emitting driver EDV, and the like, which are configured to drive the pixels PX, may be disposed in the non-display region NDA. However, in order to reduce the area of the non-display region NDA, at least one of the scan driver SDV, the data driver DDV, or the light-emitting driver EDV may be disposed in the display region DA according to an embodiment.

Each of the pixels PX may include a pixel driving circuit including a plurality of transistors (e.g., a switching transistor, a driving transistor, and the like) and at least one capacitor, and a light-emitting element electrically connected to the pixel driving circuit. Each of the pixels PX may display an image in the display region DA by emitting light in response to an electrical signal applied to the pixel PX. Some of the pixels PX may include a transistor disposed in the non-display region NDA, and the inventive concept is not limited to any one embodiment.

The signal lines SL1-SLm, DL1-DLn, EL1-ELm, CSL1, CSL2, and PL may include scan lines SL1-SLm, data lines DL1-DLn, light-emitting lines EL1-Elm, first and second control lines CSL1 and CSL2, and a power line PL.

The data lines DL1 to DLn may be insulated from and cross the scan lines SL1 to SLm and the light-emitting lines EL1 to ELm on a plane. For example, the scan lines SL1 to SLm may extend in the second direction DR2 and be electrically connected to the scan driver SDV. The data lines DL1 to DLn may extend in the first direction DR1 and be electrically connected to the data driver DDV. The light-emitting lines EL1 to ELm may extend in the second direction DR2 and be electrically connected to the light-emitting driver EDV.

The power line PL may include a portion extending in the first direction DR1 and a portion extending in the second direction DR2. The portion of the power line PL extending in the first direction DR1 may be disposed in the non-display region NDA. The portion of the power line PL extending in the second direction DR2 may be electrically connected to the pixels PX and the portion of the power line PL extending in the first direction DR1. The portion of the power line PL extending in the second direction DR2 may be disposed on a layer different from that of the portion extending in the first direction DR1 and connected thereto through a contact hole, or may have an integral shape with the portion extending in the first direction DR1 on the same layer as each other.

The first control line CSL1 may be electrically connected to the scan driver SDV. The second control line CSL2 may be electrically connected to the light-emitting driver EDV.

First pads PD1 may be adjacent to the lower end of the non-display region NDA. The first pads PD1 may be disposed closer to the lower end of the display panel DP than the data driver DDV. The first pads PD1 may be spaced apart from each other along the second direction DR2.

The first pads PD1 may be defined as display pads electrically connected to the pixels PX. Each of the first pads PD1 may be connected to a corresponding signal line among the signal lines SL1 to SLm, DL1 to DLn, EL1 to ELm, CSL1, CSL2, and PL. For example, the first pads PD1 may be electrically connected to the power line PL, the first control line CSL1, the second control line CSL2, and the data lines DL1 to DLn, respectively.

The scan driver SDV may generate scan signals in response to a scan control signal. The scan signals may be applied to the pixels PX through the scan lines SL1 to SLm. The data driver DDV may generate data voltages corresponding to image signals in response to a data control signal. The data voltages may be applied to the pixels PX through the data lines DL1 to DLn. The light-emitting driver EDV may generate light-emitting signals in response to a light-emitting control signal. The light-emitting signals may be applied to the pixels PX through the light-emitting lines EL1 to ELm.

The pixels PX may receive the data voltages in response to the scan signals. The pixels PX may display an image by emitting light having a luminance which corresponds to the data voltages in response to the light-emitting signals. The light-emitting time of the pixels PX may be controlled by the light-emitting signals.

Figure 4A:
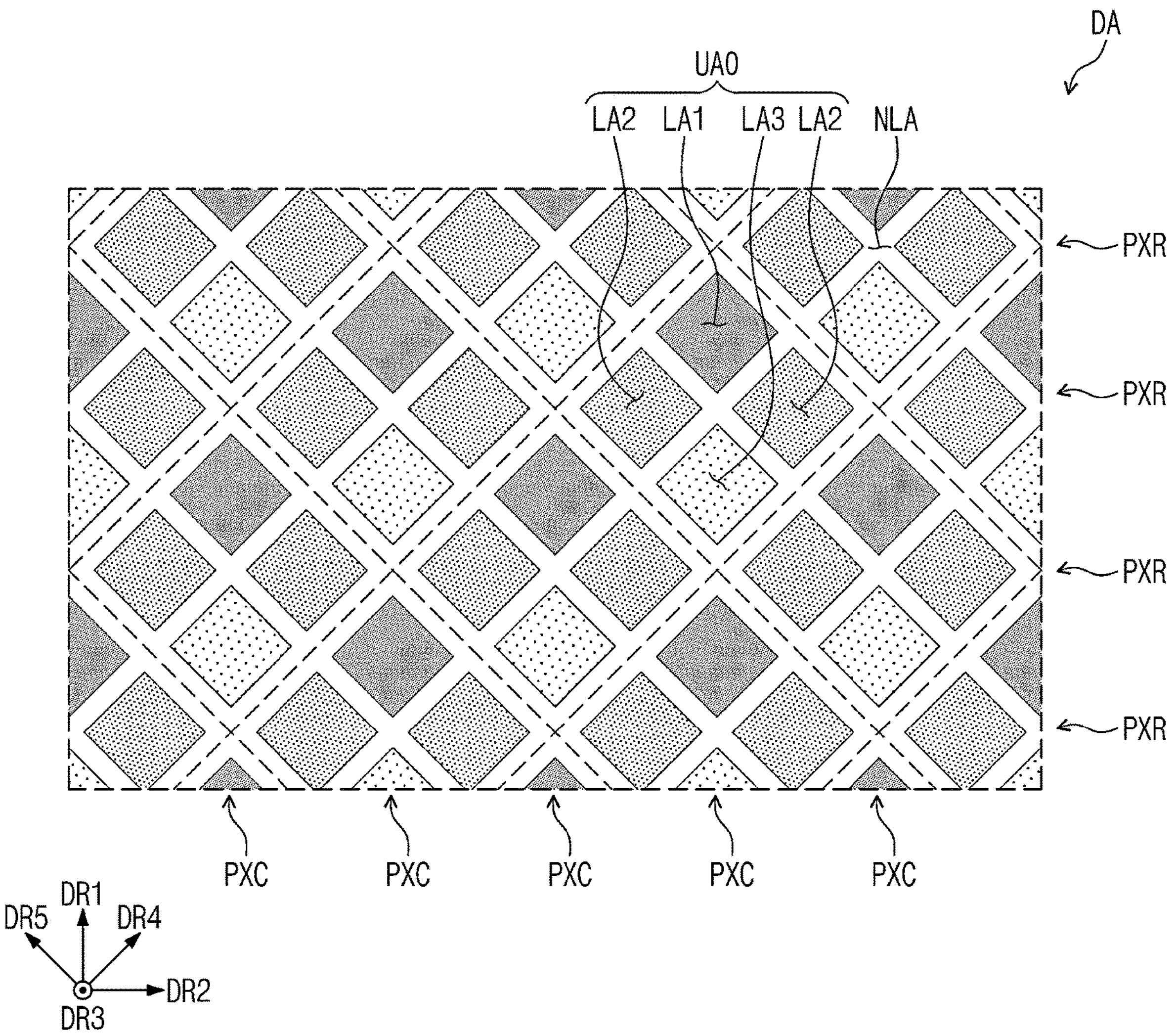
FIGS. 4A to 4C are enlarged plan views of a display region according to an embodiment of the inventive concept.
Figure 4B:
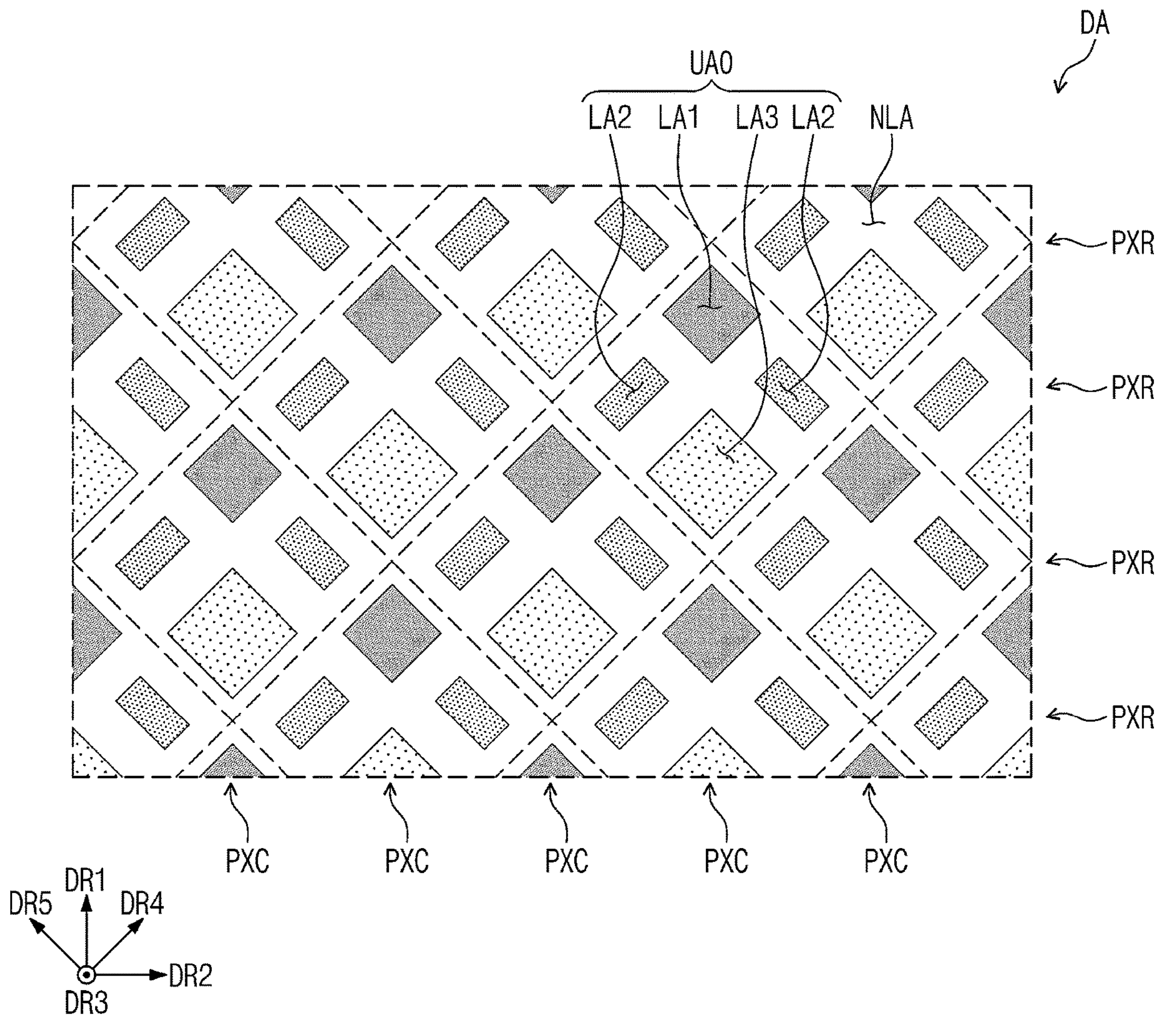
Figure 4C:
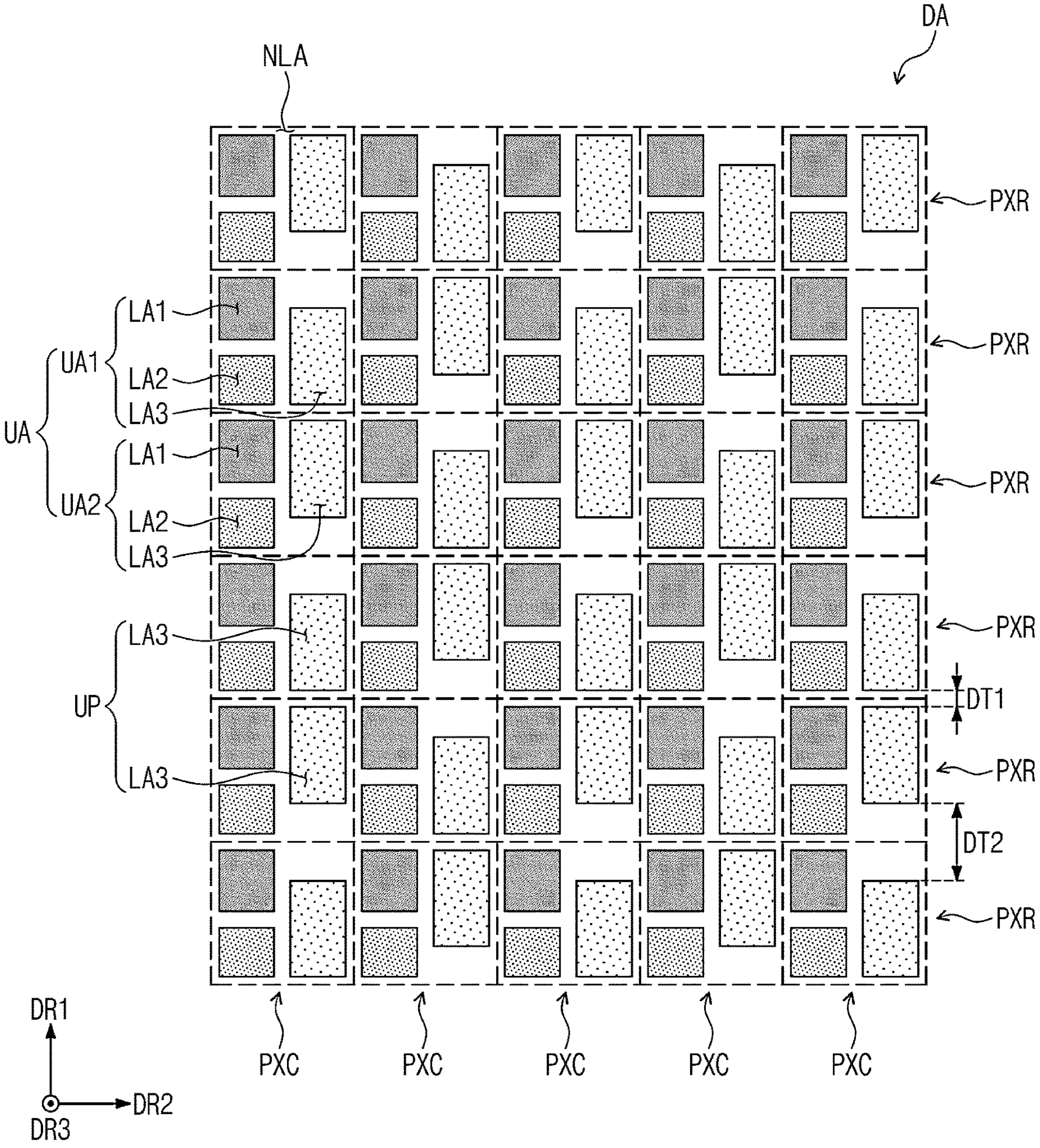

FIGS. 4A to 4C are enlarged plan views of the display region DA according to an embodiment of the inventive concept.

Referring to FIGS. 4A and 4B, the display region DA may include a plurality of light-emitting regions LA1, LA2, and LA3, and a non-light-emitting region NLA adjacent to the plurality of light-emitting regions LA1, LA2, and LA3. The non-light-emitting region NLA sets the boundaries of the light-emitting regions LA1, LA2, and LA3.

The light-emitting regions LA1, LA2, and LA3 may be disposed in a one-to-one correspondence with the pixels PX of FIG. 3. Each of the pixels PX may include a light-emitting element, and the light-emitting regions LA1, LA2, and LA3 may be regions in which light is emitted from the light-emitting element. The arrangement relationship between the light-emitting regions LA1, LA2, and LA3 and the non-light-emitting region NLA will be described in more detail below with reference to FIG. 4D.

The light-emitting regions LA1, LA2, and LA3 may include a first light-emitting region LA1 (or first color light-emitting region) forming a first color light, a second light-emitting region LA2 (or second color light-emitting region) forming a second color light, and a third light-emitting region LA3 (or third color light-emitting region) forming a third color light. In an embodiment, the first color light may be red light, the second color light may be green light, and the third color light may be blue light.

The first light-emitting region LA1, the second light-emitting region LA2, and the third light-emitting region LA3 may define one unit light-emitting region UA. The unit light-emitting region UA is a repetitive arrangement unit of a light-emitting region disposed in the display region DA.

In an embodiment, one type of unit light-emitting region UA0 is disposed in the display region DA. The unit light-emitting region UA0 includes second light-emitting regions LA2 spaced apart from each other in the first direction DR1, and a first light-emitting region LA1 and a third light-emitting region LA3 spaced apart from each other in the second direction DR2. The four light-emitting regions LA1, LA2, and LA3 of the unit light-emitting region UA0 are arranged in a diamond shape.

The unit light-emitting regions UA0 of each of pixel rows PXR are arranged along the second direction DR2. The unit light-emitting regions UA0 of adjacent pixel rows PXR may be staggered from each other along the second direction DR2. The unit light-emitting regions UA0 of each of pixel columns PXC are arranged along the first direction DR1. The unit light-emitting regions UA0 of adjacent pixel columns PXC may be staggered from each other along the first direction DR1.

The first light-emitting regions LA1 and the third light-emitting regions LA3 may be alternately arranged in each of the first and second directions DR1 and DR2. The second light-emitting regions LA2 may be arranged along each of the first direction DR1 and the second direction DR2. The second light-emitting region LA2 and each of the first light-emitting region LA1 and the third light-emitting region LA3 may be spaced apart from each other along a first diagonal direction DR4 or a second diagonal direction DR5. The first diagonal direction DR4 may cross each of the first and second directions DR1 and DR2 on a plane defined by the first and second directions DR1 and DR2. The second diagonal direction DR5 may cross each of the first direction DR1, the second direction DR2, and the fourth direction DR4 on a plane defined by the first direction DR1 and the second direction DR2.

In an embodiment, as illustrated in FIG. 4A, the first light-emitting region LA1, the second light-emitting region LA2, and the third light-emitting region LA3 may have the same area as each other. Without being limited thereto, however, as illustrated in FIG. 4B, the areas of the first light-emitting region LA1, the second light-emitting region LA2, and the third light-emitting region LA3 may be different from each other. For example, the second light-emitting region LA2 may have the smallest area, and the third light-emitting region LA3 may have the largest area.

Referring to FIG. 4C, in an embodiment, the unit light-emitting region UA may include a first unit light-emitting region UA1 and a second unit light-emitting region UA2. Referring to the first unit light-emitting region UA1 and the second unit light-emitting region UA2, the first light-emitting region LA1 and the second light-emitting region LA2 may be spaced apart from each other in the first direction DR1, and the third light-emitting region LA3 may be spaced apart from the first and second light-emitting regions LA1 and LA2 in the second direction DR2. The first light-emitting region LA1 may be adjacent to one side (the upper side in FIG. 4C) of the third light-emitting region LA3 in the first direction DR1. The second light-emitting region LA2 may be disposed on one side (the lower side in FIG. 4C) of the first light-emitting region LA1 in the first direction DR1.

The position of the third light-emitting region LA3 of the first unit light-emitting region UA1 and the position of the third light-emitting region LA3 of the second unit light-emitting region UA2 in the second direction DR2 with respect to the first light-emitting region LA1 and the second light-emitting region LA2 may be different from each other. Referring to the first unit light-emitting region UA1, the position of the third light-emitting region LA3 with respect to the first light-emitting region LA1 and the second light-emitting region LA2 in the first direction DR1 is disposed to be at a relatively lower side. Referring to the second unit light-emitting region UA2, the position of the third light-emitting region LA3 with respect to the first light-emitting region LA1 and the second light-emitting region LA2 in the first direction DR1 is disposed to be at a relatively upper side. The degree of shift of the third light-emitting region LA3 of the first unit light-emitting region UA1 and the degree of shift of the third light-emitting region LA3 of the second unit light-emitting region UA2 in the first direction DR1 with respect to the first light-emitting region LA1 and the second light-emitting region LA2 may be different from each other. In an embodiment, the third light-emitting region LA3 of the second unit light-emitting region UA2 may be relatively further shifted. Without being limited thereto, however, the degree of shift of the third light-emitting region LA3 of the first unit light-emitting region UA1 and the degree of shift of the third light-emitting region LA3 of the second unit light-emitting region UA2 in the first direction DR1 with respect to the first light-emitting region LA1 and the second light-emitting region LA2 may be the same as each other.

The first unit light-emitting region UA1 and the second unit light-emitting region UA2 may be alternately disposed along the second direction DR2 within a pixel row PXR. The first unit light-emitting region UA1 and the second unit light-emitting region UA2 are alternately disposed along the first direction DR1 within a pixel column PXC.

One third light-emitting region LA3 of the first unit light-emitting region UA1 and one third light-emitting region LA3 of the second unit light-emitting region UA2, which are adjacent to each other, are spaced apart from each other by a first distance DT1 and disposed relatively close to each other. The third light-emitting region LA3 of the first unit light-emitting region UA1 and the third light-emitting region LA3 of the second unit light-emitting region UA2, which are spaced apart from each other by the first distance DT1, define a light-emitting region pair UP. The light-emitting region pair UP may be spaced apart from each other by a second distance DT2 within each pixel column PXC. The second distance DT2 may be greater than the first distance DT1.

A light-emitting element disposed in the third light-emitting region LA3 of the first unit light-emitting region UA1 and a light-emitting element disposed in the third light-emitting region LA3 of the second unit light-emitting region UA2 may include a light-emitting layer having an integral shape with each other. That is, the light-emitting layer disposed in the third light-emitting region LA3 of the first unit light-emitting region UA1 and the light-emitting layer disposed in the third light-emitting region LA3 of the second unit light-emitting region UA2 may be deposited by using one mask. Openings corresponding to the light-emitting region pairs UP may be defined in a corresponding mask. Through this, the number of the openings in the mask may be reduced, and the width of the blocking region of the mask disposed between the openings in the first direction DR1 may be secured. The blocking region is defined as a portion of the mask in which an opening is not defined. A defect in which a mask sags during a deposition process may be suppressed.

Figure 4D:
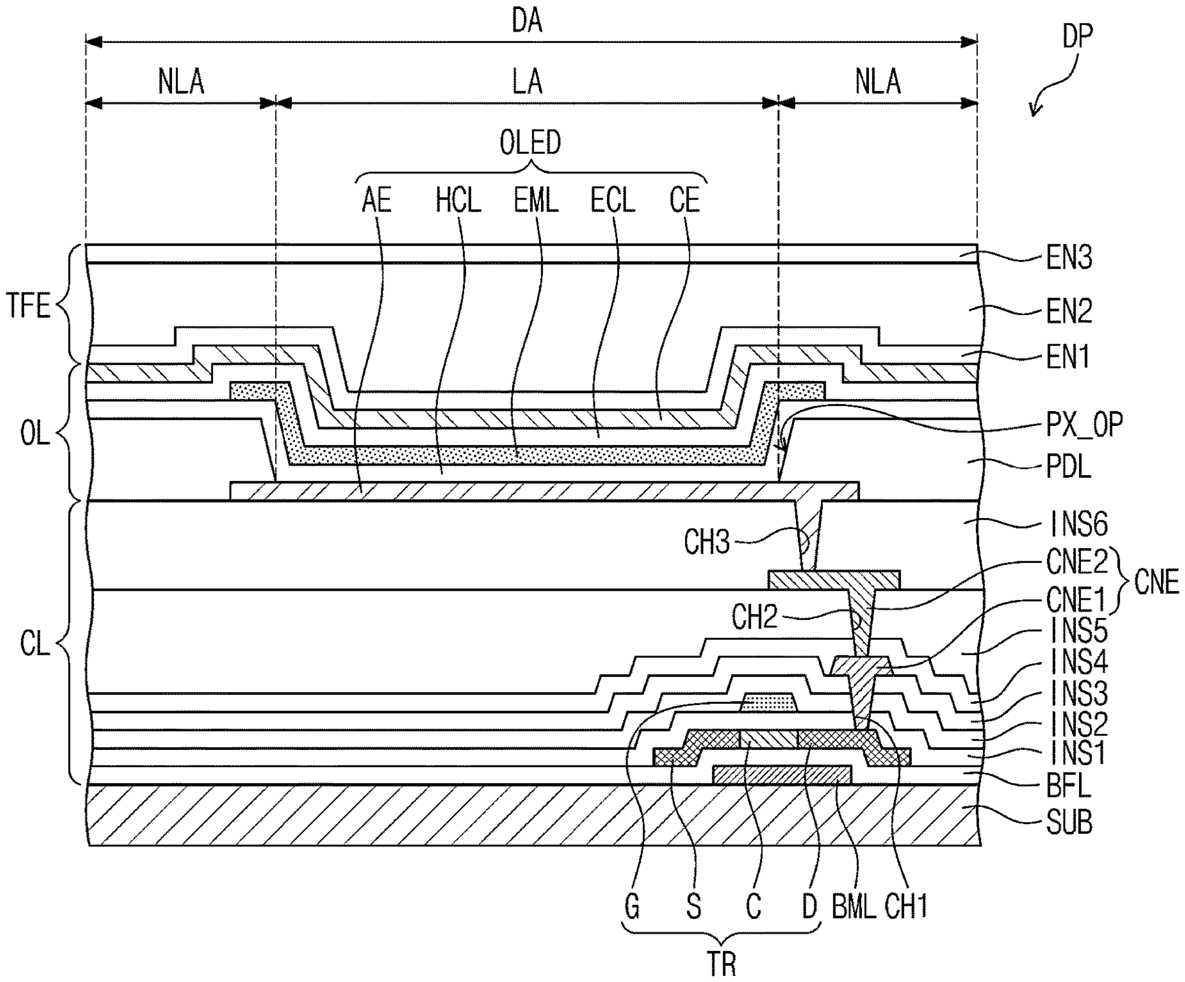
FIG. 4D is a cross-sectional view of a display panel according to an embodiment of the inventive concept.

FIG. 4D is a cross-sectional view of the display panel DP according to an embodiment of the inventive concept. FIG. 4D exemplarily illustrates a cross section of the display panel DP corresponding to any one pixel PX illustrated in FIG. 3.

Referring to FIG. 4D, the pixel PX (see FIG. 3) may include a transistor TR and a light-emitting element OLED. The transistor TR and the light-emitting element OLED may be disposed on the base substrate SUB. Although FIG. 4D illustrates one transistor TR, embodiments are not limited thereto. For example, according to embodiments, the pixel PX (see FIG. 3) may include a plurality of transistors and at least one capacitor for driving the light-emitting element OLED.

The circuit element layer CL may be disposed on the base substrate SUB. The circuit element layer CL may include a shielding electrode BML, a transistor TR, connection electrodes CNE, and a plurality of insulating layers BFL and INS1 to INS6. The plurality of insulating layers BFL and INS1 to INS6 may include a buffer layer BFL and first to sixth insulating layers INS1 to INS6. However, the stacked structure of the circuit element layer CL illustrated in FIG. 4D is an example, and the stacked structure of the circuit element layer CL may change according to the configuration of the pixel PX (see FIG. 3) and the process of the circuit element layer CL.

The shielding electrode BML may be disposed on the base substrate SUB. The shielding electrode BML may overlap the transistor TR. The shielding electrode BML may protect the transistor TR by blocking light incident on the transistor TR from the bottom of the display panel DP. The shielding electrode BML may include a conductive material. In an embodiment, the shielding electrode BML may be connected to the power line PL (see FIG. 3) so as to receive a voltage. When a voltage is applied to the shielding electrode BML, the threshold voltage of the transistor TR disposed on the shielding electrode BML may be maintained. In an embodiment, the shielding electrode BML may be a floating electrode. In an embodiment, the shielding electrode BML may be omitted.

The buffer layer BFL may be disposed on the base substrate SUB and cover the shielding electrode BML. The buffer layer BFL may include an inorganic layer. The buffer layer BFL may increase the bonding strength between a semiconductor pattern or a conductive pattern disposed on the buffer layer BFL and the base substrate SUB.

The transistor TR may include a source S, a channel C, a drain D, and a gate G. The source S, channel C, and drain D of the transistor TR may be formed from a semiconductor pattern. The semiconductor pattern of the transistor TR may include, for example, polysilicon, amorphous silicon, or metal oxide, and the inventive concept is not limited to any one embodiment as long as the material has semiconductor properties.

The semiconductor pattern may include a plurality of regions divided according to the level of conductivity. A region of the semiconductor pattern, which is doped with a dopant or in which metal oxide is reduced, may have high conductivity and substantially serve as a source electrode and a drain electrode of the transistor TR. A region with high conductivity in the semiconductor pattern may correspond to the source S and drain D of the transistor TR. A region of the semiconductor pattern, which is undoped or doped at a low concentration or has low conductivity due to non-reduced metal oxide, may correspond to the channel C (or active) of the transistor TR.

The first insulating layer INS1 may cover the semiconductor pattern of the transistor TR and be disposed on the buffer layer BFL. The gate G of the transistor TR may be disposed on the first insulating layer INS1. The gate G may overlap the channel C of the transistor TR. In an embodiment, the gate G may function as a mask in a process of doping the semiconductor pattern of the transistor TR.

The second insulating layer INS2 may cover the gate G and be disposed on the first insulating layer INS1. The third insulating layer INS3 may be disposed on the second insulating layer INS2.

The connection electrodes CNE may include a first connection electrode CNE1 and a second connection electrode CNE2 that electrically connect the transistor TR and the light-emitting element OLED to each other. However, the inventive concept is not limited to an embodiment in which the connection electrodes CNE connects the transistor TR and the light-emitting element OLED to each other. For example, according to embodiments, and one of the first and second connection electrodes CNE1 and CNE2 may be omitted, or an additional connection electrode may be further included.

The first connection electrode CNE1 may be disposed on the third insulating layer INS3. The first connection electrode CNE1 may be connected to the drain D through a first contact hole CH1 passing through the first to third insulating layers INS1 to INS3. The fourth insulating layer INS4 may cover the first connection electrode CNE1 and be disposed on the third insulating layer INS3. The fifth insulating layer INS5 may be disposed on the fourth insulating layer INS4.

The second connection electrode CNE2 may be disposed on the fifth insulating layer INS5. The second connection electrode CNE2 may be connected to the first connection electrode CNE1 through a second contact hole CH2 passing through the fourth and fifth insulating layers INS4 and INS5. The sixth insulating layer INS6 may cover the second connection electrode CNE2 and be disposed on the fifth insulating layer INS5.

Each of the first to sixth insulating layers INS1 to INS6 may include an inorganic layer or an organic layer. For example, the inorganic layer may include at least one of aluminum oxide, titanium oxide, silicon oxide, silicon oxynitride, zirconium oxide, or hafnium oxide. The organic layer may include at least any one of, for example, an acrylic-based resin, a methacrylic-based resin, polyisoprene, a vinyl-based resin, an epoxy-based resin, a urethane-based resin, a cellulose-based resin, a siloxane-based resin, a polyamide-based resin, or a perylene-based resin.

The display element layer OL may include a pixel defining film PDL and a light-emitting element OLED. The light-emitting element OLED may include a first electrode AE, a hole control layer HCL, an electron control layer ECL, a light-emitting layer EML, and a second electrode CE.

The first electrode AE may be disposed on the sixth insulating layer INS6. The first electrode AE may be connected to the second connection electrode CNE2 through a third contact hole CH3 passing through the sixth insulating layer INS6. The first electrode AE may be electrically connected to the drain D of the transistor TR through the first and second connection electrodes CNE1 and CNE2.

The pixel defining film PDL may be disposed on the sixth insulating layer INS6. A light-emitting opening PX_OP exposing a portion of the first electrode AE may be defined in the pixel defining film PDL. The portion of the first electrode AE exposed by the light-emitting opening PX_OP may be defined as a light-emitting region LA. The light-emitting region LA may correspond to one of the above-described first to third light-emitting regions LA1, LA2, and LA3 (see FIGS. 4A, 4B and 4C).

The region in which the pixel defining film PDL is disposed may correspond to the non-light-emitting region NLA. The non-light-emitting region NLA may surround the light-emitting region LA within the display region DA.

The hole control layer HCL may be disposed on the first electrode AE and the pixel defining film PDL. The hole control layer HCL may be provided as a common layer overlapping the light-emitting region LA and the non-light-emitting region NLA. The hole control layer HCL may include at least any one of a hole transport layer, a hole injection layer, or an electron blocking layer.

The light-emitting layer EML may be disposed on the hole control layer HCL. The light-emitting layer EML may be disposed in a region corresponding to the light-emitting opening PX_OP. However, the inventive concept is not limited thereto. For example, according to embodiments, the light-emitting layer EML may be provided as a common layer. The light-emitting layer EML may include an organic material and/or an inorganic material. The light-emitting layer EML may emit color light of any one of red, green, and blue.

The electron control layer ECL may be disposed on the light-emitting layer EML. The electron control layer ECL may be provided as a common layer overlapping the light-emitting region LA and the non-light-emitting region NLA. The electron control layer ECL may include at least any one of an electron transport layer, an electron injection layer, or a hole blocking layer.

The second electrode CE may be disposed on the electron control layer ECL. The second electrode CE may be provided as a common layer overlapping the light-emitting region LA and the non-light-emitting region NLA. The second electrode CE may be commonly disposed in the pixels PX (see FIG. 3) and apply a voltage to the pixels PX (see FIG. 3).

The thin film encapsulation layer TFE may be disposed on the second electrode CE and cover the light-emitting element OLED. The thin film encapsulation layer TFE may include a plurality of thin films EN1, EN2, and EN3. The thin film encapsulation layer TFE may include inorganic films disposed on the second electrode CE and an organic film disposed between the inorganic films. For example, a first thin film EN1 may be disposed on the display element layer OL. A second thin film EN2 may be disposed on the first thin film EN1, and a third thin film EN3 may be disposed on the second thin film EN2.

Each of the first to third thin films EN1, EN2, and EN3 may include an inorganic film or an organic film. For example, the first thin film EN1 and the third thin film EN3 may include an inorganic film, and the second thin film EN2 may include an organic film. The inorganic film of the thin film encapsulation layer TFE may protect the light-emitting element OLED from moisture or oxygen, and the organic film of the thin film encapsulation layer TFE may protect the light-emitting element OLED from foreign substances such as dust particles. However, the thin film encapsulation layer TFE according to embodiments is not necessarily limited thereto.

A first voltage may be applied to the first electrode AE through the transistor TR, and a second voltage having a level lower than that of the first voltage may be applied to the second electrode CE. Holes and electrons injected into the light-emitting layer EML may be combined to form excitons, and while the excitons transition to a ground state, the light-emitting element OLED may emit light.

Figure 5A:
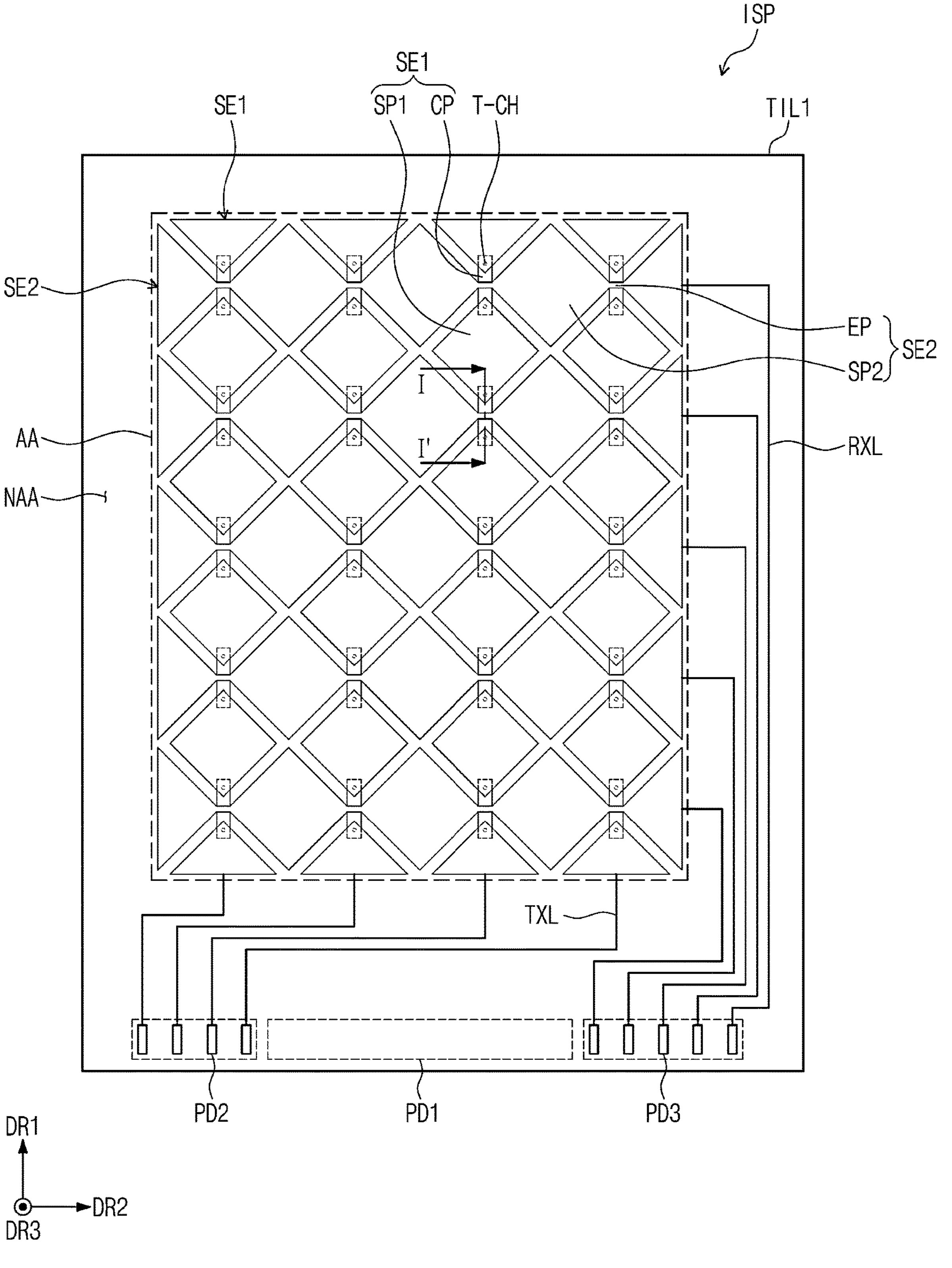
FIG. 5A is a plan view of an input sensing layer according to an embodiment of the inventive concept.
Figure 5B:
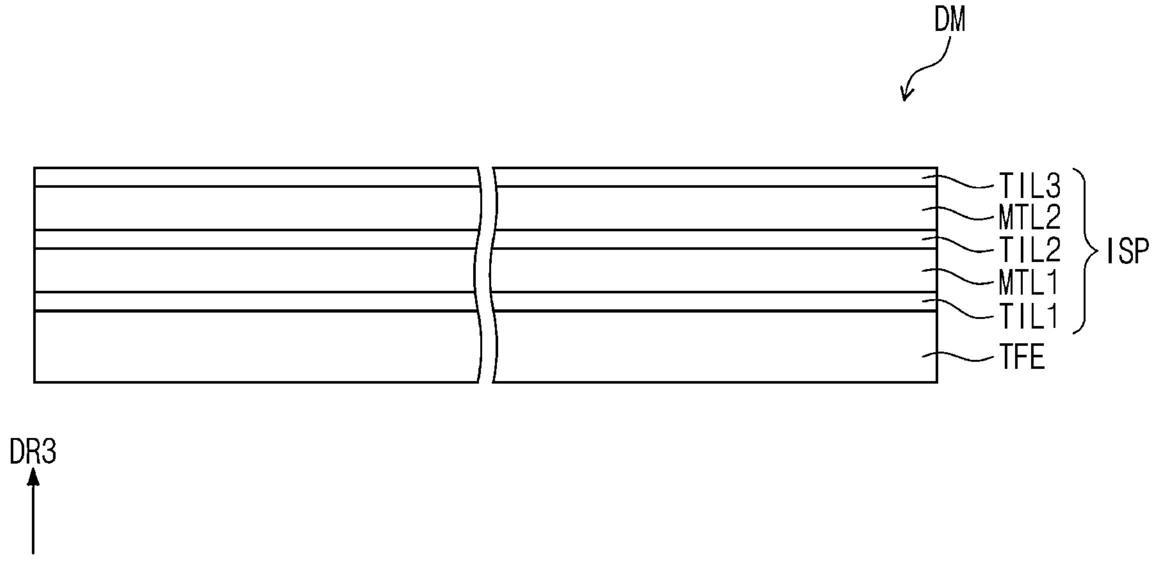
FIG. 5B is a cross-sectional view of some components of a display module according to an embodiment of the inventive concept.
Figure 5C:
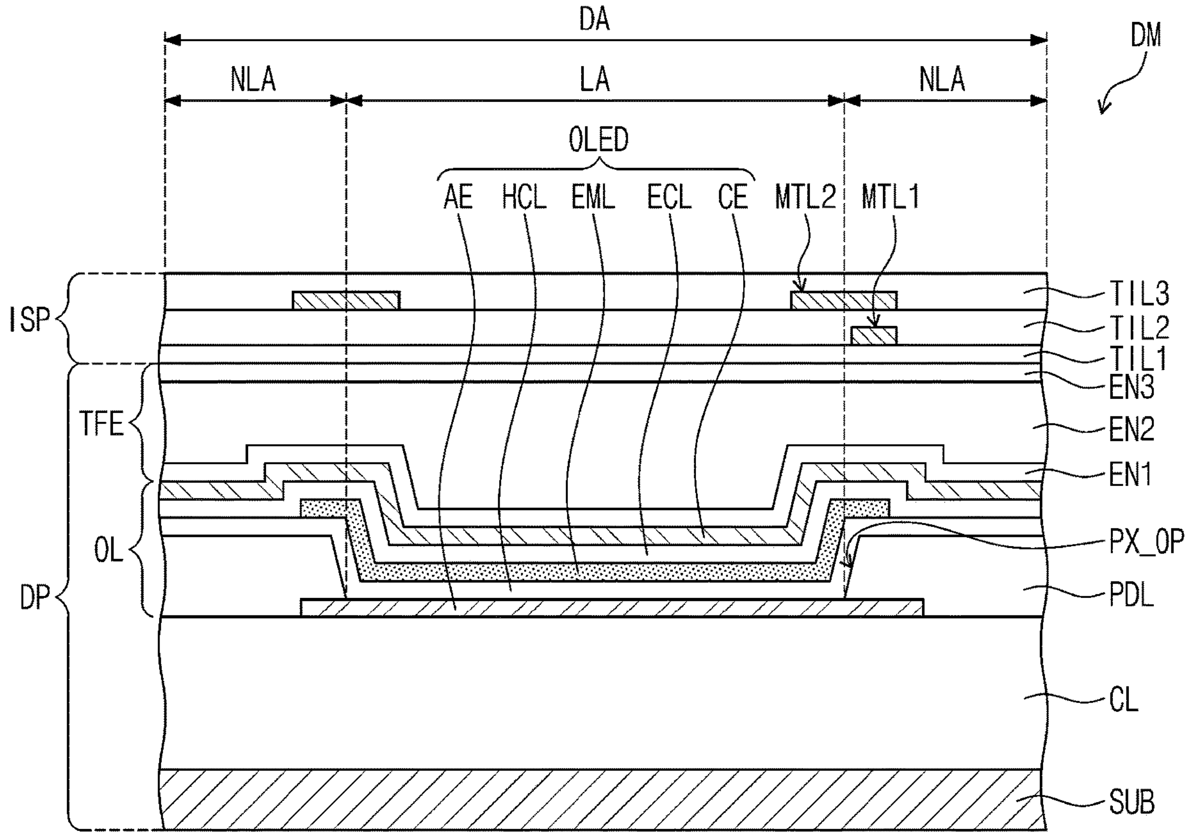
FIG. 5C is a cross-sectional view of some components of a display module according to an embodiment of the inventive concept.
Figure 5D:
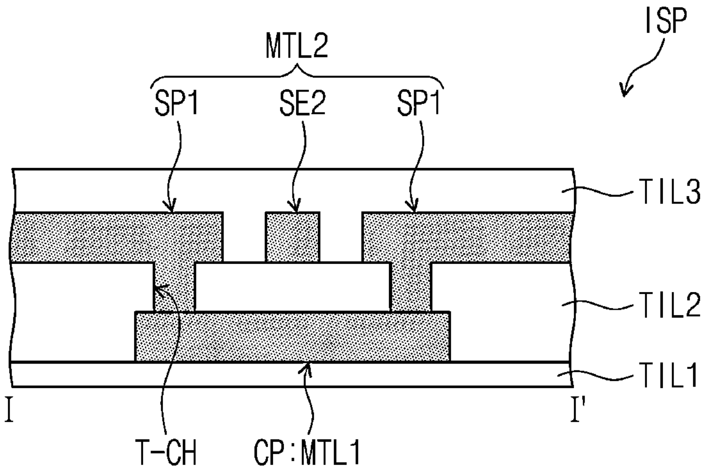
FIG. 5D is a cross-sectional view of an input sensing layer according to an embodiment of the inventive concept, which corresponds to region I-I' of FIG. 5A.

FIG. 5A is a plan view of an input sensing layer ISP according to an embodiment of the inventive concept. FIG. 5B is a cross-sectional view of some components of the display module DM according to an embodiment of the inventive concept. FIG. 5C is a cross-sectional view of some components of the display module DM according to an embodiment of the inventive concept. FIG. 5D is a cross-sectional view of the input sensing layer ISP according to an embodiment of the inventive concept, which corresponds to region I-I' of FIG. 5A. FIG. 5B schematically illustrates a cross section of the thin film encapsulation layer TFE and the input sensing layer ISP. FIG. 5C schematically illustrates a cross section of the display panel DP and the input sensing layer ISP.

Referring to FIG. 5A, the input sensing layer ISP may be disposed on the display panel DP (see FIG. 3) described above. The input sensing layer ISP may be formed directly on a base surface provided by the display panel DP (see FIG. 3). In an embodiment, the input sensing layer ISP may be driven by a mutual capacitance method. However, it may also be driven by a self-capacitance method without being limited to the mutual capacitance approach.

The input sensing layer ISP may include a first sensing insulating layer TIL1, first sensing electrodes SE1, second sensing electrodes SE2, first sensing lines TXL, second sensing lines RXL, second pads PD2, and third pads PD3.

The first sensing insulating layer TIL1 may provide a base surface on which the electrodes and lines of the input sensing layer ISP are disposed. In an embodiment, the first sensing insulating layer TIL1 may be directly disposed on the thin film encapsulation layer TFE (see FIGS. 4A to 4D) of the display panel DP (see FIGS. 4A to 4D). However, embodiments are not limited thereto. For example, according to embodiments, the electrodes and lines of the input sensing layer ISP may be directly disposed on the thin film encapsulation layer TFE (see FIGS. 4A to 4D).

The first sensing insulating layer TIL1 may include an active region AA and a peripheral region NAA. The active region AA may overlap the display region DA (see FIG. 3), and the peripheral region NAA may overlap the non-display region NDA (see FIG. 3).

Each of the first sensing electrodes SE1 may extend in the first direction DR1, and the first sensing electrodes SE1 may be arranged in the second direction DR2. FIG. 5A illustrates four first sensing electrodes SE1 as an example, but the number of the first sensing electrodes SE1 included in the input sensing layer ISP is not limited thereto. Each of the first sensing electrodes SE1 may include first sensing portions SP1 and connection patterns CP configured to connect the first sensing portions SP1 to each other.

The first sensing portions SP1 may be arranged along the first direction DR1. Each of the connection patterns CP may be disposed between adjacent first sensing portions SP1 in the first direction DR1 to electrically connect the first sensing portions SP1 to each other. Each of the connection patterns CP may extend in the first direction DR1. The connection patterns CP may overlap the first sensing portions SP1 adjacent thereto in the first direction DR1 on a plane. However, the shape of the connection patterns CP is not limited to any one shape as long as it can electrically connect adjacent first sensing portions SP1 to each other.

The connection patterns CP may be disposed on a layer different from that of the first sensing portions SP1. The connection patterns CP may be connected to corresponding first sensing portions SP1 through contact holes T-CH. The contact holes T-CH may be formed by passing through an insulating layer disposed between the connection patterns CP and the first sensing portions SP1.

Each of the second sensing electrodes SE2 may extend in the second direction DR2, and the second sensing electrodes SE2 may be arranged in the first direction DR1. FIG. 5A illustrates five second sensing electrodes SE2 as an example, but the number of the second sensing electrodes SE2 included in the input sensing layer ISP is not limited thereto. Each of the second sensing electrodes SE2 may include second sensing portions SP2 and extension patterns EP connecting the second sensing portions SP2 to each other.

The second sensing portions SP2 may be arranged along the second direction DR2. Each of the extension patterns EP may be disposed between adjacent second sensing portions SP2 in the second direction DR2 and electrically connect the second sensing portions SP2 to each other.

Each of the extension patterns EP may extend in the second direction DR2. The extension patterns EP may be insulated from the connection patterns CP and may cross the connection patterns CP on a plane. The extension patterns EP may extend from corresponding second sensing portions SP2. That is, the extension patterns EP may have an integral shape with the second sensing portions SP2 on a same layer.

The first sensing electrodes SE1 and the second sensing electrodes SE2 may be electrically insulated from each other and may cross each other on a plane. The input sensing layer ISP may sense an external input through a change in capacitance between the first sensing electrodes SE1 and the second sensing electrodes SE2. The first sensing electrodes SE1 and the second sensing electrodes SE2 may be disposed in the active region AA overlapping the display region DA (see FIG. 3). Accordingly, the display device DD (see FIG. 1) may display an image through the display region DA (see FIG. 1) and simultaneously sense an external input applied to the display region DA (see FIG. 1).

The first sensing lines TXL may be disposed in the peripheral region NAA and respectively electrically connected to the first sensing electrodes SE1. For example, the first sensing lines TXL may be respectively electrically connected to the lower ends of the first sensing electrodes SE1. The first sensing lines TXL may be adjacent to the lower portion of the peripheral region NAA on a plane. The first sensing lines TXL may respectively extend from the lower ends of the first sensing electrodes SE1 toward the second pads PD2.

The first sensing lines TXL may be respectively electrically connected to the second pads PD2. The first sensing lines TXL may be disposed on a layer different from that of the second pads PD2 and connected thereto through a contact hole, or may have an integral shape with the second pads PD2.

The second sensing lines RXL may be disposed in the peripheral region NAA and respectively electrically connected to the second sensing electrodes SE2. For example, the second sensing lines RXL may be respectively electrically connected to the right ends of the second sensing electrodes SE2. The second sensing lines RXL may be adjacent to the right side of the peripheral region NAA on a plane. However, embodiments of the inventive concept are not limited thereto, and the second sensing lines RXL may be adjacent to the left side of the peripheral region NAA, or the second sensing lines RXL may be dividedly adjacent to the left and right sides of the peripheral region NAA. The second sensing lines RXL may respectively extend from the right ends of the second sensing electrodes SE2 toward the third pads PD3.

The second sensing lines RXL may be respectively electrically connected to the third pads PD3. The second sensing lines RXL may be disposed on a layer different from that of the third pads PD3 and connected thereto through a contact hole, or may have an integral shape with the third pads PD3.

A touch controller that controls the input sensing layer ISP may be electrically connected to the second pads PD2 and the third pads PD3 through a circuit board. The second pads PD2 and the third pads PD3 may be arranged along the second direction DR2. The second pads PD2 may be adjacent to the left lower end of the peripheral region NAA on a plane, and the third pads PD3 may be adjacent to the right lower end of the peripheral region NAA on a plane.

The first pads PD1 of the display panel DP (see FIG. 3) may be disposed between the second pads PD2 and the third pads PD3. The second pads PD2 and the third pads PD3 may be substantially disposed on the same layer as the first pads PD1. Without being limited thereto, however, the second pads PD2 and the third pads PD3 may be disposed on a layer different from that of the first pads PD1 according to embodiments. The arrangement of the pads PD1, PD2, and PD3 illustrated in FIGS. 3 and 5A is an example, and embodiments of the inventive concept are not limited thereto.

Referring to FIGS. 5A to 5D, the input sensing layer ISP according to an embodiment may include a plurality of conductive layers MTL1 and MTL2 and a plurality of sensing insulating layers TIL1, TIL2, and TIL3. The sensing insulating layers TIL1, TIL2, and TIL3 may include a first sensing insulating layer TIL1 (or a first insulating layer), a second sensing insulating layer TIL2 (or a second insulating layer), and a third sensing insulating layer TIL3 (or a third insulating layer). However, this is illustrated as an example, and the number of the insulating layers constituting the sensing insulating layers TIL1, TIL2, and TIL3 is not limited thereto.

The first sensing insulating layer TIL1 may be directly disposed on the thin film encapsulation layer TFE. The first sensing insulating layer TIL1 may be directly disposed on the third thin film EN3 of the thin film encapsulation layer TFE. In an embodiment, the first sensing insulating layer TIL1 may be an inorganic layer including at least any one of, for example, silicon nitride, silicon oxynitride, or silicon oxide. In an embodiment, the first sensing insulating layer TIL1 may be an organic layer including, for example, an epoxy resin, an acrylic resin, or an imide-based resin. The first sensing insulating layer TIL1 may have a single-layered structure or a multi-layered structure in which layers are stacked along the third direction DR3.

The conductive layers MTL1 and MTL2 may include a first conductive layer MTL1 and a second conductive layer MTL2. The first conductive layer MTL1 may be disposed on the first sensing insulating layer TIL1 and covered by the second sensing insulating layer TIL2, and the second conductive layer MTL2 may be disposed on the second sensing insulating layer TIL2 and covered by the third sensing insulating layer TIL3. A portion of the second conductive layer MTL2 may be connected to the first conductive layer MTL1 through a contact hole formed in the second sensing insulating layer TIL2. Each of the conductive layers MTL1 and MTL2 may have a single-layered structure or a multi-layered structure in which layers are stacked along the third direction DR3.

A single-layered conductive layer may include a metal layer or a transparent conductive layer. The metal layer may include, for example, molybdenum, silver, titanium, copper, aluminum, or an alloy thereof. The transparent conductive layer may include, for example, transparent conductive oxide such as indium tin oxide (ITO), indium zinc oxide (IZO), zinc oxide (ZnO), or indium zinc tin oxide (IZTO). The transparent conductive layer may include a conductive polymer such as, for example, PEDOT, metal nanowire, graphene, and the like.

A multi-layered conductive layer may include metal layers. The metal layers may have, for example, a three-layer structure of titanium/aluminum/titanium. The multi-layered conductive layer may include at least one metal layer and at least one transparent conductive layer.

Each of the first conductive layer MTL1 and the second conductive layer MTL2 may include transparent conductive oxide and have a metal mesh shape formed of an opaque conductive material. The first conductive layer MTL1 and the second conductive layer MTL2 may have various materials and various shapes, and as long as the visibility of an image displayed by light generated by the display element layer OL is not reduced, the inventive concept is not limited to any one embodiment.

Components included in the first sensing electrodes SE1 and the second sensing electrodes SE2 may be included in any one of the first conductive layer MTL1 and the second conductive layer MTL2.

According to an embodiment, as illustrated in FIG. 5D, the second sensing portions SP2 and the extension patterns EP of the second sensing electrodes SE2 and the first sensing portions SP1 of the first sensing electrodes SE1 may be disposed on the same layer as each other, and the connection patterns CP of the first sensing electrodes SE1 may be disposed on a layer different from that of the second sensing portions SP2 and the extension patterns EP of the second sensing electrodes SE2 and the first sensing portions SP1 of the first sensing electrodes SE1. In an embodiment, the second sensing electrodes SE2 and the first sensing portions SP1 may be included in the second conductive layer MTL2, and the connection patterns CP may be included in the first conductive layer MTL1. The connection patterns CP may be connected to the first sensing portions SP1 through the contact holes T-CH formed in the second sensing insulating layer TIL2.

The first sensing lines TXL and the second sensing lines RXL may be included in at least any one of the first conductive layer MTL1 or the second conductive layer MTL2. For example, the first sensing lines TXL and the second sensing lines RXL may be provided as one layer included in only one of the first conductive layer MTL1 and the second conductive layer MTL2, or may be provided as two layers included in both the first conductive layer MTL1 and the second conductive layer MTL2, and the inventive concept is not limited to any one embodiment.

At least any one of the second sensing insulating layer TIL2 or the third sensing insulating layer TIL3 may include an inorganic film. The inorganic film may include at least any one of, for example, aluminum oxide, titanium oxide, silicon oxide, silicon nitride, silicon oxynitride, zirconium oxide, or hafnium oxide.

In an embodiment, at least one of the second sensing insulating layer TIL2 or the third sensing insulating layer TIL3 may include an organic film. The organic film may include at least any one of, for example, an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Figure 6:
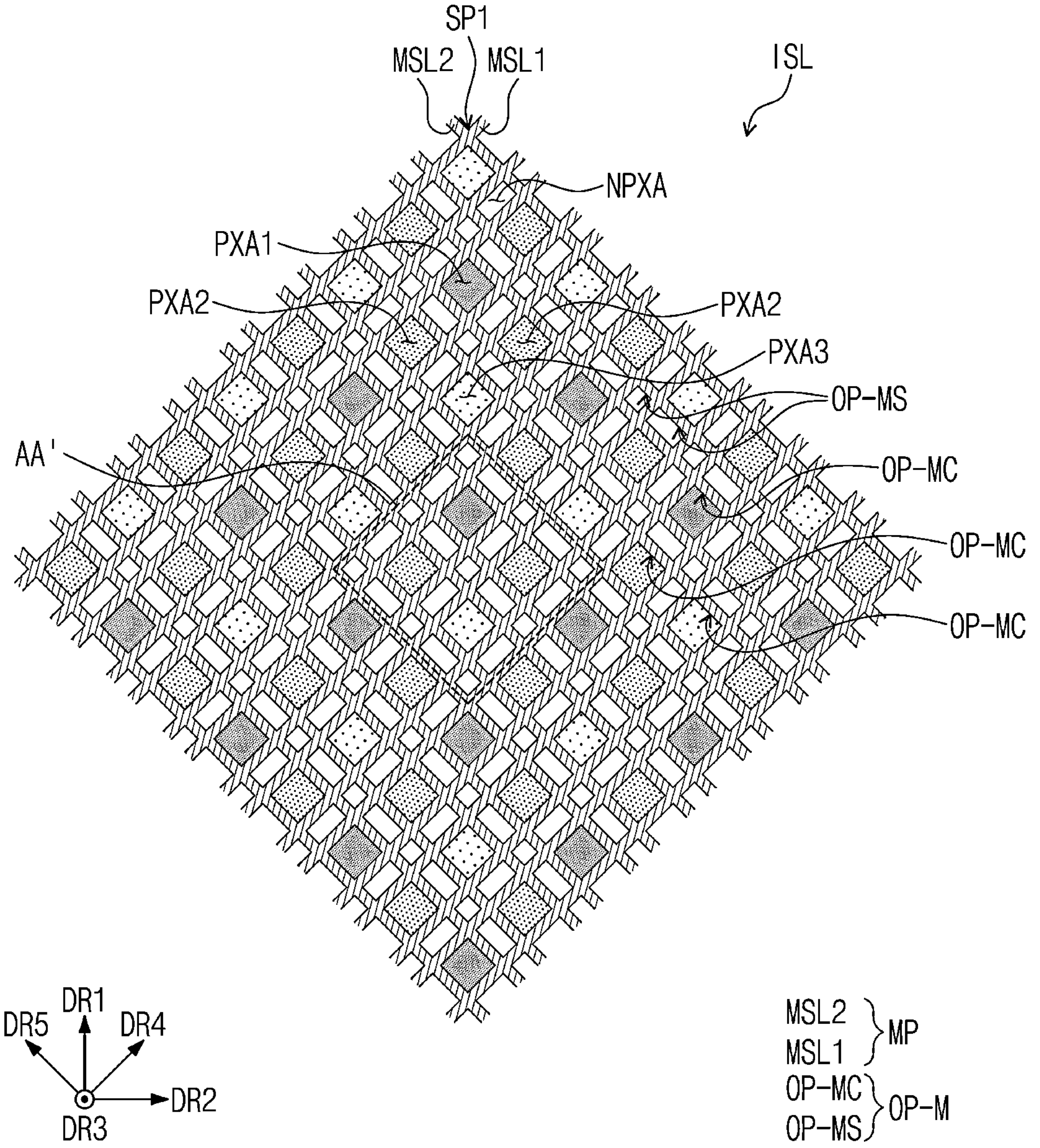
FIG. 6 is an enlarged plan view of a portion of an input sensing layer according to an embodiment of the inventive concept.

FIG. 6 is an enlarged plan view of a portion of the input sensing layer ISP according to an embodiment of the inventive concept. FIG. 6 exemplarily illustrates a portion of the first sensing portion SP1 of the input sensing layer ISP. The description of the first sensing portion SP1 provided below may also be applied to the second sensing portion SP2 (see FIG. 5A).

Referring to FIGS. 4A and 6, the display device DD (see FIG. 1) may include pixel regions PXA1, PXA2, and PXA3 and a non-pixel region NPXA adjacent thereto. In this specification, the pixel regions PXA1, PXA2, and PXA3 may be defined as regions in which light provided from the light-emitting elements is emitted to the outside of the display device DD (see FIG. 1) and viewed by a user when the display device DD (see FIG. 1) is operated. The non-pixel region NPXA may be defined as a region excluding the pixel regions PXA1, PXA2, and PXA3 among the display region DA (see FIG. 1).

The pixel regions PXA1, PXA2, and PXA3 may be disposed in a one-to-one correspondence with the light-emitting regions LA1, LA2, and LA3, and each of the pixel regions PXA1, PXA2, and PXA3 may be defined as at least a partial region of a corresponding light-emitting region LA1, LA2, or LA3. According to an embodiment of the inventive concept, the pixel regions PXA1, PXA2, and PXA3 may be defined to correspond to portions of the light-emitting regions LA1, LA2, and LA3, or the pixel regions PXA1, PXA2, and PXA3 may be defined to correspond to the same regions as the light-emitting regions LA1, LA2, and LA3.

In an embodiment, the pixel regions PXA1, PXA2, and PXA3 may include first to third pixel regions PXA1, PXA2, and PXA3 according to light-emitting colors. The first to third pixel regions PXA1, PXA2, and PXA3 may be respectively disposed to correspond to the first to third light-emitting regions LA1, LA2, and LA3. Each of the first to third pixel regions PXA1, PXA2, and PXA3 may be provided in plurality and disposed in a predetermined arrangement on a plane. The arrangement of the first to third pixel regions PXA1, PXA2, and PXA3 may substantially correspond to the arrangement of the first to third light-emitting regions LA1, LA2, and LA3. The description of the arrangement of the first to third light-emitting regions LA1, LA2, and LA3 given above with reference to FIG. 4A may be equally applied to the arrangement of the first to third pixel regions PXA1, PXA2, and PXA3 according to an embodiment with reference to FIG. 6.

The first sensing portion SP1 may include a mesh pattern MP. The mesh pattern MP may include a conductive material. The mesh pattern MP may include mesh lines MSL1 and MSL2. The mesh lines MSL1 and MSL2 may include first mesh lines MSL1 and second mesh lines MSL2. The first mesh lines MSL1 and the second mesh lines MSL2 may be connected to each other and have an integral shape.

Each of the first mesh lines MSL1 may extend along the first diagonal direction DR4, and the first mesh lines MSL1 may be arranged along the second diagonal direction DR5. Each of the second mesh lines MSL2 may extend along the second diagonal direction DR5, and the second mesh lines MSL2 may be arranged along the first diagonal direction DR4. The second mesh lines MSL2 may cross the first mesh lines MSL1 on a plane and have an integral shape therewith.

The first and second mesh lines MSL1 and MSL2 may define openings OP-M. The openings OP-M may be defined as being surrounded by the first and second mesh lines MSL1 and MSL2.

The openings OP-M may include central openings OP-MC and peripheral openings OP-MS. The central openings OP-MC may be defined as openings including a portion overlapping at least one of the pixel region PXA1, PXA2, and PXA3 among the openings OP-M. The peripheral openings OP-MS may be defined as the remaining openings excluding the central openings OP-MC among the openings OP-M. In an embodiment, the peripheral openings OP-MS do not overlap the pixel regions PXA1, PXA2, and PXA3 and overlap the non-pixel region NPXA.

The shape of the openings OP-M, the arrangement of the openings OP-M, and the arrangement relationship between the openings OP-M and the pixel regions PXA1, PXA2, and PXA3 may vary depending on an embodiment of the inventive concept. A detailed description of the openings OP-M according to an embodiment of the inventive concept will be provided below.

Figure 7A:
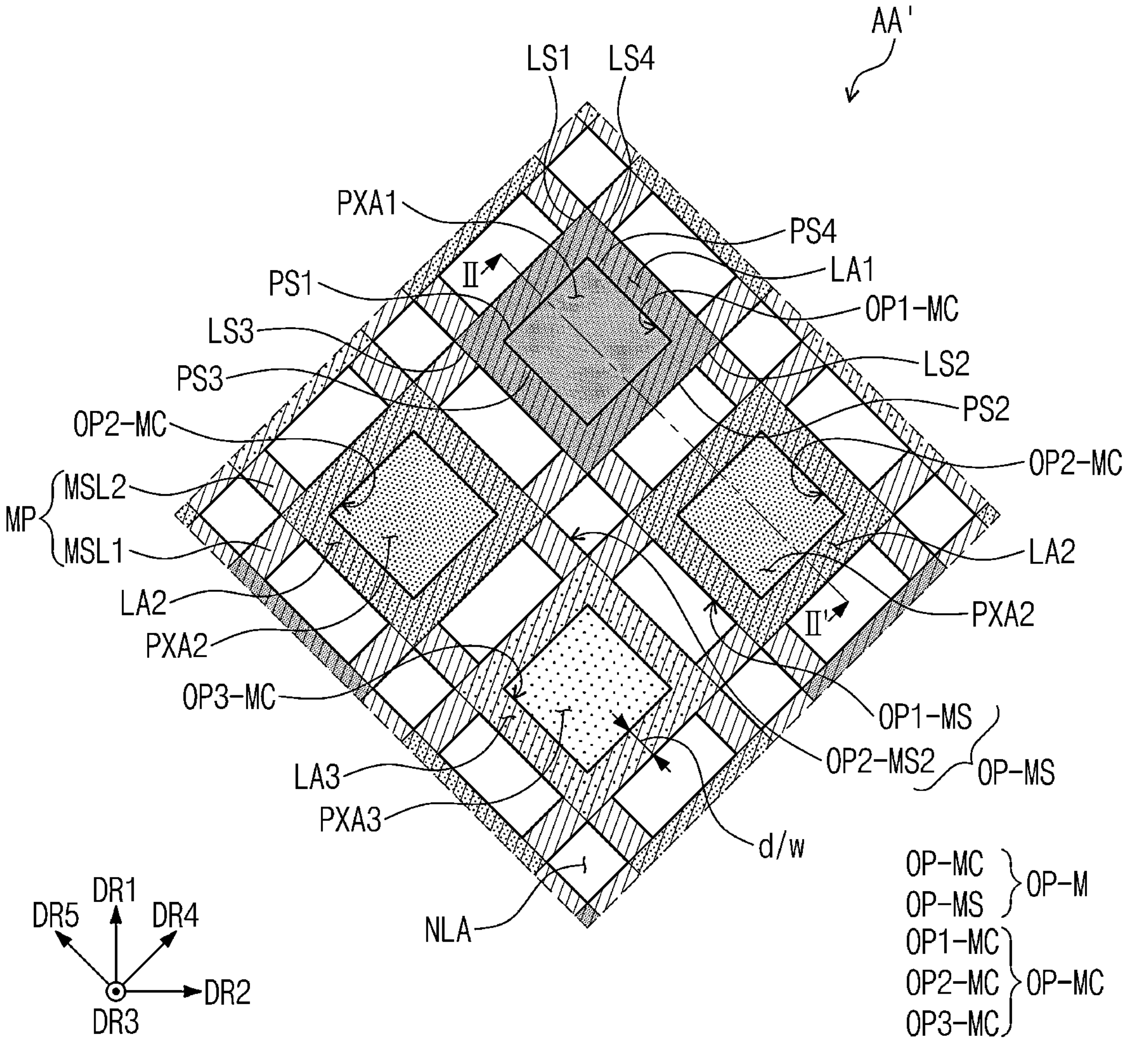
FIG. 7A is an enlarged plan view of a mesh pattern corresponding to region AA' of FIG. 6.
Figure 7B:
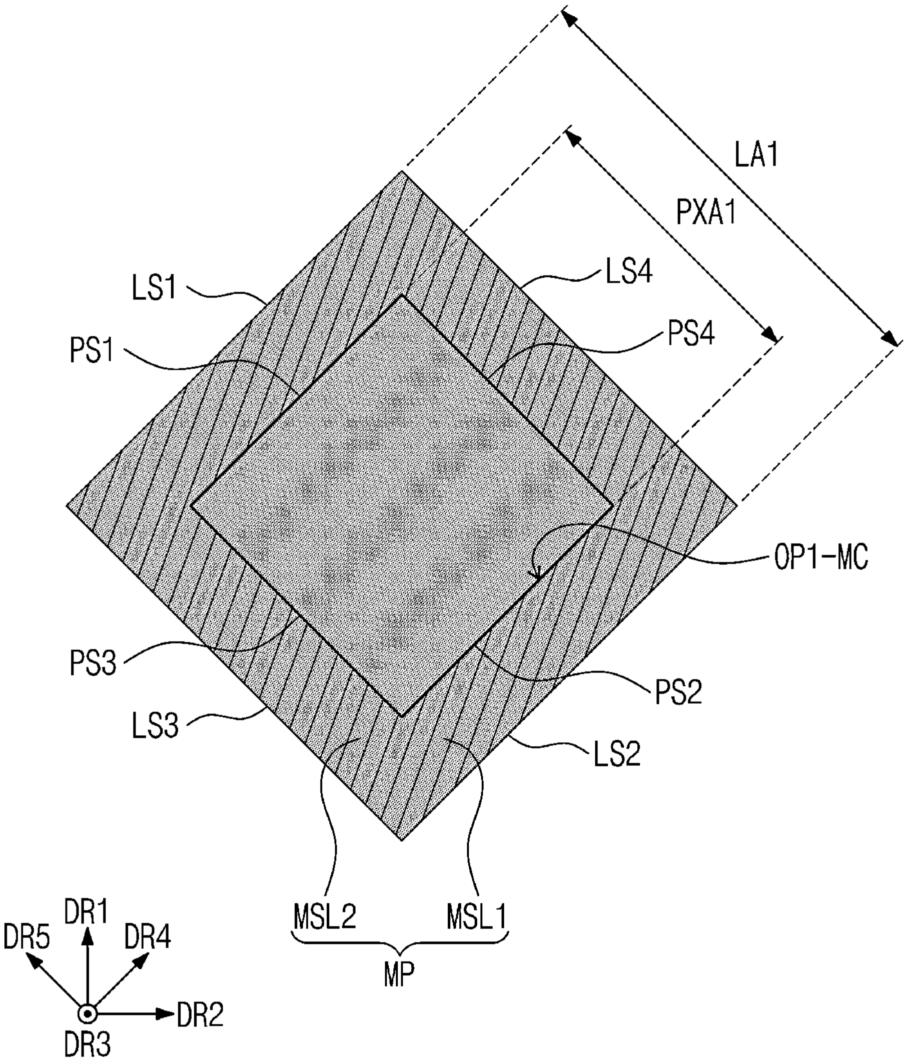
FIG. 7B illustrates one light-emitting region and a pixel region corresponding to each other according to an embodiment of the inventive concept.
Figure 7C:
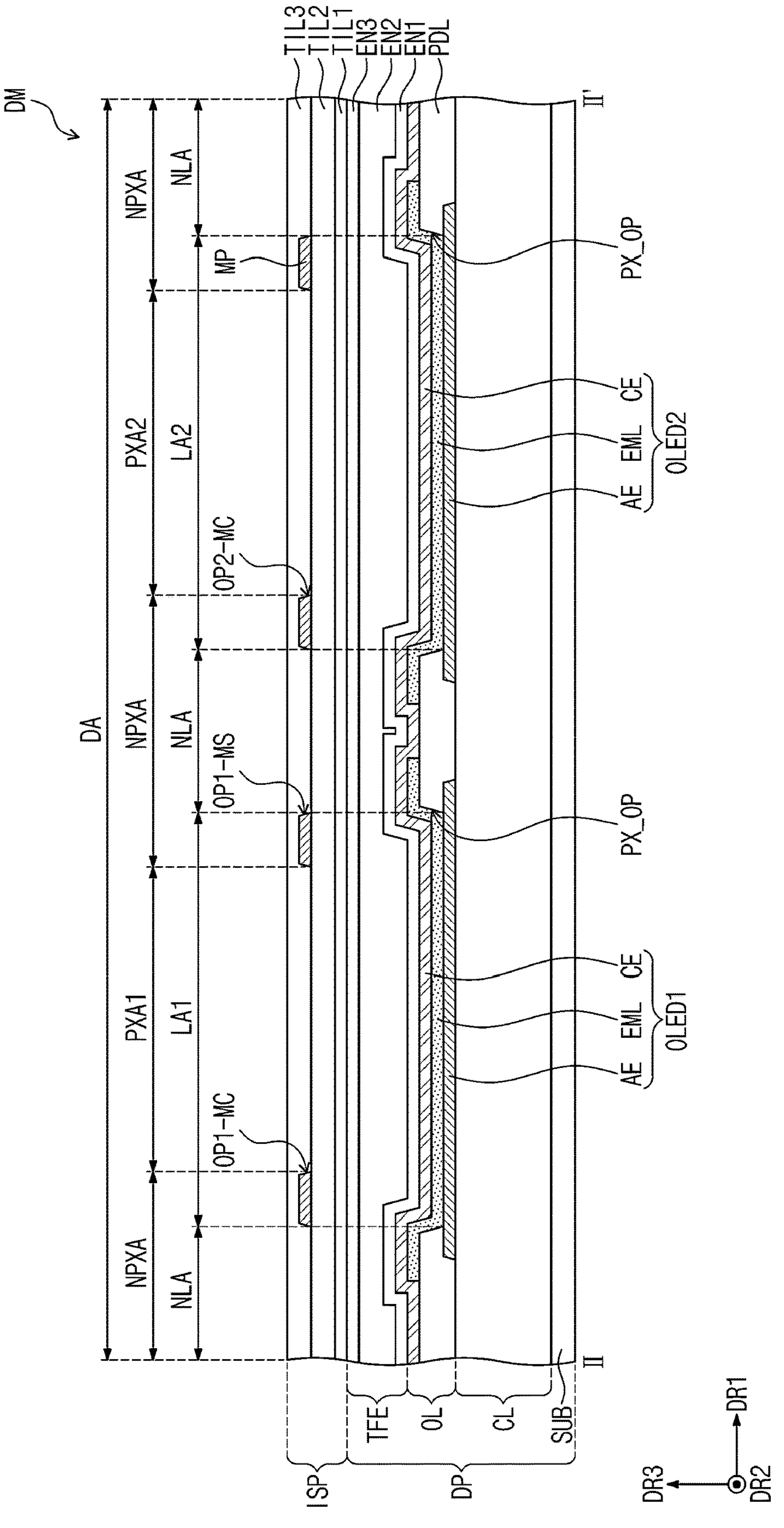
FIG. 7C is a cross-sectional view of the display module according to an embodiment of the inventive concept, which corresponds to region II-II' of FIG. 7A.
Figure 7D:
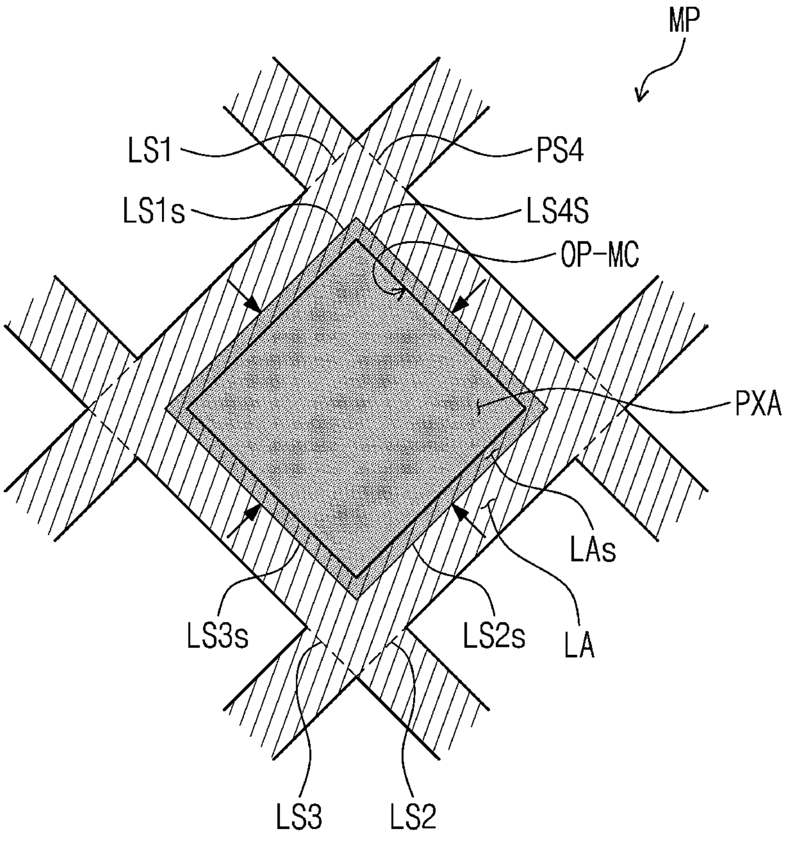
FIG. 7D is an enlarged plan view of a mesh pattern illustrating a state in which pixel shrinkage has occurred.

FIG. 7A is an enlarged plan view of the mesh pattern MP corresponding to region AA' of FIG. 6. FIG. 7B illustrates one light-emitting region and a pixel region which correspond to each other according to an embodiment of the inventive concept. FIG. 7C is a cross-sectional view of the display module DM according to an embodiment of the inventive concept, which corresponds to region II-II' of FIG. 7A. FIG. 7D is an enlarged plan view of the mesh pattern MP illustrating a state in which pixel shrinkage has occurred.

FIG. 7A is an enlarged view of a region corresponding to one unit light-emitting region UA0 (see FIG. 4A). FIG. 7B representatively illustrates the first light-emitting region LA1 among the first to third light-emitting regions LA1, LA2, and LA3 and the first pixel region PXA1 among the first to third pixel regions PXA1, PXA2, and PXA3. Referring to FIG. 6 and FIGS. 7A to 7C together, a portion of the mesh pattern MP according to an embodiment may overlap a portion of each of the light-emitting regions LA1, LA2, and LA3 on a plane. The mesh pattern MP may cover a portion of each of the light-emitting regions LA1, LA2, and LA3 on a plane. The mesh pattern MP may cover an outer side portion of each of the light-emitting regions LA1, LA2, and LA3 on a plane.

For example, each of the light-emitting regions LA1, LA2, and LA3 may include outer sides, and the mesh pattern MP may cover at least a portion of the outer side portion including the outer sides. The outer sides of each of the light-emitting regions LA1, LA2, and LA3 may include first to fourth sides LS1, LS2, LS3, and LS4. Each of the first and second sides LS1 and LS2 may extend in the first diagonal direction DR4 and may be spaced apart from each other in the second diagonal direction DR5. Each of the third and fourth sides LS3 and LS4 may extend in the second diagonal direction DR5 and may be spaced apart from each other in the first diagonal direction DR4. The mesh pattern MP may at least partially cover the first to fourth sides LS1, LS2, LS3, and LS4. In this specification, the expression "the mesh pattern covers the outer sides of the light-emitting region" or "the outer sides of the light-emitting region are covered by the mesh pattern" means that as the outer sides of the light-emitting region overlap the mesh pattern on a plane, the outer sides of the light-emitting region are covered by the mesh pattern when viewed on a plane.

In an embodiment, the mesh pattern MP may cover all of the first to fourth sides LS1, LS2, LS3, and LS4 of each of the light-emitting regions LA1, LA2, and LA3. That is, the mesh pattern MP may include portions extending along the four outer sides of each of the light-emitting regions LA1, LA2, and LA3.

Each of the central openings OP-MC may be defined by portions of the mesh pattern MP extending along the four outer sides of a corresponding light-emitting region LA1, LA2, or LA3. Accordingly, each of the central openings OP-MC may overlap a corresponding light-emitting region LA1, LA2, or LA3. Each of the central openings OP-MC may be disposed within a corresponding light-emitting region LA1, LA2, or LA3 on a plane.

The central openings OP-MC may include first to third central openings OP1-MC, OP2-MC, and OP3-MC. The first central opening OP1-MC may overlap the first light-emitting region LA1, the second central opening OP2-MC may overlap the second light-emitting region LA2, and the third central opening OP3-MC may overlap the third light-emitting region LA3.

In an embodiment, the pixel regions PXA1, PXA2, and PXA3 may be defined by the central openings OP-MC of the mesh pattern MP. Each of the pixel regions PXA1, PXA2, and PXA3 may correspond to a region exposed by a corresponding central opening OP-MC among a corresponding light-emitting region LA1, LA2, or LA3. That is, on a plane, each of the pixel regions PXA1, PXA2, and PXA3 may correspond to a region overlapping the central opening OP-MC among a corresponding light-emitting region LA1, LA2, or LA3. The first pixel region PXA1 may correspond to a region exposed by the first central opening OP1-MC in the first light-emitting region LA1, the second pixel region PXA2 may correspond to a region exposed by the second central opening OP2-MC in the second light-emitting region LA2, and the third pixel region PXA3 may correspond to a region exposed by the third central opening OP3-MC in the third light-emitting region LA3.

As illustrated in FIGS. 7A and 7B, on a plane, the outer sides of each of the pixel regions PXA1, PXA2, and PXA3 may include first to fourth sides PS1, PS2, PS3, and PS4.

Each of the first and second sides PS1 and PS2 may extend in the first diagonal direction DR4 and may be spaced apart from each other in the second diagonal direction DR5. Each of the third and fourth sides PS3 and PS4 may extend in the second diagonal direction DR5 and may be spaced apart from each other in the first diagonal direction DR4. In an embodiment, the first to fourth sides PS1, PS2, PS3, and PS4 of each of the pixel regions PXA1, PXA2, and PXA3 may be defined by one side of each of the mesh lines MSL1 and MSL2. The first and second sides PS1 and PS2 of each of the pixel regions PXA1, PXA2, and PXA3 may be defined by the first mesh lines MSL1 facing each other. The third and fourth sides PS3 and PS4 of each of the pixel regions PXA1, PXA2, and PXA3 may be defined by the second mesh lines MSL2 facing each other.

FIG. 7C exemplarily illustrates a cross section of light-emitting elements OLED1 and OLED2 configured to respectively provide light to the first and second light-emitting regions LA1 and LA2, and the mesh pattern MP disposed thereon. As illustrated in FIG. 7C, a portion of the mesh pattern MP may be disposed above the first electrodes AE exposed by the light-emitting openings PX_OP of the pixel defining film PDL. That is, a portion of the mesh pattern MP may overlap an outer side portion of each of the first electrodes AE exposed by the light-emitting openings PX_OP. Each of the central openings OP-MC may overlap the light-emitting opening PX_OP defining a corresponding light-emitting region LA1 or LA2. Light provided from the light-emitting elements OLED1 and OLED2 and passing through a region exposed by the central opening OP-MC may be emitted to the outside of the display device DD (see FIG. 1) and viewed by a user. Each of the pixel regions PXA1 and PXA2 may correspond to an opening region in a corresponding central opening OP-MC.

In an embodiment, the peripheral openings OP-MS may include first peripheral openings OP1-MS and second peripheral openings OP2-MS. Each of the peripheral openings OP-MS may entirely overlap the non-light-emitting region NLA. Each of the peripheral openings OP-MS may entirely overlap the pixel defining film PDL.

The first peripheral openings OP1-MS may extend along the outer side of an adjacent central opening OP-MC (or the outer side of the mesh pattern MP defining the central opening OP-MC). Some of the first peripheral openings OP1-MS may extend along the first diagonal direction DR4, and other first peripheral openings OP1-MS may extend along the second diagonal direction DR5. In an embodiment, the central openings OP-MC and the first peripheral openings OP1-MS may be alternately arranged in each of the first diagonal direction DR4 and the second diagonal direction DR5.

In an embodiment, the second peripheral openings OP2-MS do not include a portion extending along the outer side of the central opening OP-MC as they are adjacent to the outer side of the central opening OP-MC. The second peripheral openings OP2-MS may be spaced apart from an adjacent central opening OP-MC in the first direction DR1 or the second direction DR2. The second peripheral openings OP2-MS may be disposed between adjacent central openings OP-MC in the first direction DR1 or between adjacent central openings OP-MC in the second direction DR2. In an embodiment, the second peripheral openings OP2-MS may be alternately arranged in the first diagonal direction DR4 with the first peripheral openings OP1-MS extending along the first diagonal direction DR4. In an embodiment, the second peripheral openings OP2-MS may be alternately arranged in the second diagonal direction DR5 with the first peripheral openings OP1-MS extending along the second diagonal direction DR5.

The peripheral openings OP-MS may be arranged to surround each of the central openings OP-MC. One central opening OP-MC may be surrounded by four first peripheral openings OP1-MS and four second peripheral openings OP2-MS.

Two second mesh lines MSL2 may be repeatedly disposed between adjacent pixel regions PXA1, PXA2, and PXA3 in the first diagonal direction DR4. Two first mesh lines MSL1 may be repeatedly disposed between adjacent pixel regions PXA1, PXA2, and PXA3 in the second diagonal direction DR5.

In an embodiment, one side of the mesh lines MSL1 and MLS2 defining the peripheral openings OP-MS may include a portion substantially aligned with the outer sides of the light-emitting regions LA1, LA2, and LA3. On a plane, a separation distance d from the outer sides of the light-emitting regions LA1, LA2, and LA3 to an adjacent central opening OP-MC may be substantially equal to a width w of the first mesh line MSL1 or the second mesh line MSL2. In other words, on a plane, the separation distance d from the outer sides of the light-emitting regions LA1, LA2, and LA3 to a corresponding pixel region PXA1, PXA2, and PXA3 may be substantially equal to the width w of the first mesh line MSL1 or the second mesh line MSL2.

Referring to FIG. 7D, as the usage time of the display device DD (see FIG. 1) elapses, a pixel shrinkage phenomenon may occur. Pixel shrinkage is a phenomenon in which a region (e.g., a light-emitting region) that can normally emit light is reduced since moisture or unnecessary gas penetrates into the light-emitting element. FIG. 7D exemplarily illustrates that the area of one light-emitting region LA has been reduced compared to an initial time since a pixel shrinkage phenomenon has occurred in the light-emitting element OLED (see FIG. 4D) disposed to correspond to the one light-emitting region LA. The one light-emitting region LA may correspond to any one of the first to third light-emitting regions LA1, LA2, and LA3 of FIG. 7A, and is hereinafter referred to as a light-emitting region LA. The outer sides LS1, LS2, LS3, and LS4 of an initial light-emitting region LA are illustrated as dotted lines, and outer sides LS1*s*, LS2*s*, LS3*s*, and LS4*s* of a light-emitting region LAs to which a pixel shrinkage phenomenon has occurred are illustrated as solid lines.

Although a pixel shrinkage phenomenon may occur and the outer sides LS1*s*, LS2*s*, LS3*s*, and LS4*s* of the reduced light-emitting regions LAs are moved inward, the outer sides LS1*s*, LS2*s*, LS3*s*, and LS4*s* of the reduced light-emitting regions LAs may be covered by the mesh pattern MP on a plane. As a corresponding pixel region PXA is defined by one side of each of the mesh lines MSL1 and MSL2, the area of the pixel region PXA may not be changed within a range in which the outer sides LS1*s*, LS2*s*, LS3*s*, and LS4*s* of the reduced light-emitting region LAs are not exposed from the mesh pattern MP. Accordingly, it is possible to prevent or suppress front luminance reduction due to a pixel shrinkage phenomenon. On the other hand, when the pixel region PXA is defined to be the same as the light-emitting region LA, the pixel region PXA is shrunk together in response to the extent to which the light-emitting region LA is shrunk due to a pixel shrinkage phenomenon, and the luminance may be reduced as much as the light-emitting region LA is shrunk.

The ratio of the area of the light-emitting region LA covered by the mesh pattern MP to the total area of the light-emitting region LA may be designed according to a result of predicting the area of the light-emitting region LA that is shrunk when pixel shrinkage occurs. According to an embodiment of the inventive concept, the first to third light-emitting regions LA1, LA2, and LA3 (see FIG. 7A) may vary in the extent to which their areas are reduced due to a pixel shrinkage phenomenon, and the ratios of the areas of the first to third light-emitting regions LA1, LA2, and LA3 (see FIG. 7A) covered by the mesh pattern MP to the total area thereof may be designed differently from each other. In this case, the separation distances d (see FIG. 7A) from the outer side of the light-emitting region LA to an adjacent central opening OP-MC with respect to the first to third light-emitting regions LA1, LA2, and LA3 (see FIG. 7A) may be set differently from each other. According to an embodiment of the inventive concept, the widths w (see FIG. 7A) of the mesh lines MSL1 and MSL2 may be set differently from each other in portions covering the first to third light-emitting regions LA1, LA2, and LA3 (see FIG. 7A).

Figure 8:
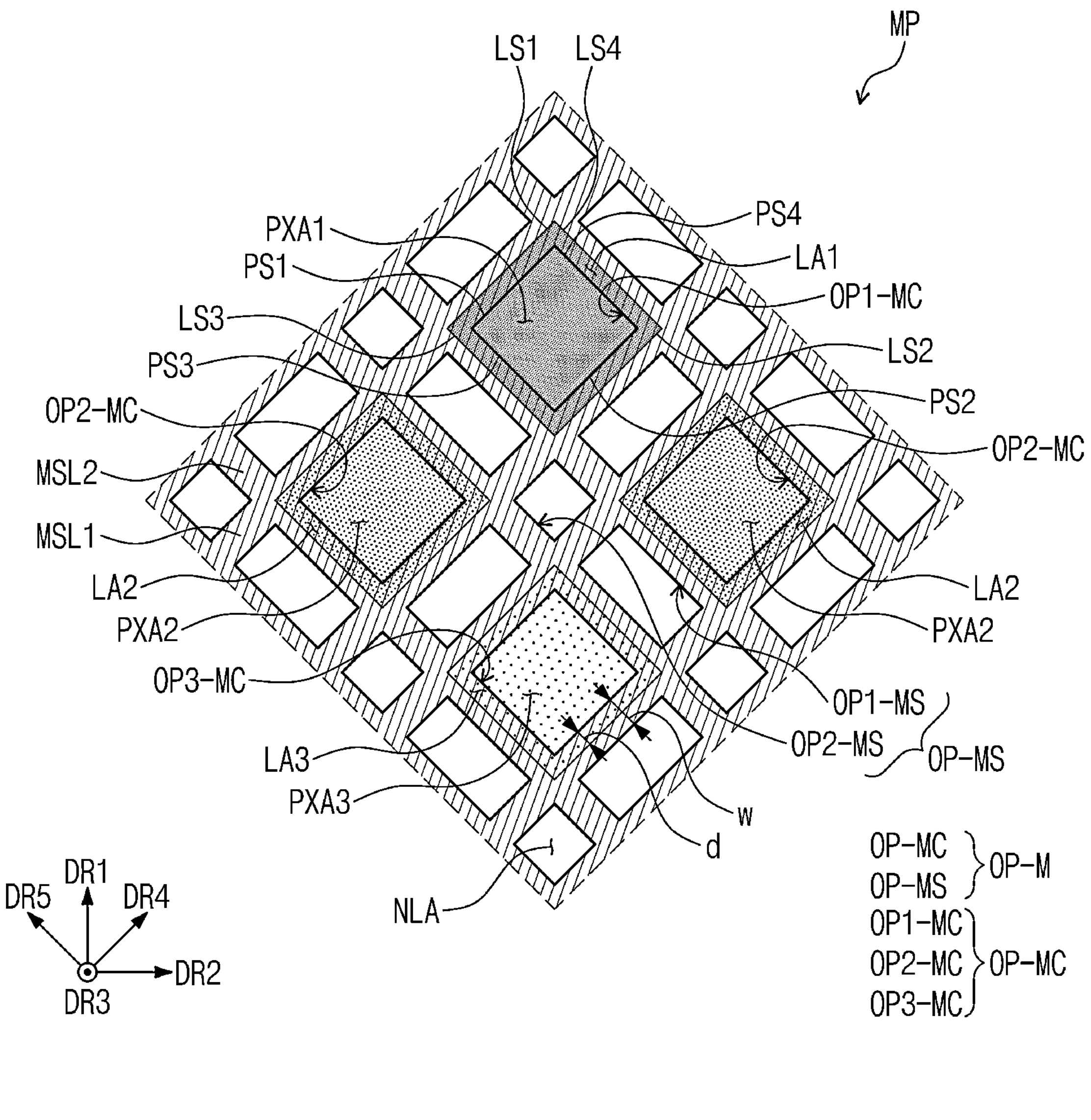
FIG. 8 is an enlarged plan view of a mesh pattern according to an embodiment of the inventive concept.

FIG. 8 is an enlarged plan view of the mesh pattern MP according to an embodiment of the inventive concept. FIG. 8 is an enlarged view of a region corresponding to one unit light-emitting region UA0 (see FIG. 4A). For convenience of explanation, the light-emitting regions LA1, LA2, and LA3 are illustrated together. The same/similar reference numerals are used for the same/similar components as those described with reference to FIGS. 6 to 7C, and duplicate descriptions are omitted.

Referring to FIG. 8, in an embodiment, the first to fourth sides LS1, LS2, LS3, and LS4 of each of the light-emitting regions LA1, LA2, and LA3 may be spaced apart from one side of the mesh lines MSL1 and MSL2 on a plane without any portion substantially aligning with the one side thereof. On a plane, the separation distance d from the outer side of the light-emitting region LA1, LA2, or LA3 to an adjacent central opening OP-MC may be smaller than the width w of the first mesh line MSL1 or the second mesh line MSL2. On a plane, the separation distance d from the outer side of the light-emitting region LA1, LA2, or LA3 to a corresponding pixel region PXA1, PXA2, or PXA3 may be smaller than the width w of the first mesh line MSL1 or the second mesh line MSL2.

Figure 9:
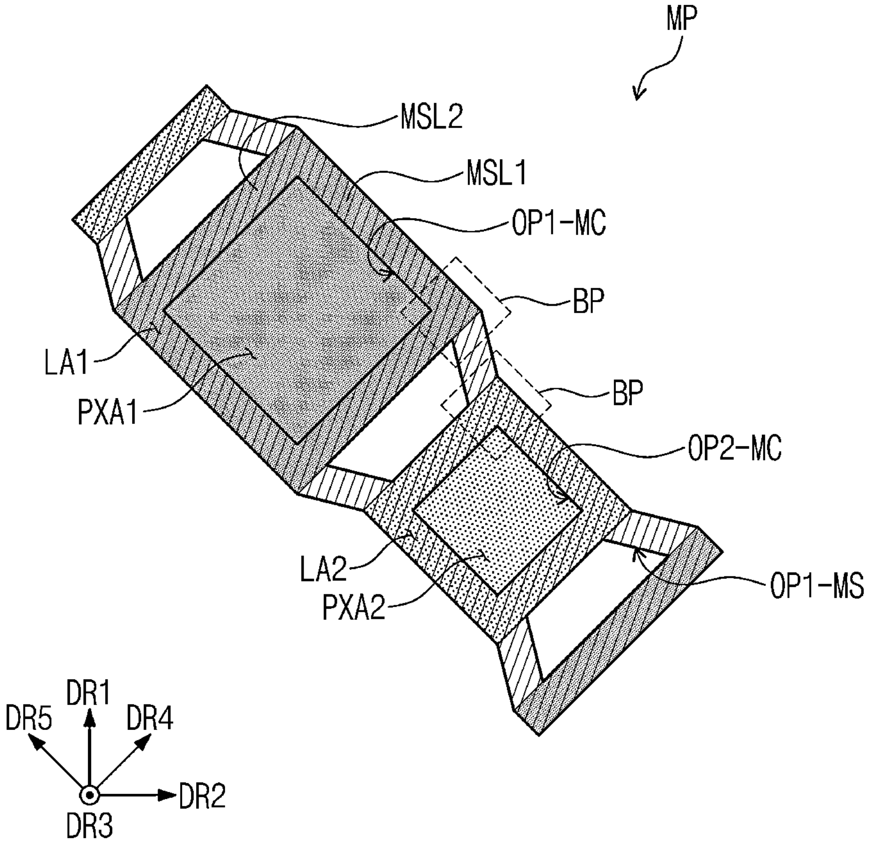
FIG. 9 is an enlarged plan view of a mesh pattern according to an embodiment of the inventive concept.

FIG. 9 is an enlarged plan view of the mesh pattern MP according to an embodiment of the inventive concept. FIG. 9 is an enlarged view of a region corresponding to the first light-emitting region LA1 and the second light-emitting region LA2 which are adjacent to each other in the second diagonal direction DR5.

Referring to FIGS. 4B and 9, the first light-emitting regions LA1, the second light-emitting regions LA2, and the third light-emitting regions LA3 may have different areas. FIG. 9 exemplarily illustrates the first light-emitting region LA1 and the second light-emitting region LA2 having different areas among the first to third light-emitting regions LA1, LA2, and LA3.

The mesh pattern MP according to an embodiment may cover the outer side portion of each of the first and second light-emitting regions LA1 and LA2. The mesh pattern MP may cover all of the four outer sides LS1, LS2, LS3, and LS4 of each of the first and second light-emitting regions LA1 and LA2. The same/similar reference numerals are used for the same/similar components as those described with reference to FIGS. 6 to 8, and duplicate descriptions are omitted.

In an embodiment, the first mesh line MSL1 may include bent portions BP. The first mesh line MSL1 may extend overall along the first diagonal direction DR4, but the first mesh line MSL1 may include the bent portions BP to cover the outer side portions of the light-emitting regions LA1 and LA2 having different areas. According to an embodiment of the inventive concept, to cover the outer side portion of each of the first and second light-emitting regions LA1 and LA2 having different areas, the first mesh line MSL1 may include the bent portions BP between the first and second light-emitting regions LA1 and LA2, and may include a portion extending in a direction somewhat different from the first diagonal direction DR4 between the bent portions BP.

FIG. 9 exemplarily illustrates a portion of the mesh pattern MP covering the outer side portions of the first and second light-emitting regions LA1 and LA2 adjacent to each other in the second diagonal direction DR5, but in the first diagonal direction DR4, a portion covering the outer side portions of the light-emitting regions adjacent to each other (e.g., first and third light-emitting regions LA1 and LA3 or second and third light-emitting regions LA2 and LA3) may be similar thereto. That is, the second mesh line MSL2 may also extend overall along the second diagonal direction DR5, but in order to cover the outer side portion of each of the light-emitting regions having different areas, the second mesh line MSL2 may include bent portions. The second mesh line MSL2 may include a portion extending in a direction somewhat different from the second diagonal direction DR5 between the bent portions.

In an embodiment, the first peripheral openings OP1-MS may at least partially have a tetragonal shape with different internal angles on a plane. Although FIG. 9 exemplarily illustrates that the first peripheral openings OP1-MS have a trapezoidal shape on a plane, embodiments of the inventive concept are not limited thereto. For example, according to embodiments, the first peripheral openings OP1-MS may have an atypical tetragonal shape with four different internal angles.

FIG. 9 exemplarily illustrates that the bent portions BP are located in the outer side portions of corresponding light-emitting regions LA1 and LA2 on a plane, but the shape of the mesh pattern MP is not limited thereto. For example, the shape of the mesh pattern MP may be designed so that the bent portions BP are spaced apart from the light-emitting regions LA1 and LA2 on a plane.

Figure 10A:
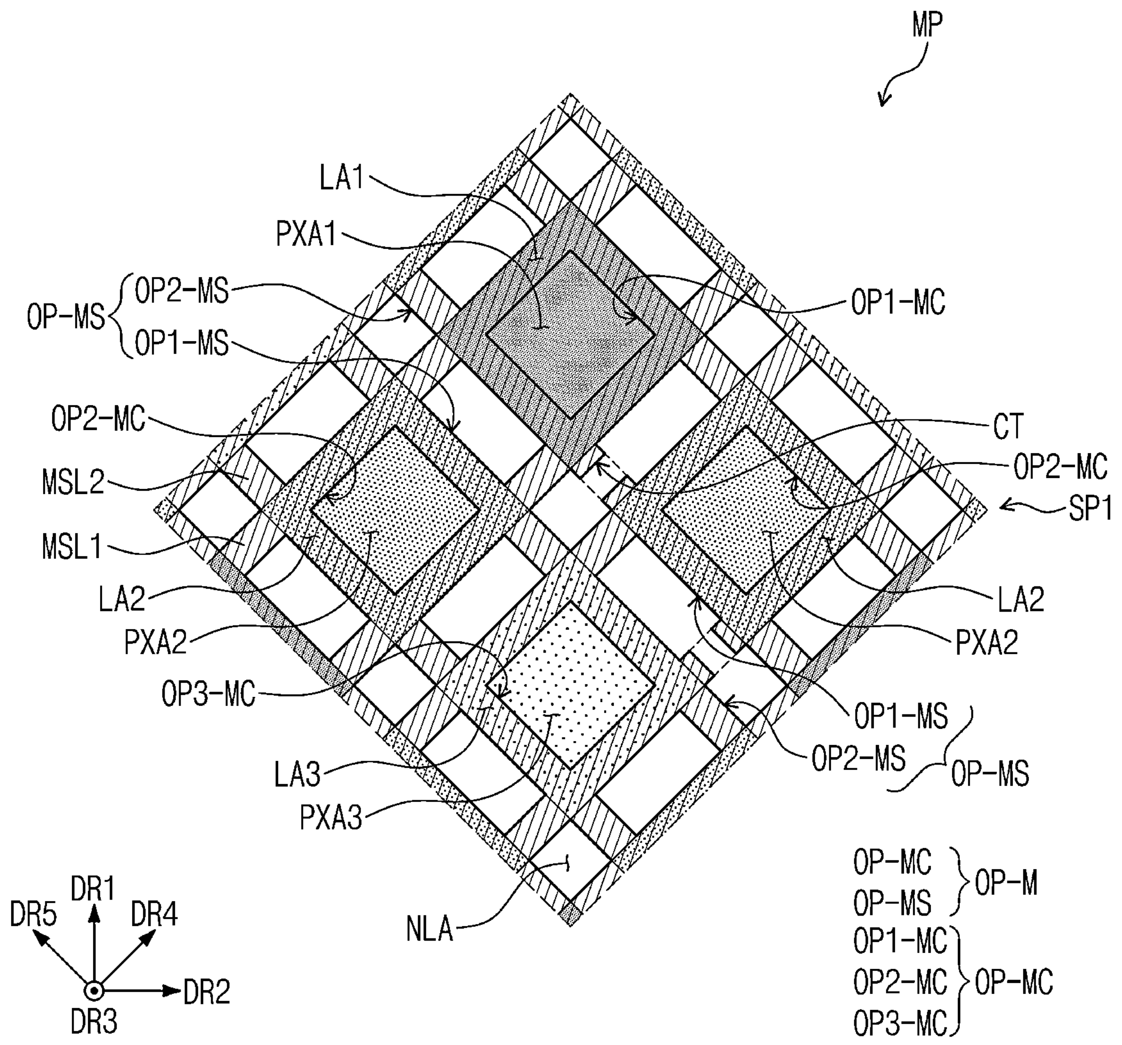
FIGS. 10A and 10B are enlarged plan views of a mesh pattern according to an embodiment of the inventive concept.
Figure 10B:
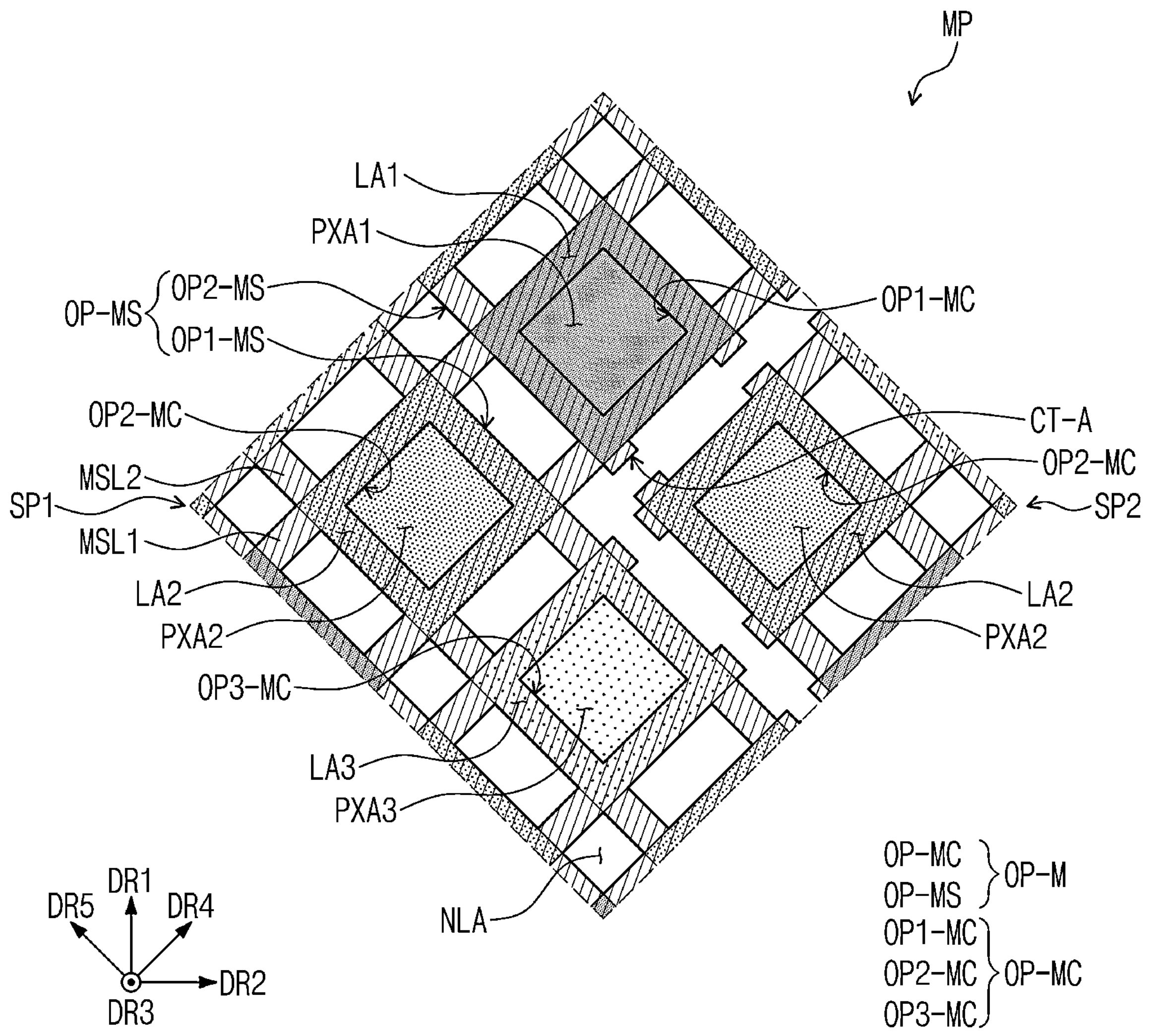

FIGS. 10A and 10B are enlarged plan views of the mesh pattern MP according to an embodiment of the inventive concept. FIGS. 10A and 10B are enlarged views of a region corresponding to one unit light-emitting region UA0 in FIG. 4A, and for convenience of explanation, the light-emitting regions LA1, LA2, and LA3 are illustrated together. The same/similar reference numerals are used for the same/similar components as those described with reference to FIGS. 6 to 9, and duplicate descriptions are omitted.

Referring to FIG. 10A, the mesh pattern MP according to an embodiment may cover all of the four outer sides of each of the light-emitting regions LA1, LA2, and LA3. As a result, although a pixel shrinkage phenomenon may occur and the areas of the light-emitting regions LA1, LA2, and LA3 are reduced, it is possible to prevent or suppress front luminance reduction.

In an embodiment, cut portions CT may be defined in at least any one of the first mesh lines MSL1 or the second mesh lines MSL2. The cut portions CT may be formed by removing portions of the mesh lines MSL1 and MSL2. FIG. 10A exemplarily illustrates the mesh pattern MP in the first sensing portion SP1, and the second sensing portion SP2 (see FIG. 5A) may also have a similar shape. The cut portions CT may be defined inside the first sensing portion SP1 or the second sensing portion SP2 (see FIG. 5A). The cut portions CT may be spaced apart from the boundary of the first sensing portion SP1 or the second sensing portion SP2 (see FIG. 5A).

Some of the first mesh lines MSL1 may include a plurality of portions spaced apart from each other in the first diagonal direction DR4 by the cut portions CT defined in the first mesh line MSL1. Some of the second mesh lines MSL2 may include a plurality of portions spaced apart from each other in the second diagonal direction DR5 by the cut portions CT defined in the second mesh line MSL2.

The cut portions CT may have an integral shape with adjacent openings OP-M among the openings OP-M. That is, the cut portions CT may be connected to adjacent openings OP-M to form an integral space. In an embodiment, the cut portions CT may be defined in portions adjacent to the peripheral openings OP-MS among the mesh lines MSL1 and MSL2. Accordingly, the cut portions CT may be connected to adjacent peripheral openings OP-MS to form an integral space.

For example, the cut portions CT may be defined between the first peripheral opening OP1-MS and the second peripheral opening OP2-MS that are adjacent to each other among the mesh lines MSL1 and MSL2. Accordingly, the cut portions CT may be connected to adjacent first and second peripheral openings OP1-MS and OP2-MS to form an integral space.

The cut portions CT may be spaced apart from the central openings OP-MC. Accordingly, in embodiments, the central openings OP-MC do not form an integral space by being connected to adjacent peripheral openings OP-MS by the cut portions CT. That is, in embodiments, the central openings OP-MC are not opened by the cut portions CT. Accordingly, each of the pixel regions PXA1, PXA2, and PXA3 may be completely surrounded by the mesh lines MSL1 and MSL2 defining the central opening OP-MC.

The boundary between the first sensing portion SP1 and the second sensing portion SP2 (see FIG. 4A) may have a relatively high reflectance of light, which may cause a problem of being visible to the user. According to an embodiment, as the cut portions CT are defined in the mesh pattern MP inside the first sensing portion SP1 or the second sensing portion SP2 (see FIG. 4A), a phenomenon in which the boundary between the first sensing portion SP1 and the second sensing portion SP2 (see FIG. 4A) is visible may be reduced. As reflectance increases in regions in which the cut portions CT are defined, it is possible to reduce the difference in reflectance between the boundary between the first sensing portion SP1 and the second sensing portion SP2 (see FIG. 4A) and the inside of the first sensing portion SP1 or the second sensing portion SP2 (see FIG. 4A).

In addition, according to an embodiment, since the cut portions CT are spaced apart from the central openings OP-MC so that the central openings OP-MC are not opened, light provided from the light-emitting elements OLED (see FIG. 7B) may be prevented from being transmitted to other adjacent openings in the process of passing through a corresponding central opening OP-MC. Unlike this configuration, when the cut portions CT are defined to open the central openings OP-MC, the light provided from the light-emitting elements OLED (see FIG. 7B) may reach other openings through an opened region within the central openings OP-MC. In this case, when adjacent central openings OP-MC are opened and connected, light passing through the central openings OP-MC may interfere with each other. In this case, as light reflected from boundaries having a regularly repeating shape is repeatedly combined with each other, a moiré phenomenon may occur. On the other hand, according to an embodiment, the moiré phenomenon may be prevented or reduced by suppressing the transmission of light provided from each light-emitting element OLED (see FIG. 7B) to other openings.

Therefore, according to an embodiment, it is possible to suppress or prevent front luminance reduction due to pixel shrinkage and, at the same time, provide the mesh pattern MP in which the moiré phenomenon is reduced or prevented. Accordingly, the display device DD (see FIG. 1) including the input sensing layer ISP (see FIG. 2) may be provided to have increased visibility.

FIG. 10A exemplarily illustrates positions in which the cut portions CT are formed within the mesh lines MSL1 and MSL2 and the number of the cut portions CT formed in a region corresponding to the unit light-emitting region UA0 (see FIG. 4A). The positions in which the cut portions CT are formed and the number of the cut portions CT may be set variously within a range in which the central openings OP-MC are not opened.

Referring to FIG. 10B, the mesh pattern MP according to an embodiment may cover all of the four outer sides of each of the light-emitting regions LA1, LA2, and LA3. As a result, although pixel shrinkage may occur and the areas of the light-emitting regions LA1, LA2, and LA3 are reduced, it is possible to prevent or suppress front luminance reduction.

In an embodiment, boundary cut portions CT-A may be defined in at least any one of the first mesh lines MSL1 or the second mesh lines MSL2. The boundary cut portions CT-A may be formed by removing portions of the mesh lines MSL1 and MSL2. FIG. 10A exemplarily illustrates the mesh pattern MP of each of the first sensing portion SP1 and the second sensing portion SP2, and rather than being defined inside the first sensing portion SP1 and the second sensing portion SP2, but the cut portions CT may be defined at the boundaries between the first sensing portion SP1 and the second sensing portion SP2. The first sensing portion SP1 and the second sensing portion SP2 adjacent thereto may be spaced apart from and electrically insulated from each other, and the boundary cut portion CT-A may be defined between the first sensing portion SP1 and the second sensing portion SP2 which are insulated from each other.

The boundary cut portion CT-A may have the same shape as the above-described cut portion CT (see FIG. 10A). The boundary cut portion CT-A may be defined in portions of the mesh lines MSL1 and MSL2 adjacent to the peripheral openings OP-MS. Accordingly, the boundary cut portions CT-A may be connected to the peripheral openings OP-MS adjacent to each other to form an integral space.

The boundary cut portions CT-A may be spaced apart from the central openings OP-MC. Accordingly, in embodiments, the central openings OP-MC do not form an integral space by being connected to adjacent peripheral openings OP-MS by the boundary cut portions CT-A. That is, in embodiments, the central openings OP-MC are not opened by the boundary cut portions CT-A, and each of the pixel regions PXA1, PXA2, and PXA3 may be completely surrounded by the mesh lines MSL1 and MSL2 defining the central opening OP-MC. As a result, it is possible to suppress the transmission of light provided from each light-emitting element OLED (see FIG. 7B) to other openings.

Figure 11A:
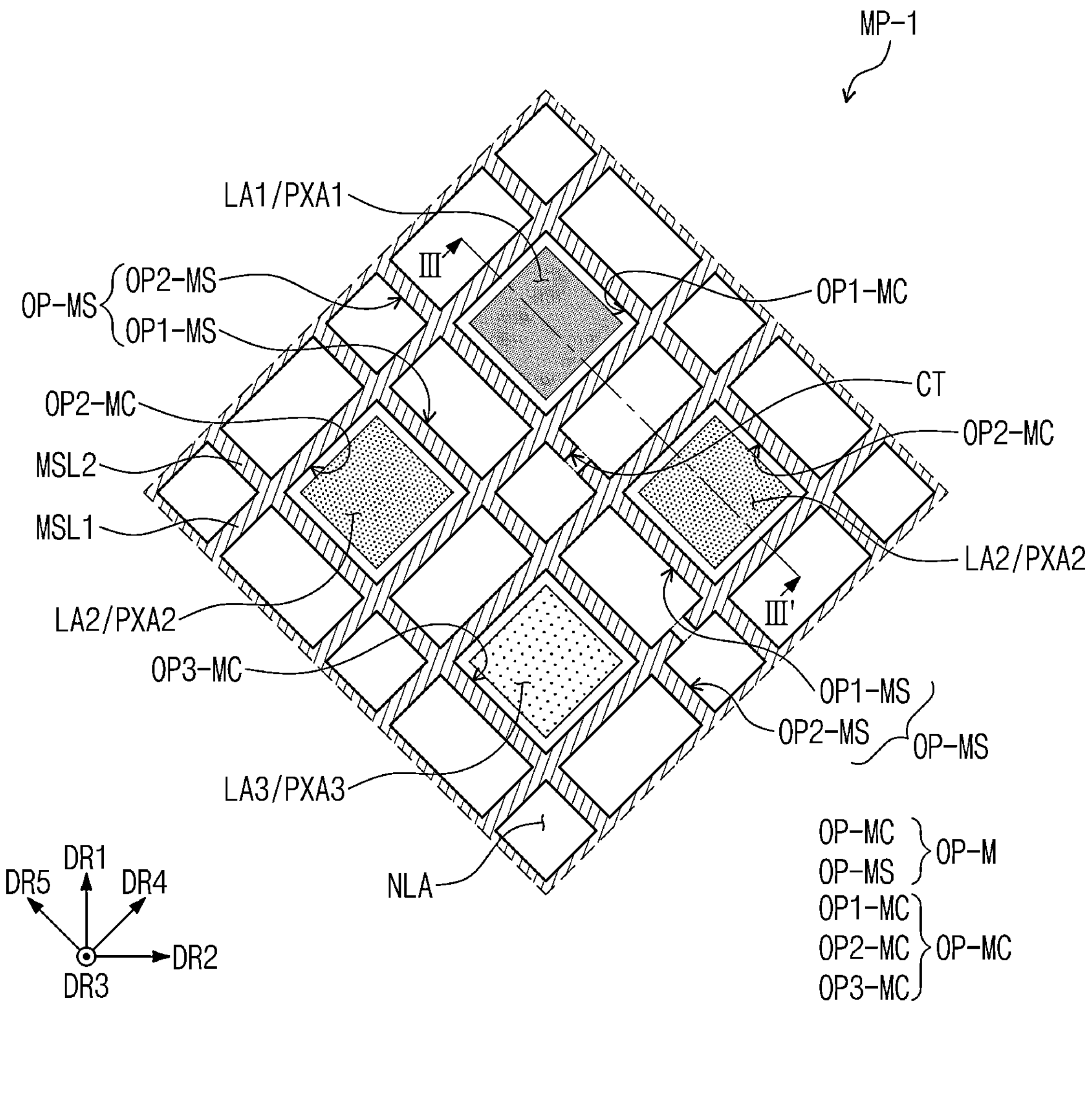
FIG. 11A is an enlarged plan view of a mesh pattern according to an embodiment of the inventive concept.
Figure 11B:
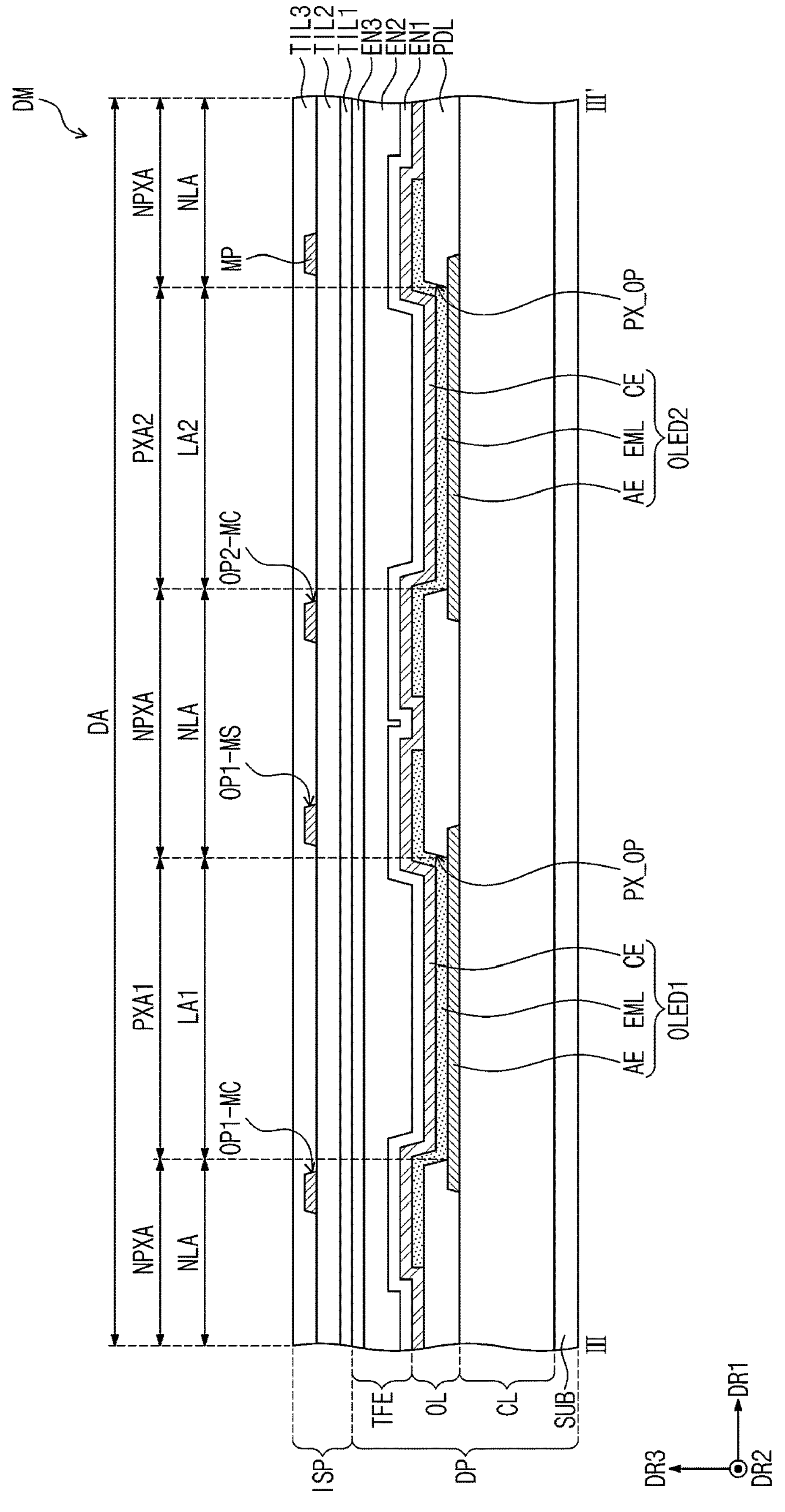
FIG. 11B is a cross-sectional view of a display module according to an embodiment of the inventive concept, which corresponds to region III-III' of FIG. 11A.

FIG. 11A is an enlarged plan view of a mesh pattern MP-1 according to an embodiment of the inventive concept. FIG. 11B is a cross-sectional view of the display module DM according to an embodiment of the inventive concept, which corresponds to region III-III' of FIG. 11A. FIG. 11A is an enlarged view of a region corresponding to one unit light-emitting region UA0 in FIG. 4A, and for convenience of explanation, the light-emitting regions LA1, LA2, and LA3 are illustrated together. The same/similar reference numerals are used for the same/similar components as those described with reference to FIGS. 6 to 10B, and duplicate descriptions are omitted.

Referring to FIGS. 11A and 11B, the mesh pattern MP-1 according to an embodiment do not overlap the light-emitting regions LA1, LA2, and LA3. That is, the mesh pattern MP-1 does not cover the light-emitting regions LA1, LA2, and LA3 on a plane. The mesh pattern MP-1 may entirely overlap the pixel defining film PDL. Each of the light-emitting regions LA1, LA2, and LA3 may be disposed inside a corresponding central opening OP-MC. Accordingly, the pixel regions PXA1, PXA2, and PXA3 may be defined as regions corresponding to the light-emitting regions LA1, LA2, and LA3. That is, each of the pixel regions PXA1, PXA2, and PXA3 in an embodiment may be defined as a portion of the first electrode AE (see FIG. 4D) exposed by a corresponding light-emitting opening PX_OP (see FIG. 4D).

In an embodiment, inside the first sensing portion SP1 (see FIG. 4A) or the second sensing portion SP2 (see FIG. 4A), the cut portions CT may be defined in at least any one of the first mesh lines MSL1 or the second mesh lines MSL2. As a result, a phenomenon in which the boundary between the first sensing portion SP1 and the second sensing portion SP2 (see FIG. 4A) is visible may be reduced.

The cut portions CT may be connected to adjacent peripheral openings OP-MS to form an integral space. According to embodiments, as the cut portions CT are spaced apart from the central openings OP-MC, the central openings OP-MC are not opened by the cut portions CT. As a result, light provided from the light-emitting elements OLED (see FIG. 7B) may be prevented from being transmitted to other adjacent openings in the process of passing through a corresponding central opening OP-MC, and a moiré phenomenon may be prevented or reduced. Accordingly, the display device DD (see FIG. 1) including the input sensing layer ISP (see FIG. 2) may be provided to have increased visibility.

Figure 12A:
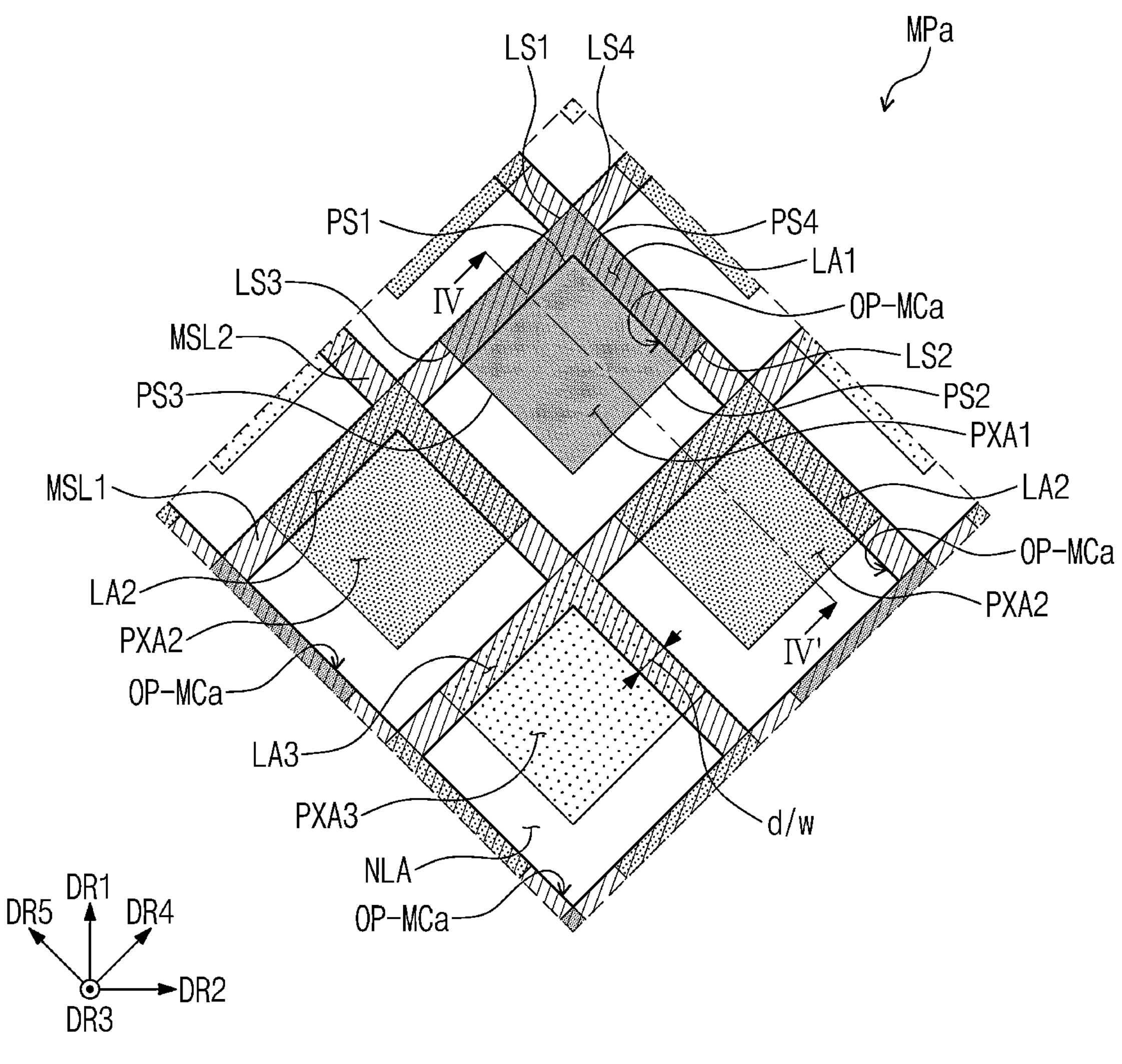
FIG. 12A is an enlarged plan view of a mesh pattern according to an embodiment of the inventive concept.
Figure 12B:
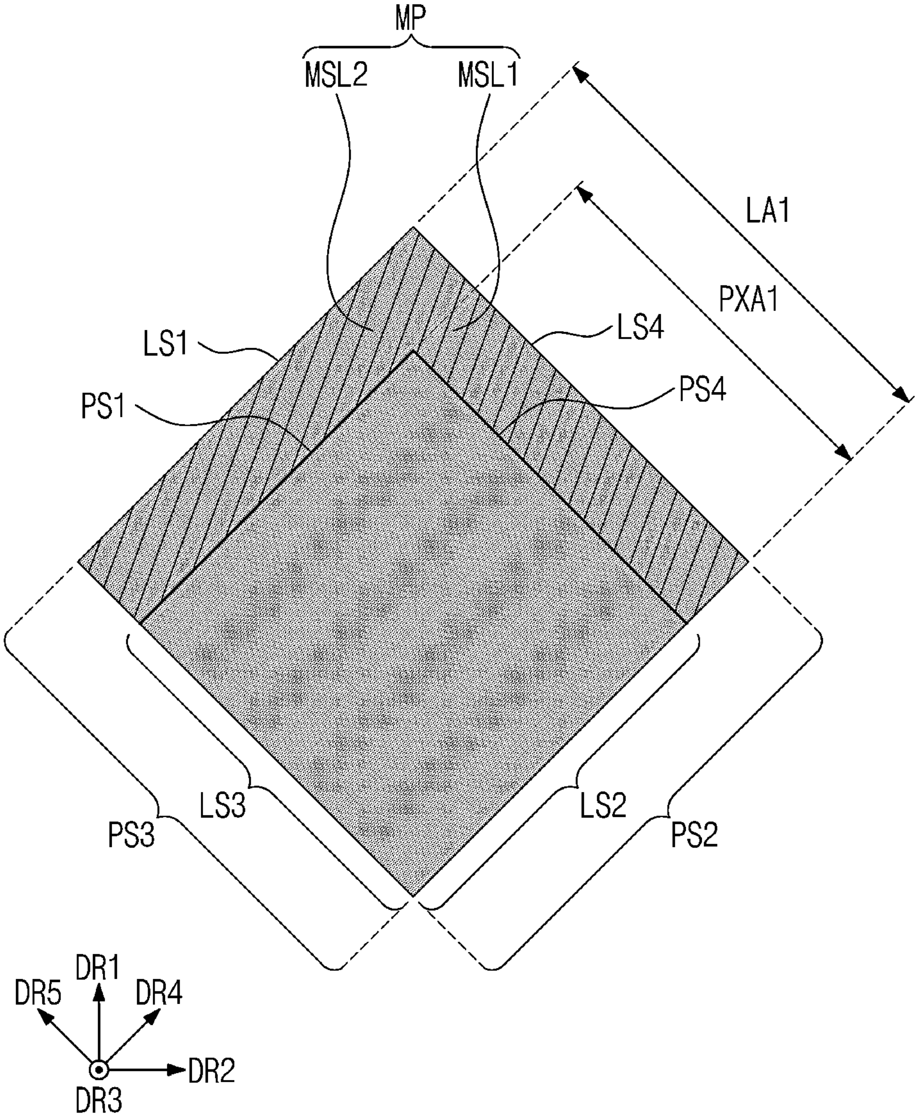
FIG. 12B illustrates one light-emitting region and a pixel region corresponding to each other according to an embodiment of the inventive concept.
Figure 12C:
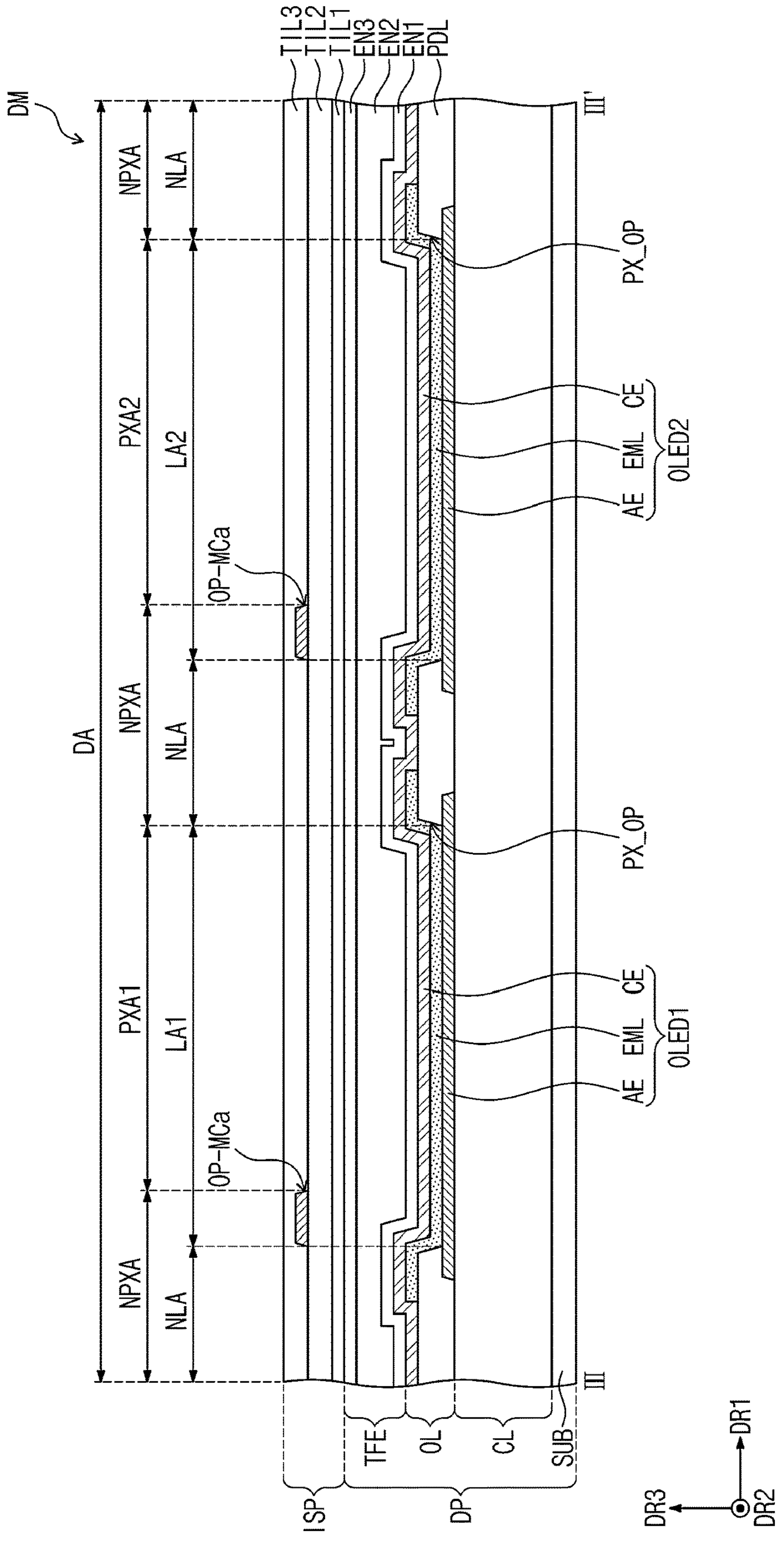
FIG. 12C is a cross-sectional view of a display module according to an embodiment of the inventive concept, which corresponds to region IV-IV' of FIG. 12A.

FIG. 12A is an enlarged plan view of a mesh pattern MPa according to an embodiment of the inventive concept. FIG. 12B illustrates one light-emitting region and a pixel region which correspond to each other according to an embodiment of the inventive concept. FIG. 12C is a cross-sectional view of the display module DM according to an embodiment of the inventive concept, which corresponds to region IV-IV' of FIG. 12A. FIG. 12A is an enlarged view of a region corresponding to one unit light-emitting region UA0 in FIG. 4A, and for convenience of explanation, the light-emitting regions LA1, LA2, and LA3 are illustrated together. FIG. 12B representatively illustrates the first light-emitting region LA1 among the first to third light-emitting regions LA1, LA2, and LA3 and the first pixel region PXA1 among the first to third pixel regions PXA1, PXA2, and PXA3. The same/similar reference numerals are used for the same/similar components as those described with reference to FIGS. 6 to 9, and duplicate descriptions are omitted.

Referring to FIGS. 12A to 12C, in an embodiment, the mesh pattern MPa may cover two of the four outer sides of each of the light-emitting regions LA1, LA2, and LA3. The first side LS1 or the second side LS2 may be covered by the first mesh line MSL1, and the third side LS3 or the fourth side LS4 may be covered by the second mesh line MSL2. FIG. 12A exemplarily illustrates that the mesh pattern MPa covers the first and fourth sides LS1 and LS4 of each of the first to third light-emitting regions LA1, LA2, and LA3.

Each of central openings OP-MCa may overlap a portion of a corresponding light-emitting region LA1, LA2, or LA3 and a portion of a non-light-emitting region NLA adjacent thereto. Each of the pixel regions PXA1, PXA2, and PXA3 may correspond to a region exposed by the central opening OP-MCa among a corresponding light-emitting region LA1, LA2, or LA3. That is, each of the pixel regions PXA1, PXA2, and PXA3 may correspond to a region overlapping the central opening OP-MCa among a corresponding light-emitting region LA1, LA2, or LA3.

Two (e.g., the first and fourth sides PS1 and PS4) of the four outer sides PS1, PS2, PS3, and PS4 of each of the pixel regions PXA1, PXA2, and PXA3 may be defined by one side of each of the first and second mesh lines MSL1 and MSL2. One (e.g., the first side PS1) of the two outer sides may be defined by one side of the first mesh line MSL1, and the other (e.g., the fourth side PS4) thereof may be defined by one side of the second mesh line MSL2. Among the four outer sides PS1, PS2, PS3, and PS4, the remaining two outer sides (e.g., the second and third sides PS2 and PS3) are only partially covered by the mesh pattern MPa and, therefore, may be defined as portions which are not covered by the mesh pattern MPa among the outer sides (e.g., the second and third sides LS2 and LS3) of a corresponding light-emitting region LA1, LA2, or LA3.

As illustrated in FIG. 12C, on a cross section, a portion of the mesh pattern MPa may be disposed to overlap only one side portion of the light-emitting region LA1 or LA2 in the second diagonal direction DR5. FIG. 12B exemplarily illustrates a cross section viewed in the first diagonal direction DR4, and even on a cross section viewed in the second diagonal direction DR5, a portion of the mesh pattern MPa may be disposed to overlap only one side portion of the light-emitting region LA1 or LA2 in the first diagonal direction DR4. Light provided from one side portion of the light-emitting region LA1 or LA2 may be blocked by the mesh pattern MPa. Light provided from the light-emitting elements OLED1 and OLED2 and passing through a region exposed by the central opening OP-MCa may be emitted to the outside of the display device DD (see FIG. 1) so as to be viewed by a user.

In an embodiment, one second mesh line MSL2 may be disposed between adjacent pixel regions PXA1, PXA2, and PXA3 in the first diagonal direction DR4, and one first mesh line MSL1 may be disposed between adjacent pixel regions PXA1, PXA2, and PXA3 in the second diagonal direction DR5.

FIG. 12A exemplarily illustrates that a distance d from the outer side of the light-emitting region LA1, LA2, or LA3 covered by the mesh pattern MPa to an adjacent central opening OP-MCa is substantially equal to a width w of the first mesh line MSL1 or the second mesh line MSL2. Without being limited thereto, however, the distance d from the outer side of the light-emitting region LA1, LA2, or LA3 covered by the mesh pattern MPa to an adjacent central opening OP-MCa may be smaller than the width w of the first mesh line MSL1 or the second mesh line MSL2.

Although a pixel shrinkage phenomenon may occur and the outer sides LS1*s*, LS2*s*, LS3*s*, and LS4*s* of the shrunk light-emitting region LAs are moved inward, portions of the outer sides LS1*s*, LS2*s*, LS3*s*, and LS4*s* of the shrunk light-emitting region LAs may be covered by the mesh pattern MP on a plane. Therefore, the reduced area ratio of the pixel region may be reduced compared to the reduced area ratio of the light-emitting region due to the pixel shrinkage phenomenon. In other words, the degree of reduction in front luminance due to the pixel shrinkage phenomenon may be comparatively suppressed.

Figure 12D:
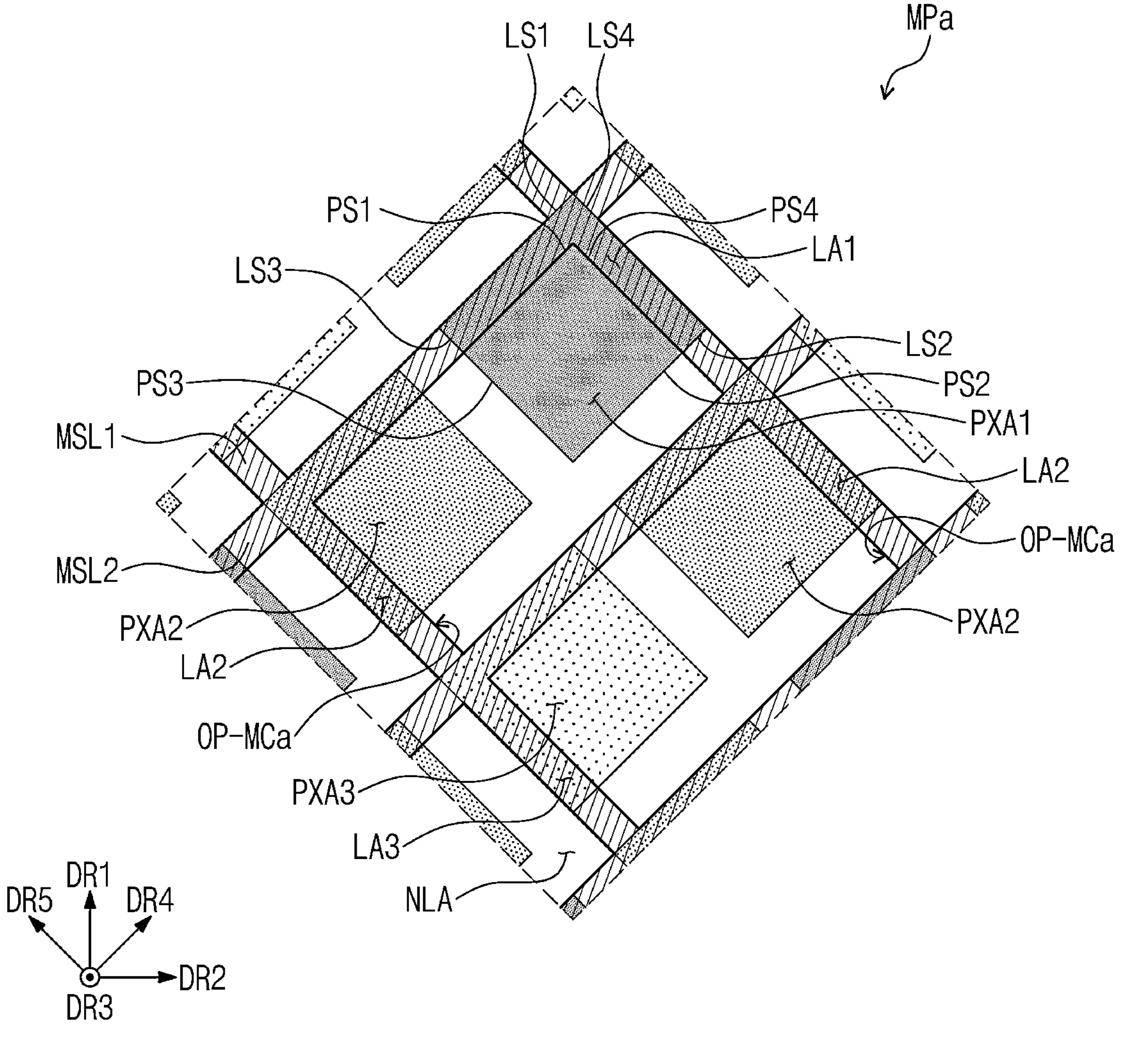
FIG. 12D is an enlarged plan view of a mesh pattern according to an embodiment of the inventive concept.

FIG. 12D is an enlarged plan view of the mesh pattern MPa according to an embodiment of the inventive concept. FIG. 12D is an enlarged view of a region corresponding to one unit light-emitting region UA0 in FIG. 4A, and for convenience of explanation, the light-emitting regions LA1, LA2, and LA3 are illustrated together. The same/similar reference numerals are used for the same/similar components as those described with reference to FIGS. 12A to 12C, and duplicate descriptions are omitted.

In an embodiment, two outer sides of the light-emitting regions LA1, LA2, and LA3 covered by the mesh pattern MPa may be selected in different combinations. For example, portions of the light-emitting regions LA1, LA2, and LA3, which are the first and fourth sides LS1 and LS4, may be covered by the mesh pattern MPa, and the other portions of the light-emitting regions LA1, LA2, and LA3, which are the first and third sides LS1 and LS3, may be covered by a mesh pattern MPa2. Accordingly, two outer sides defined by one side of each of the mesh lines MSL1 and MSL2 among the outer sides of the pixel regions PXA1, PXA2, and PXA3 may also be selected in different combinations. For example, in portions of the pixel regions PXA1, PXA2, and PXA3, the first and fourth sides PS1 and PS4 may be defined by one side of each of the mesh lines MSL1 and MSL2, and in the other portions of the pixel regions PXA1, PXA2, and PXA3, the first and third sides PS1 and PS3 may be defined by one side of each of the mesh lines MSL1 and MSL2.

In an embodiment, at least some of the central openings OP-MCa may overlap some of the plurality of light-emitting regions LA1, LA2, and LA3 and a portion of the non-light-emitting region NLA adjacent thereto. Accordingly, a plurality of pixel regions PXA1, PXA2, and PXA3 may be disposed within one central opening OP-MCa on a plane. FIG. 12D exemplarily illustrates the central openings OP-MCa overlapping portions of the two light-emitting regions LA1, LA2, and LA3 spaced apart from each other in the first diagonal direction DR4. Accordingly, two pixel regions PXA1, PXA2, and PXA3 spaced apart from each other in the first diagonal direction DR4 may be disposed within one central opening OP-MCa.

Without being limited thereto, however, the number of the light-emitting regions LA1, LA2, and LA3 overlapping one central opening OP-MCa may be greater, and accordingly, the number of the pixel regions PXA1, PXA2, and PXA3 disposed within one central opening OP-MCa may also be greater.

Between adjacent pixel regions PXA1, PXA2, and PXA3 in the first diagonal direction DR4, depending on a location, one second mesh line MSL2 may be disposed, or the second mesh line MSL2 may not be disposed. That is, the number of the mesh lines MSL1 and MSL2 disposed between adjacent pixel regions PXA1, PXA2, and PXA3 may vary depending on a location. According to an embodiment of the inventive concept, in another portion which is not illustrated, two first mesh lines MSL1 or two second mesh lines MSL2 may be disposed between adjacent pixel regions PXA1, PXA2, and PXA3.

FIGS. 13A to 13D are enlarged plan views of a mesh pattern MPb according to an embodiment of the inventive concept. For convenience of explanation, FIG. 13B focuses on the first light-emitting region LA1 and the first pixel region PXA1, FIG. 13C focuses on the second light-emitting region LA2 and the second pixel region PXA2, and FIG. 13D focuses on the third light-emitting region LA3 and the third pixel region PXA3.

Referring to FIGS. 4A and 13A to 13D, the display device DD (see FIG. 1) may include pixel regions PXA1, PXA2, and PXA3. The arrangement of the first to third pixel regions PXA1, PXA2, and PXA3 may substantially correspond to the arrangement of the first to third light-emitting regions LA1, LA2, and LA3. The description of the arrangement of the first to third light-emitting regions LA1, LA2, and LA3 described above with reference to FIG. 4A may be equally applied to the arrangement of the first to third pixel regions PXA1, PXA2, and PXA3 according to an embodiment described with reference to FIGS. 13A to 13D.

Figure 13A:
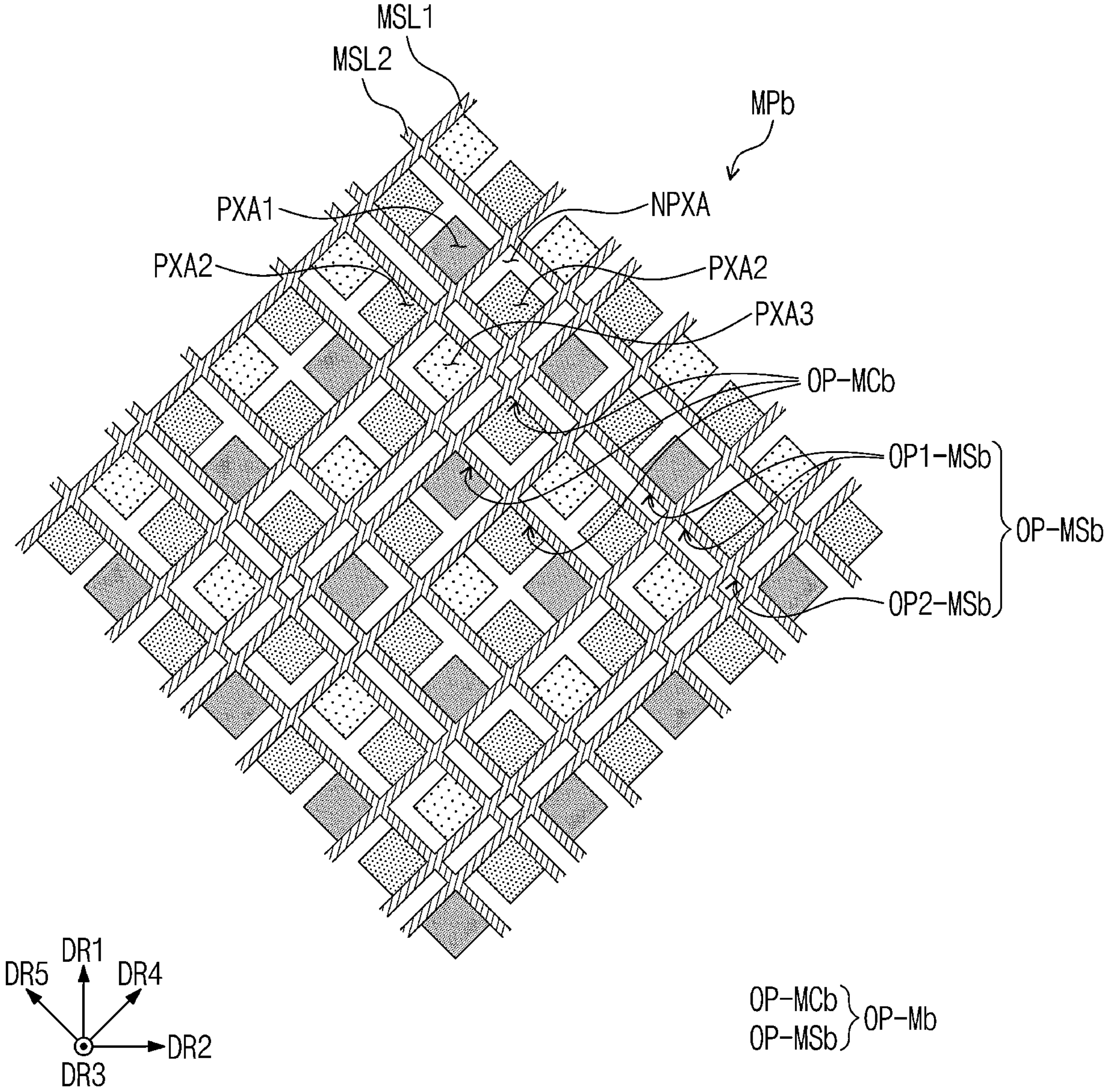
FIGS. 13A to 13D are enlarged plan views of a mesh pattern according to an embodiment of the inventive concept.

The mesh pattern MPb may include mesh lines MSL1 and MSL2 defining central openings OP-MCb and peripheral openings OP-MSb. In an embodiment, the central openings OP-MCb may include both openings overlapping one light-emitting region LA1, LA2, or LA3 and openings overlapping a plurality of light-emitting regions LA1, LA2, and LA3. The central openings OP-MCb may include openings having different areas and/or shapes. FIG. 13A exemplarily illustrates that the central openings OP-MCb include openings overlapping two light-emitting regions LA1, LA2, and LA3 and openings overlapping four light-emitting regions LA1, LA2, and LA3, and the number of a plurality of light-emitting regions LA1, LA2, and LA3 overlapping the central opening OP-MCb is not limited thereto.

The peripheral openings OP-MSb may include first peripheral openings OP1-MSb and second peripheral openings OP2-MSb. The first peripheral openings OP1-MSb may extend along the outer side of an adjacent central opening OP-MCb. The first peripheral openings OP1-MSb may be disposed between two adjacent central openings OP-MCb in the first diagonal direction DR4 or between two adjacent central openings OP-MCb in the second diagonal direction DR5. The first peripheral openings OP1-MSb may also include openings having different areas and/or shapes.

The second peripheral openings OP2-MSb may be spaced apart from an adjacent central opening OP-MCb in the first direction DR1 or the second direction DR2. The second peripheral openings OP2-MSb may be disposed between adjacent central openings OP-MCb in the first direction DR1 or between adjacent central openings OP-MCb in the second direction DR2. In addition, the second peripheral openings OP2-MSb may be disposed between adjacent first peripheral openings OP1-MSb in the first diagonal direction DR4 or between adjacent first peripheral openings OP1-MSb in the second diagonal direction DR5.

Compared to an embodiment in which the central openings OP-MC and the first peripheral openings OP1-MS are alternately arranged in each of the first and second diagonal directions DR4 and DR5 as described above with reference to FIG. 7A, in an embodiment described herein, only predetermined central openings OP-MCb may be continuously arranged in the first or second diagonal directions DR4 and DR5.

In an embodiment, the mesh pattern MPb may cover two of the four outer sides of each of the light-emitting regions LA1, LA2, and LA3. FIGS. 13A to 13D exemplarily illustrate the shape of the mesh pattern MPb that may reduce a viewing angle deviation.

Figure 13B:
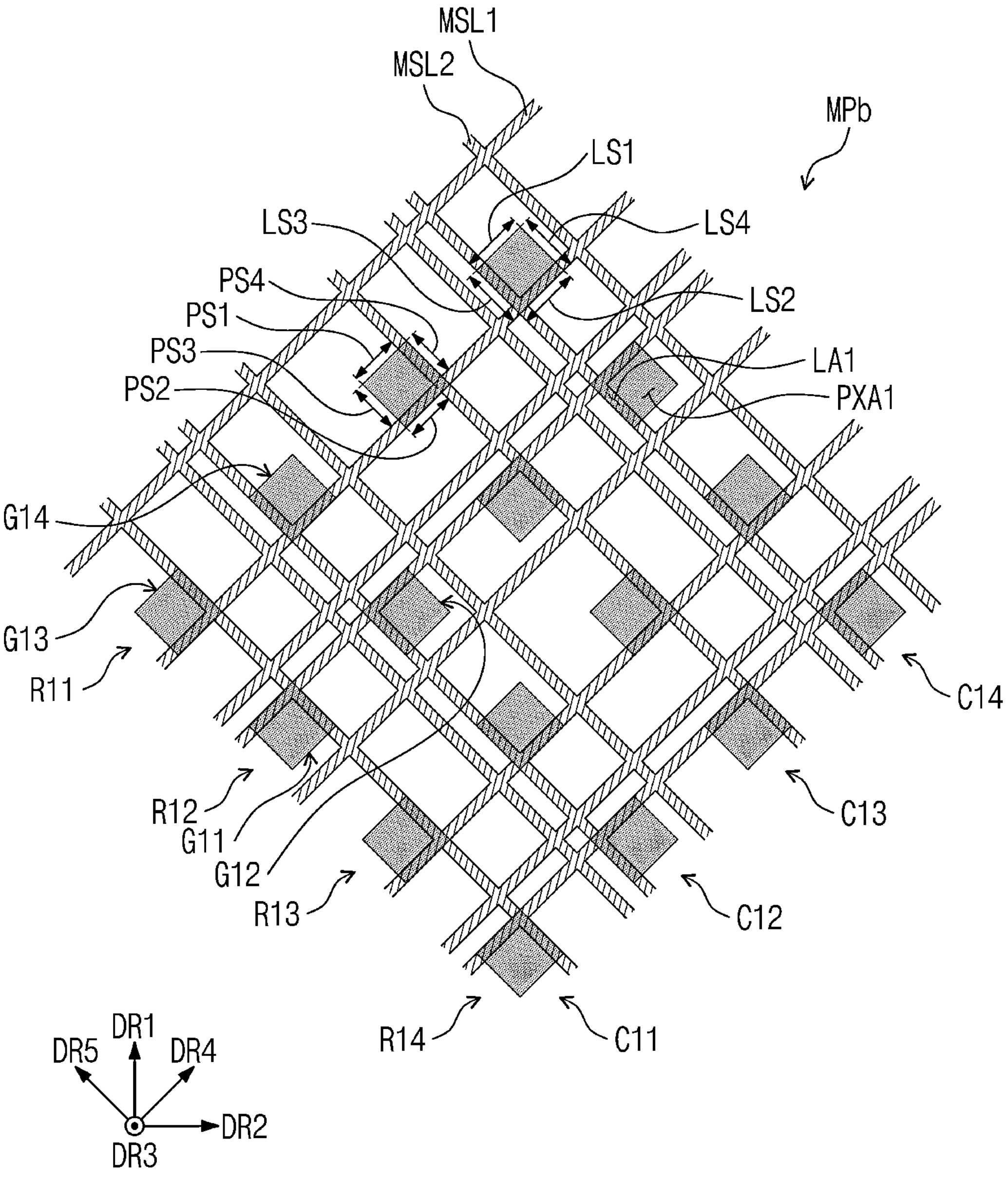

First, as illustrated in FIG. 13B, the first light-emitting regions LA1 may include four groups G11, G12, G13, and G14. The first and fourth sides LS1 and LS4 of the first light-emitting regions G11 of the first group may be covered by the mesh pattern MPb, and the first and third sides LS1 and LS3 of the first light-emitting regions G12 of the second group may be covered by the mesh pattern MPb. The second and fourth sides LS2 and LS4 of the first light-emitting regions G13 of the third group may be covered by the mesh pattern MPb, and the second and third sides LS2 and LS3 of the first light-emitting regions G14 of the fourth group may be covered by the mesh pattern MPb.

FIG. 13B exemplarily illustrates the first light-emitting regions LA1 disposed in the unit light-emitting regions UA0 (see FIG. 4A) of 4 rows and 4 columns. For example, the first light-emitting regions LA1 of first to fourth rows R11 to R14 and first to fourth columns C11 to C14 are illustrated. The first light-emitting regions LA1 of each of the first to fourth rows R11 to R14 may be arranged along the first diagonal direction DR4, and the first light-emitting regions LA1 of each of the first to fourth columns C11 to C14 may be arranged along the second diagonal direction DR5.

According to an embodiment of the inventive concept, in each of the first and third rows R11 and R13, the first light-emitting regions G13 of the third group and the first light-emitting regions G14 of the fourth group may be alternately arranged in the first diagonal direction DR4. In each of the second and fourth rows R12 and R14, the first light-emitting regions G11 of the first group and the first light-emitting regions G12 of the second group may be alternately arranged along the first diagonal direction DR4.

According to an embodiment of the inventive concept, in each of the first and third columns C11 and C13, the first light-emitting regions G11 of the first group and the first light-emitting regions G13 of the third group may be alternately arranged along the second diagonal direction DR5. In each of the second and fourth columns C12 and C14, the first light-emitting regions G12 of the second group and the first light-emitting regions G14 of the fourth group may be alternately arranged along the second diagonal direction DR5.

Accordingly, the first light-emitting regions LA1 of the first to fourth groups G11 to G14 may be uniformly arranged within a predetermined unit area.

FIG. 13B exemplarily illustrates that two groups of the first light-emitting regions LA1 are alternately arranged one to one in each row and column. However, embodiments of the inventive concept are not limited thereto. For example, two groups of the first light-emitting regions LA1 may be alternately arranged in a row or column, or three or four groups of the first light-emitting regions LA1 may be alternately arranged in a row or column.

According to an embodiment of the inventive concept, as long as the first light-emitting regions G11 to G14 of the first to fourth groups can be disposed to have the same number as each other within a predetermined unit area, they may not be arranged to have a predetermined rule in a row or column, or may be randomly arranged. The predetermined unit area may refer to a unit area, which may be uniformly disposed to reduce a viewing angle deviation, and may be variously set depending on a product to be applied, considering the arrangement form and resolution of the unit light-emitting regions, the area ratio of a region covered by the mesh pattern, and the like. For example, the predetermined unit area may be set based on a region in which the unit light-emitting regions of m rows and n columns are arranged, where each of m and n is a positive integer. However, embodiments of the inventive concept are not limited thereto.

Figure 13C:
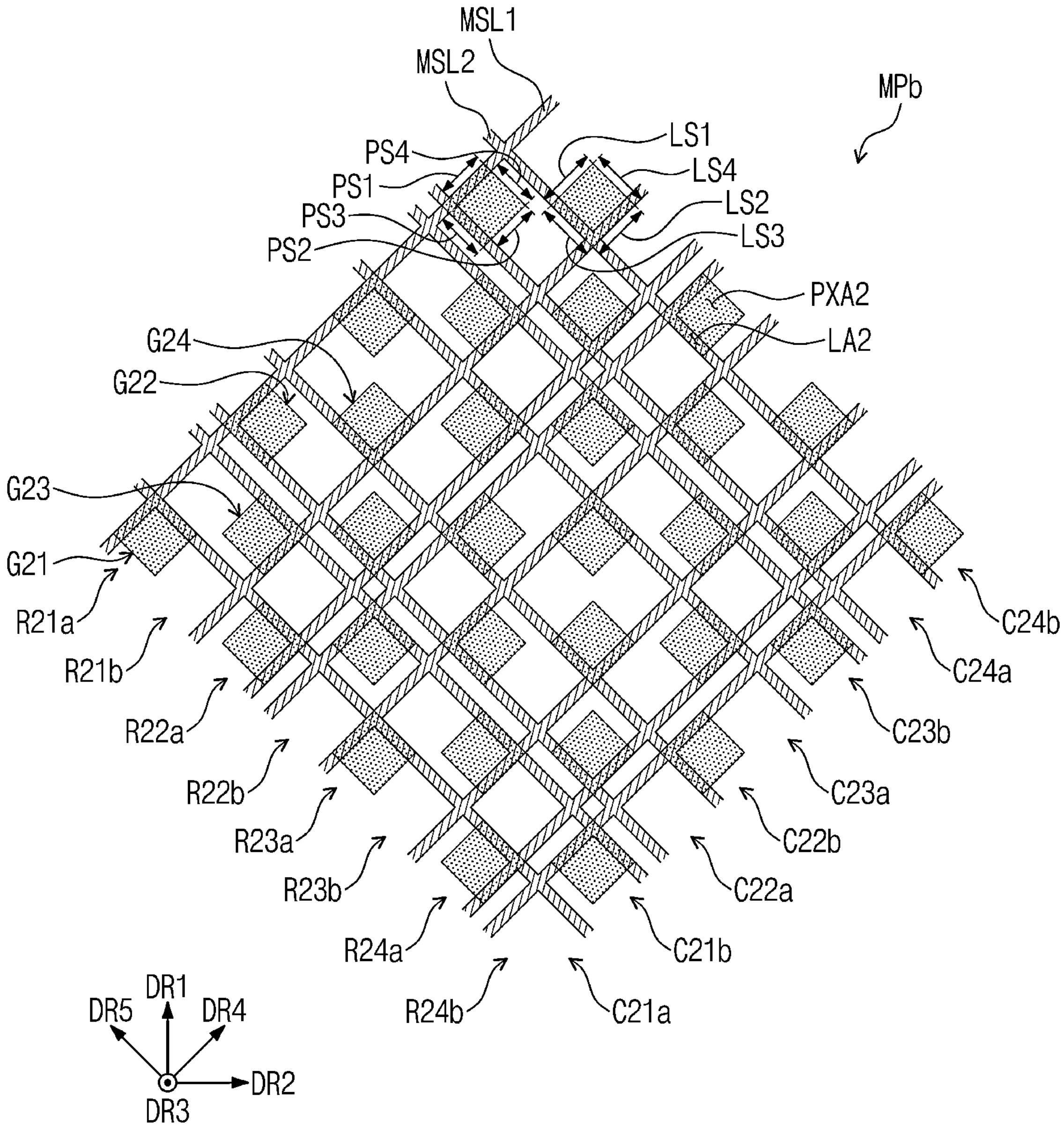

As illustrated in FIG. 13C, the second light-emitting regions LA2 may include four groups G21, G22, G23, and G24. The first and fourth sides LS1 and LS4 of the second light-emitting regions G21 of the first group may be covered by the mesh pattern MPb, and the first and third sides LS1 and LS3 of the second light-emitting regions G22 of the second group may be covered by the mesh pattern MPb. The second and fourth sides LS2 and LS4 of the second light-emitting regions G23 of the third group may be covered by the mesh pattern MPb, and the second and third sides LS2 and LS3 of the second light-emitting regions G24 of the fourth group may be covered by the mesh pattern MPb.

FIG. 13C exemplarily illustrates a portion disposed in the unit light-emitting regions UA0 (see FIG. 4A) of 4 rows and 4 columns, and the second light-emitting regions LA2 of (1-1)-th to (4-2)-th rows R21*a* to R24*b* and (1-1)-th to (4-2)-th columns C21*a* to C24*b* are illustrated. The second light-emitting regions LA2 of (1-1)-th, (2-1)-th, (3-1)-th, and (4-1)-th rows R21*a*, R22*a*, R23*a*, and R24*a* and (1-1)-th, (2-1)-th, (3-1)-th, and (4-1)-th columns C21*a*, C22*a*, C23*a*, and C24*a* may be arranged along the first and second diagonal directions DR4 and DR5. The second light-emitting regions LA2 of (1-2)-th, (2-2)-th, (3-2)-th, and (4-2)-th rows R21*b*, R22*b*, R23*b*, and R24*b* and (1-2)-th, (2-2)-th, (3-2)-th, and (4-2)-th columns C21*b*, C22*b*, C23*b*, and C24*b* may be arranged along the first and second diagonal directions DR4 and DR5. The second light-emitting regions LA2 of adjacent rows (e.g., (1-1)-th and (1-2)-th rows R21*a* and R21*b*) and adjacent columns (e.g., (1-1)-th and (1-2)-th columns C21*a* and C21*b*) may be arranged to be staggered with each other.

In an embodiment, in each of the (1-1)-th and (3-1)-th rows R21*a* and R23*a* and the (2-2)-th and (4-2)-th rows R22*b* and R24*b*, the second light-emitting regions G21 of the first group and the second light-emitting regions G22 of the second group may be alternately arranged. In each of the (2-1)-th and (4-1)-th rows L22*a* and L24*a* and the (1-2)-th and (3-2)-th rows L21*b* and L23*b*, the second light-emitting regions G23 of the third group and the second light-emitting regions G24 of the fourth group may be alternately arranged.

In an embodiment, in each of the (1-1)-th and (3-1)-th columns C21*a* and C23*a* and the (1-2)-th and (3-2)-th columns C21*b* and C23*b*, the second light-emitting regions G21 of the first group and the second light-emitting regions G23 of the third group may be alternately arranged, and in each of the (2-1)-th and (4-1)-th columns C22*a* and C24*a* and the (2-2)-th and (4-2)-th columns C22*b* and C24*b*, the second light-emitting regions G22 of the second group and the second light-emitting regions G24 of the fourth group may be alternately arranged.

Accordingly, the first to fourth groups G21 to G24 of the second light-emitting regions LA2 may be uniformly arranged within a predetermined unit area.

In FIG. 13C, two groups of the second light-emitting regions LA2 are alternately arranged one to one in each row and column. However, embodiments of the inventive concept are not limited thereto. For example, two groups of the second light-emitting regions LA2 may be alternately arranged in plurality in a row or column, or three or four groups of the second light-emitting regions LA2 may be alternately arranged in a row or column.

According to an embodiment of the inventive concept, as long as the second light-emitting regions G21 to G24 of the first to fourth groups can be disposed to have the same number as each other within a predetermined unit area, they may not be arranged to have a predetermined rule in a row or column, or may be randomly arranged.

Figure 13D:
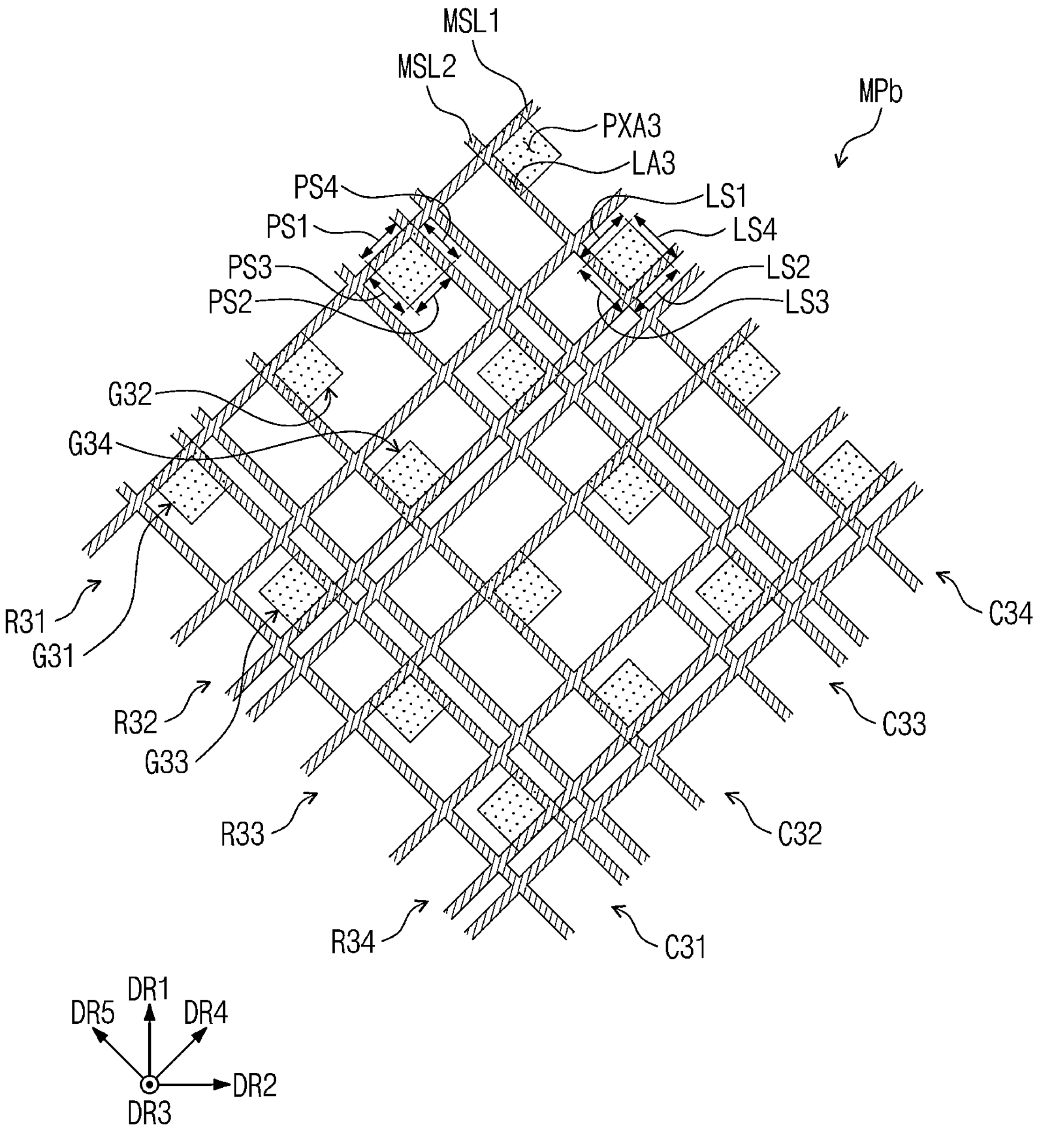

As illustrated in FIG. 13D, the third light-emitting regions LA3 may include four groups G31, G32, G33, and G34. The first and fourth sides LS1 and LS4 of the third light-emitting regions G31 of the first group may be covered by the mesh pattern MPb, and the first and third sides LS1 and LS3 of the third light-emitting regions G32 of the second group may be covered by the mesh pattern MPb. The second and fourth sides LS2 and LS4 of the third light-emitting regions G33 of the third group may be covered by the mesh pattern MPb, and the second and third sides LS2 and LS3 of the third light-emitting regions G34 of the fourth group may be covered by the mesh pattern MPb.

FIG. 13D exemplarily illustrates the third light-emitting regions LA3 disposed in the unit light-emitting regions UA0 (see FIG. 4A) of 4 rows and 4 columns, and the third light-emitting regions LA3 of the first to fourth rows R31 to R34 and the first to fourth columns C31 to C34 are illustrated. The third light-emitting regions LA3 of each of the first to fourth rows R31 to R34 may be arranged along the first diagonal direction DR4, and the third light-emitting regions LA3 of each of the first to fourth columns C31 to C34 may be arranged along the second diagonal direction DR5.

According to an embodiment of the inventive concept, in each of the first and third rows R31 and R33, the third light-emitting regions G31 of the first group and the third light-emitting regions G32 of the second group may be alternately arranged along the first diagonal direction DR4. In each of the second and fourth rows R32 and R34, the third light-emitting regions G33 of the third group and the third light-emitting regions G34 of the fourth group may be alternately arranged along the first diagonal direction DR4.

According to an embodiment of the inventive concept, in each of the first and third columns C31 and C33, the third light-emitting regions G31 of the first group and the third light-emitting regions G33 of the third group may be alternately arranged along the second diagonal direction DR5. In each of the second and fourth columns C32 and C34, the third light-emitting regions G32 of the second group and the third light-emitting regions G34 of the fourth group may be alternately arranged along the second diagonal direction DR5.

Accordingly, the first to fourth groups G31 to G34 of the third light-emitting regions LA3 may be uniformly arranged within a predetermined unit area.

FIG. 13D exemplarily illustrates that two groups of the third light-emitting regions LA3 are alternately arranged one to one in each row and column. However, embodiments of the inventive concept are not limited thereto. For example, two groups of the third light-emitting regions LA3 may be alternately arranged in plurality in a row or column, or three or four groups of the third light-emitting regions LA3 may be alternately arranged in a row or column.

According to an embodiment of the inventive concept, as long as the third light-emitting regions G31 to G34 of the first to fourth groups can be disposed to have the same number as each other within a predetermined unit area, they may not be alternately arranged according to a predetermined rule in a row or column, or may be randomly arranged.

According to an embodiment of FIGS. 13A to 13D, based on a center line extending along the first direction DR1 or the second direction DR2, the mesh pattern MPb may cover one side of the light-emitting regions LA1, LA2, and LA3 and does not cover the other side of the light-emitting regions LA1, LA2, and LA3. In this case, a viewing angle on one side of the light-emitting regions LA1, LA2, and LA3 may be different from a viewing angle on the other side of the light-emitting regions LA1, LA2, and LA3. According to an embodiment, two sides covered by the mesh pattern MPb among the first to fourth sides LS1, LS2, LS3, and LS4 of the light-emitting regions LA1, LA2, and LA3 may be evenly selected and uniformly distributed within a predetermined unit area. Accordingly, based on a center line extending in the first direction DR1 within a predetermined unit area, a viewing angle deviation on one side and the other side with respect to the second direction DR2 may be reduced and, based on a center line extending in the second direction DR2, a viewing angle deviation on one side and the other side with respect to the first direction DR1 may be reduced. Accordingly, it is possible to provide the display device DD (see FIG. 1) including the input sensing layer ISP (see FIG. 2) and having a small difference in visibility depending on the viewing angle.

Figure 14:
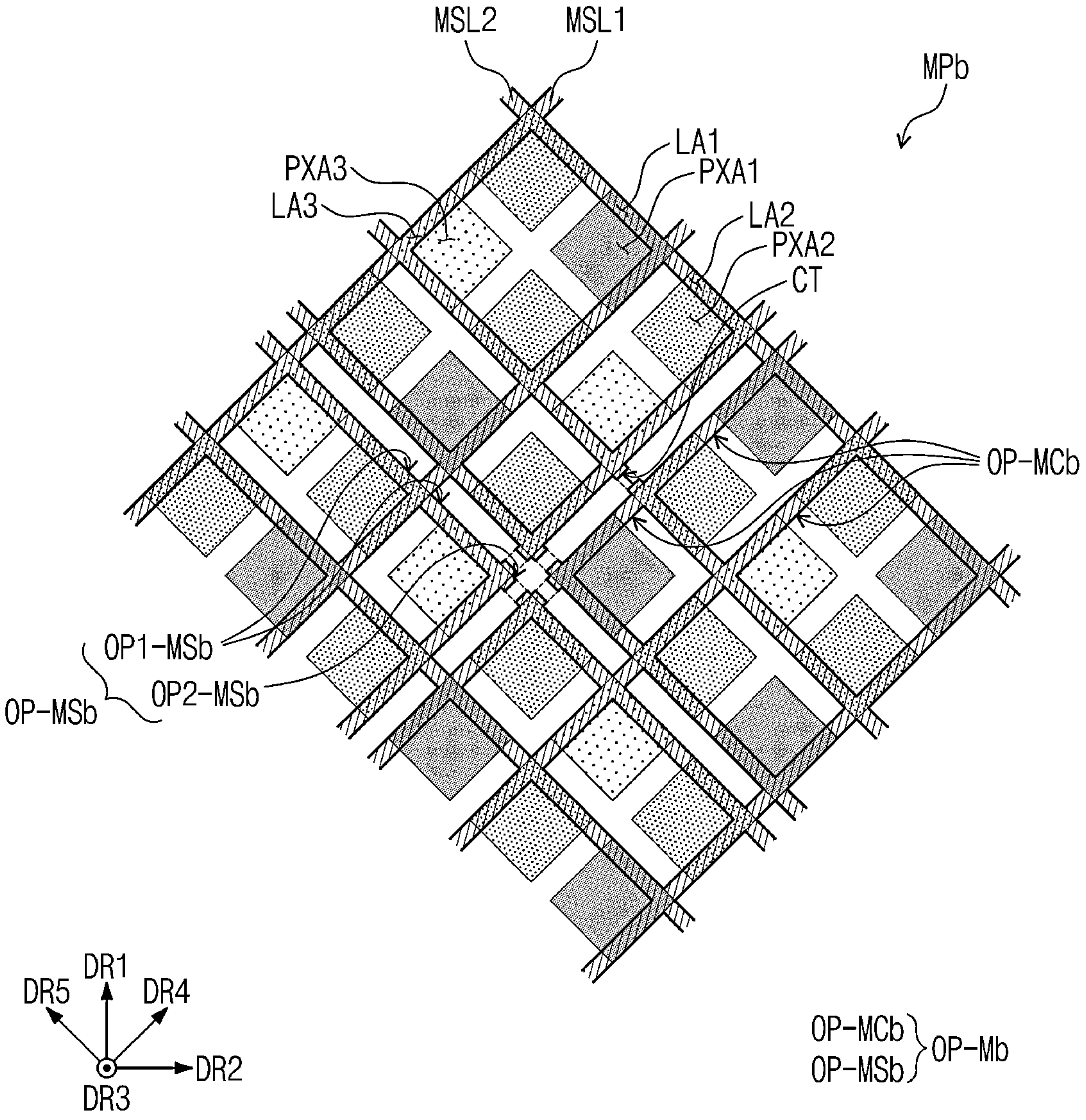
FIG. 14 is an enlarged plan view of a mesh pattern according to an embodiment of the inventive concept.

FIG. 14 is an enlarged plan view of the mesh pattern MPb according to an embodiment of the inventive concept. For convenience of explanation, FIG. 14 illustrates the light-emitting regions LA1, LA2, and LA3 together. The same/similar reference numerals are used for the same/similar components as those described with reference to FIGS. 6 to 13D, and duplicate descriptions are omitted.

Referring to FIG. 14, according to an embodiment, the mesh pattern MPb may cover two of the four outer sides of each of the light-emitting regions LA1, LA2, and LA3. As a result, although a pixel shrinkage phenomenon may occur and the areas of the light-emitting regions LA1, LA2, and LA3 are reduced, it is possible to prevent or suppress front luminance reduction.

In an embodiment, cut portions CT may be defined in at least any one of the first mesh lines MSL1 or the second mesh lines MSL2. The cut portions CT may be defined inside the first sensing portion SP1 (see FIG. 5A) or the second sensing portion SP2 (see FIG. 5A). As a result, it is possible to reduce a phenomenon in which the boundary between the first sensing portion SP1 (see FIG. 4A) and the second sensing portion SP2 (see FIG. 4A) is viewed.

The cut portions CT may be connected to adjacent peripheral openings OP-MSb to form an integral space. For example, the cut portions CT may be defined between adjacent first peripheral openings OP1-MSb or between a first peripheral openings OP1-MSb and a second peripheral openings OP2-MSb adjacent to each other among the mesh lines MSL1 and MSL2. Accordingly, the cut portions CT may be connected to adjacent first and second peripheral openings OP1-MSb and OP2-MSb to form an integral space.

The cut portions CT may be spaced apart from the central openings OP-MCb. Accordingly, in embodiments, the central openings OP-MCb do not form an integral space by being connected to adjacent peripheral openings OP-MSb by the cut portions CT. That is, the central openings OP-MCb are not opened by the cut portions CT. As a result, light provided from the light-emitting elements OLED (see FIG. 7B) may be prevented from being transmitted to other adjacent openings in the process of passing through a corresponding central opening OP-MC, and a moiré phenomenon may be prevented or reduced. Accordingly, the display device DD (see FIG. 1) including the input sensing layer ISP (see FIG. 2) may be provided to have increased visibility.

FIG. 14 exemplarily illustrates positions in which the cut portions CT are formed within the mesh lines MSL1 and MSL2 and the number of the cut portions CT formed within a predetermined area. The positions and number of the cut portions CT may be variously set within a range in which the central openings OP-MCb are not opened.

FIG. 14 exemplarily illustrates that the cut portions CT are defined in at least some of the mesh lines MSL1 and MSL2, but as described above with reference to FIG. 10B, at the boundary of the first sensing portion SP1 (see FIG. 10B) and the second sensing portion SP2 (see FIG. 10B), boundary cut portions CT-A (see FIG. 10B) may be defined in at least some of the mesh lines MSL1 and MSL2. The boundary cut portions CT-A (see FIG. 10B) may have substantially the same shape as the above-described cut portions CT. The boundary cut portions CT-A (see FIG. 10B) may be spaced apart from the central openings OP-MCb, and therefore, the central openings OP-MCb are not opened by the boundary cut portions CT-A (see FIG. 10B) according to embodiments.

Figure 15:
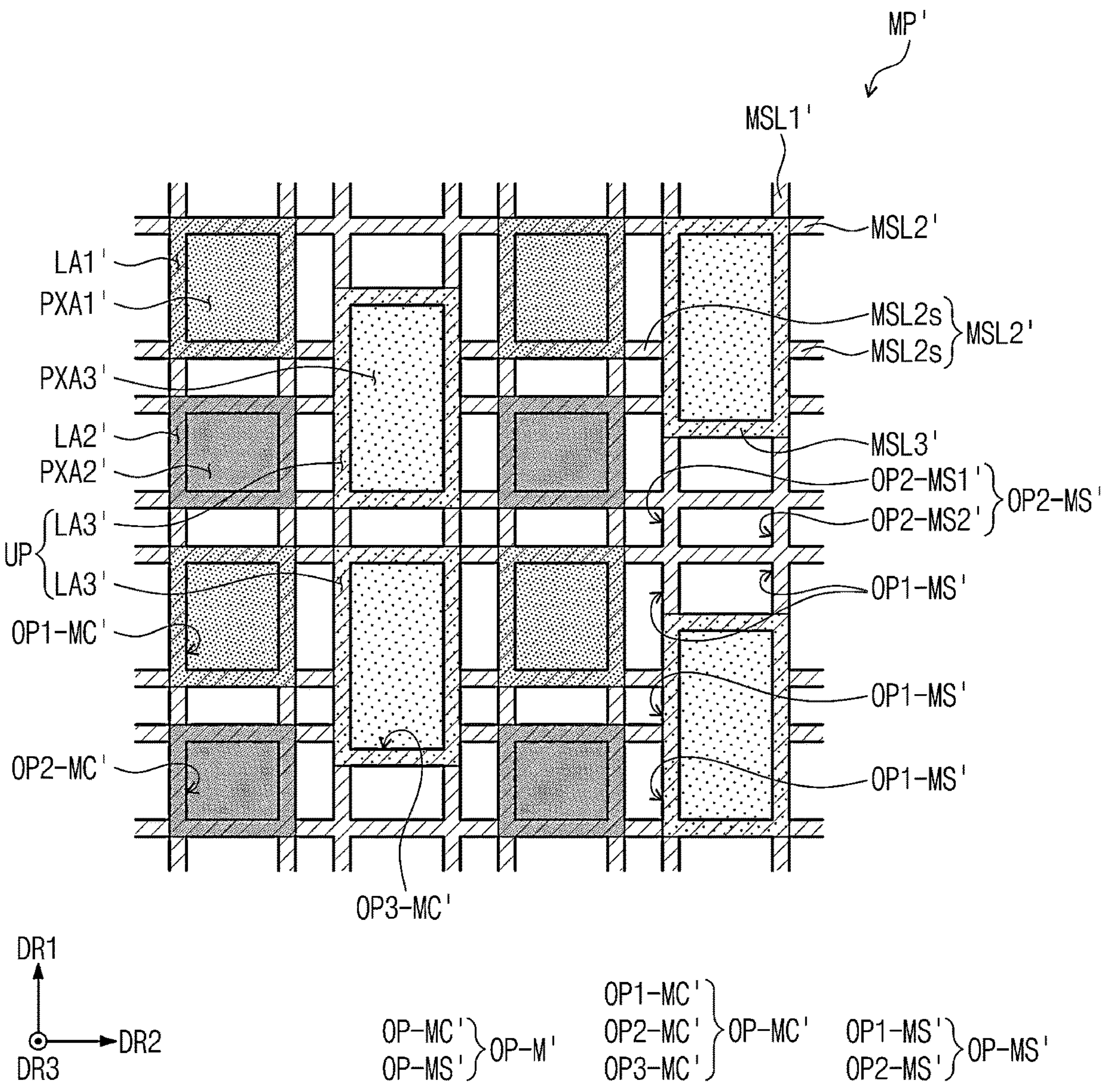
FIG. 15 is an enlarged plan view of a mesh pattern according to an embodiment of the inventive concept.

FIG. 15 is an enlarged plan view of a mesh pattern MP' according to an embodiment of the inventive concept. For convenience of explanation, FIG. 15 illustrates light-emitting regions LA1', LA2', and LA3' together. The same/similar reference numerals are used for the same/similar components as those described with reference to FIGS. 6 to 14, and duplicate descriptions are omitted.

Referring to FIGS. 4C and 15, the unit light-emitting region UA according to an embodiment may include a first unit light-emitting region UA1 and a second unit light-emitting region UA2. Since the arrangement of the first to third light-emitting regions LA1, LA2', and LA3' illustrated in FIG. 15 is the same as the arrangement of the first to third light-emitting regions LA1, LA2, and LA3 in FIG. 4C, further detailed descriptions thereof are omitted.

In an embodiment, the mesh pattern MP' may cover the outer side portion of each of the light-emitting regions LA1', LA2', and LA3'. The mesh pattern MP' may cover all of the four outer sides of each of the light-emitting regions LA1', LA2', and LA3'. As a result, although a pixel shrinkage phenomenon may occur and the areas of the light-emitting regions LA1', LA2', and LA3' are reduced, it is possible to prevent or suppress front luminance reduction.

The mesh pattern MP' may include first mesh lines MSL1', second mesh lines MSL2', and third mesh lines MSL3'. The first mesh lines MSL1', the second mesh lines MSL2', and the third mesh lines MSL3' may be connected to each other to have an integral shape.

Each of the first mesh lines MSL1' may extend along the first direction DR1, and the first mesh lines MSL1' may be arranged in the second direction DR2. Each of the second mesh lines MSL2' may extend along the second direction DR2, and the second mesh lines MSL2' may be arranged in the first direction DR1. The second mesh lines MSL2' may cross the first mesh lines MSL1' on a plane and may have an integral shape.

Some of the second mesh lines MSL2' may include a cut portion so as not to cross the central portion of the third light-emitting region LA3' on a plane. In embodiments, some of the second mesh lines MSL2' do not continuously extend along the second direction DR2 and may include sub mesh lines MSL2*s* arranged along the second direction DR2. Each of the sub mesh lines MSL2*s* may extend along the second direction DR2.

In an embodiment, the mesh lines MSL1', MSL2', and MSL3' may further include third mesh lines MSL3'. The third mesh lines MSL3' may overlap the third light-emitting regions LA3'. The third mesh lines MSL3' may correspond to the cut portions of the second mesh lines MSL2' which do not continuously extend, are shifted in the second direction DR1, and overlap the outer side portion of the third light-emitting region LA3'.

The mesh pattern MP' may include openings OP-M' defined by the first mesh lines MSL1', the second mesh lines MSL2', and the third mesh lines MSL3'. The openings OP-M' may include central openings OP-MC' and peripheral openings OP-MS'.

Each of the central openings OP-MC' may overlap a corresponding light-emitting region LA1', LA2', or LA3'. Each of the central openings OP-MC' may be disposed within a corresponding light-emitting region LA1', LA2', or LA3' on a plane. Each of the pixel regions PXA1', PXA2', and PXA3' may correspond to a region exposed by a corresponding central opening OP-MC' in a corresponding light-emitting region LA1', LA2', or LA3'. The central openings OP-MC' may include first to third central openings OP1-MC', OP2-MC', and OP3-MC' respectively overlapping the first to third light-emitting regions LA1', LA2', and LA3'.

The peripheral openings OP-MS' may include first peripheral openings OP1-MS' and second peripheral openings OP2-MS'. The first peripheral openings OP1-MS' may extend in one direction along the outer side (or along the outer side of the mesh pattern MP' defining the central opening OP-MC') of an adjacent central opening OP-MC'. Some of the first peripheral openings OP1-MS' may extend along the first direction DR1, and other first peripheral openings OP1-MS' may extend along the second direction DR2.

According to embodiments, the second peripheral openings OP2-MS' do not include a portion which is adjacent to the outer side of the central opening OP-MC' and extends along the outer side of the central opening OP-MC'. The second peripheral openings OP2-MS' may include (2-1)-th peripheral openings OP2-MS1' and (2-2)-th peripheral openings OP2-MS2'.

The (2-1)-th peripheral openings OP2-MS1' may be spaced apart from an adjacent central opening OP-MC' in the first diagonal direction DR4 or the second diagonal direction DR5. Each of the first to third central openings OP1-MC', OP2-MC', and OP3-MC' may be surrounded by the first and (2-1)-th peripheral openings OP1-MS' and OP2-MS1'.

One first peripheral opening OP1-MS' may be disposed between the third light-emitting regions LA3' included in one light-emitting region pair UP. Between the light-emitting region pairs UP adjacent to each other, two first peripheral openings OP1-MS' spaced apart from each other in the first direction DR1 and a (2-2)-th peripheral opening OP2-MS2' disposed therebetween may be disposed.

The shape and arrangement of the peripheral openings OP-MS' are not limited to an embodiment as illustrated in FIGS. 10A to 10B. For example, one first peripheral opening OP1-MS' may extend along the entire one side of the third central opening OP3-MC' extending in the first direction DR1. In an embodiment, only one first peripheral opening OP1-MS' may be included between adjacent light-emitting region pairs UP, and the (2-2)-th peripheral opening OP2-MS2' may be omitted.

The mesh pattern MP' may be variously designed to suit the arrangement shape of the unit light-emitting regions. For example, the mesh lines MSL1' and MSL2' forming an integral shape may be variously designed so as to cover the outer side portion of the light-emitting regions LA1', LA2', and LA3'.

Embodiments described above with reference to FIGS. 8 to 14 may be similarly applied to FIG. 15. That is, the mesh pattern MP' may cover only two of the four outer sides of the light-emitting regions LA1, LA2', and LA3', or cut portions CT may be defined in the mesh lines MSL1' and MSL2'.

According to an embodiment of the inventive concept, the mesh pattern of the input sensing layer included in the display device may cover a portion of the outer side of each pixel region on a plane. Accordingly, although pixel shrinkage may occur, it is possible to prevent or suppress front luminance reduction. According to an embodiment of the inventive concept, it is possible to provide a mesh pattern that prevents or suppresses front luminance reduction while preventing or suppressing viewing angle deviation.

According to an embodiment of the inventive concept, the input sensing layer included in the display device may include a mesh pattern having a cut portion defined therein. As the position of the cut portion of the mesh pattern is designed in consideration of the positions of the light-emitting regions, it is possible to prevent or suppress a defect in which a partial region of the mesh pattern are viewed from the outside of the display device. As a result, the visibility of the input sensing layer including the mesh pattern and the display device may be increased.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. A display device, comprising:

a display panel including a plurality of light-emitting regions, a non-light-emitting region, a display element layer, and an encapsulation layer disposed on the display element layer; and an input sensing layer including a first insulating layer directly disposed on the encapsulation layer and a plurality of sensing electrodes disposed on the first insulating layer, wherein each of the plurality of sensing electrodes includes a mesh pattern having a plurality of openings defined therein, wherein a portion of the mesh pattern overlaps a portion of each of the plurality of light-emitting regions on a plane, and wherein the portion of the mesh pattern that overlaps the portion of each of the plurality of light-emitting regions has a frame shape and a central region of the plurality of light-emitting regions is exposed by the frame shape of mesh pattern.

2. The display device of claim 1, wherein a portion of the mesh pattern overlaps an outer side portion of each of the plurality of light-emitting regions.

3. The display device of claim 1, wherein each of the plurality of light-emitting regions comprises a plurality of outer sides, and at least one of the plurality of outer sides is covered by the mesh pattern on the plane.

4. The display device of claim 3, wherein the mesh pattern comprises:

a plurality of first mesh lines extending along one direction and arranged along a crossing direction crossing the one direction; and a plurality of second mesh lines extending along the crossing direction and arranged along the one direction, wherein the plurality of openings are surrounded by the plurality of first mesh lines and the plurality of second mesh lines.

5. The display device of claim 4, wherein the plurality of outer sides of each of the plurality of light-emitting regions comprise:

first and second sides facing each other in the crossing direction and extending in the one direction; and third and fourth sides facing each other in the one direction and extending in the crossing direction, wherein:

at least some of the first and second sides are covered by the plurality of first mesh lines on the plane; and at least some of the third and fourth sides are covered by the plurality of second mesh lines on the plane.

6. The display device of claim 4, wherein the plurality of openings defined in the mesh pattern comprise:

a plurality of central openings that at least partially overlap the light-emitting regions; and a plurality of peripheral openings that do not overlap the light-emitting regions.

7. The display device of claim 6, wherein:

the mesh pattern covers all of the plurality of outer sides of each of the plurality of light-emitting regions; and each of the plurality of central openings is disposed within a corresponding light-emitting region on the plane.

8. The display device of claim 7, wherein the plurality of peripheral openings comprise:

a plurality of first peripheral openings disposed between adjacent central openings in the one direction or between adjacent central openings in the crossing direction; and a plurality of second peripheral openings spaced apart from an adjacent first peripheral opening in a diagonal direction of the one direction and the crossing direction.

9. The display device of claim 6, wherein the plurality of outer sides of each of the plurality of light-emitting regions comprise:

first and second sides facing each other in the crossing direction and extending in the one direction; and third and fourth sides facing each other in the one direction and extending in the crossing direction, wherein:

the first, fourth, second, and third sides are sequentially connected to each other in a clockwise direction; and the mesh pattern covers two interconnected sides among the plurality of outer sides of each of the plurality of light-emitting regions, wherein at least some of the plurality of light-emitting regions cover two different sides among the first to fourth sides.

10. The display device of claim 9, wherein at least some of the plurality of central openings overlap a portion of each of two or more light-emitting regions.

11. The display device of claim 9, wherein at least some of the plurality of central openings have different numbers of overlapping light-emitting regions.

12. The display device of claim 9, wherein the plurality of light-emitting regions comprise:

a first group of light-emitting regions having the first and fourth sides covered by the mesh pattern on the plane;

a second group of light-emitting regions having the first and third sides covered by the mesh pattern on the plane;

a third group of light-emitting regions having the second and fourth sides covered by the mesh pattern on the plane; and a fourth group of light-emitting regions having the second and third sides covered by the mesh pattern on the plane, wherein, within a predetermined unit area, a same number of the first group of light-emitting regions, the second group of light-emitting regions, the third group of light-emitting regions, and the fourth group of light-emitting regions are disposed.

13. The display device of claim 6, wherein, on the plane, a separation distance in a direction from an outer side of the light-emitting region covered by the mesh pattern to an adjacent central opening is less than or equal to a width of the mesh pattern in the direction.

14. The display device of claim 6, wherein a cut portion configured to connect two adjacent peripheral openings to each other among the plurality of peripheral openings is defined in the mesh pattern.

15. The display device of claim 14, wherein the cut portion is spaced apart from the plurality of central openings.

16. The display device of claim 14, wherein the plurality of sensing electrodes comprise:

a plurality of first sensing electrodes extending in the one direction and arranged in the crossing direction crossing the one direction; and a plurality of second sensing electrodes extending in the crossing direction and arranged in the one direction, wherein:

each of the first sensing electrodes includes a plurality of first sensing portions arranged in the one direction; and each of the second sensing electrodes includes a plurality of second sensing portions arranged in the crossing direction, wherein the cut portion is defined within the plurality of first sensing portions or the plurality of second sensing portions.

17. The display device of claim 6, wherein the plurality of sensing electrodes comprise:

a plurality of first sensing electrodes extending in the one direction and arranged in the crossing direction crossing the one direction; and a plurality of second sensing electrodes extending in the crossing direction and arranged in the one direction, wherein:

each of the first sensing electrodes includes a plurality of first sensing portions arranged in the one direction; and each of the second sensing electrodes includes a plurality of second sensing portions arranged in the crossing direction, wherein a boundary cut portion is defined between a first sensing portion and a second sensing portion adjacent to each other, wherein the boundary cut portion is spaced apart from the plurality of central openings.

18. The display device of claim 4, wherein the plurality of light-emitting regions comprise a plurality of unit light-emitting regions arranged along each of the one direction and the crossing direction, wherein each of the plurality of unit light-emitting regions comprises:

one first light-emitting region and one third light-emitting region spaced apart from each other in a first direction which is a diagonal direction of the one direction and the crossing direction; and two second light-emitting regions spaced apart from each other in a second direction crossing the first direction, wherein the first, second, and third light-emitting regions respectively emit first, second, and third color lights which are different from each other.

19. The display device of claim 4, wherein the plurality of light-emitting regions comprise:

a first light-emitting region and a second light-emitting region alternately arranged along the one direction; and a third light-emitting region spaced apart from the first light-emitting region and the second light-emitting region along the crossing direction, wherein the first, second, and third light-emitting regions respectively emit first, second, and third color lights which are different from each other.

20. The display device of claim 19, wherein:

the third light-emitting region is disposed to be closer to the first light-emitting region than the second light-emitting region in the one direction; and the mesh pattern further comprises a third mesh line spaced apart from the plurality of second mesh lines, wherein the third mesh line extends along the crossing direction and covers an outer side of the third light-emitting region adjacent to the second light-emitting region.

21. The display device of claim 1, wherein the input sensing layer further comprises:

a second insulating layer disposed on the first insulating layer;

a first conductive layer disposed between the first insulating layer and the second insulating layer; and a second conductive layer disposed on the second insulating layer, wherein the plurality of sensing electrodes comprise:

a plurality of first sensing electrodes extending in one direction and arranged in a crossing direction crossing the one direction; and a plurality of second sensing electrodes extending in the crossing direction and arranged in the one direction, wherein:

each of the first sensing electrodes comprises a plurality of first sensing portions arranged in the one direction and connection patterns connecting the first sensing portions to each other; and each of the second sensing electrodes comprises a plurality of second sensing portions arranged in the crossing direction and extension patterns connecting the second sensing portions to each other, wherein:

the first sensing portions, the second sensing portions, and the extension patterns are included in the second conductive layer; and the connection patterns are included in the first conductive layer.

22. A display device, comprising:

a display panel comprising a plurality of light-emitting regions, a non-light-emitting region, a display element layer, and an encapsulation layer disposed on the display element layer; and an input sensing layer comprising a first insulating layer directly disposed on the encapsulation layer and a plurality of sensing electrodes disposed on the first insulating layer, wherein each of the plurality of sensing electrodes includes a mesh pattern having a plurality of openings defined therein, wherein the openings defined in the mesh pattern comprise:

a plurality of central openings that at least partially overlap the light-emitting regions; and a plurality of peripheral openings that do not overlap the light-emitting regions, wherein a cut portion connecting two adjacent peripheral openings to each other among the peripheral openings is defined in the mesh pattern.

23. The display device of claim 22, wherein the cut portion is spaced apart from the plurality of central openings.

24. The display device of claim 22, wherein each of the plurality of light-emitting regions comprises a plurality of outer sides, wherein at least one of the plurality of outer sides is covered by the mesh pattern on a plane.

25. The display device of claim 24, wherein:

each of the plurality of central openings is disposed within a corresponding light-emitting region on the plane; and the plurality of outer sides of each of the plurality of light-emitting regions are covered by the mesh pattern.

26. The display device of claim 22, wherein:

each of the plurality of light-emitting regions is disposed within a corresponding central opening on a plane; and the mesh pattern does not overlap the plurality of light-emitting regions.

27. An electronic device, comprising:

a display panel including a plurality of light-emitting regions, a non-light-emitting region, a display element layer, and an encapsulation layer disposed on the display element layer;

an input sensing layer including a first insulating layer directly disposed on the encapsulation layer and a plurality of sensing electrodes disposed on the first insulating layer; and an anti-reflection layer disposed on the input sensing layer, wherein each of the plurality of sensing electrodes includes a mesh pattern having a plurality of openings defined therein, wherein a portion of the mesh pattern overlaps a portion of each of the plurality of light-emitting regions on a plane, and wherein the portion of the mesh pattern that overlaps the portion of each of the plurality of light-emitting regions has a frame shape and a central region of the plurality of light-emitting regions is exposed by the frame shape of mesh pattern.

28. An electronic device, comprising:

a display panel comprising a plurality of light-emitting regions, a non-light-emitting region, a display element layer, and an encapsulation layer disposed on the display element layer;

an input sensing layer comprising a first insulating layer directly disposed on the encapsulation layer and a plurality of sensing electrodes disposed on the first insulating layer; and an anti-reflection layer disposed on the input sensing layer, wherein each of the plurality of sensing electrodes includes a mesh pattern having a plurality of openings defined therein, wherein the openings defined in the mesh pattern comprise:

a plurality of central openings that at least partially overlap the light-emitting regions; and a plurality of peripheral openings that do not overlap the light-emitting regions, wherein a cut portion connecting two adjacent peripheral openings to each other among the peripheral openings is defined in the mesh pattern.

* * * * *